(12) United States Patent
Lee et al.

(10) Patent No.: US 8,969,885 B2
(45) Date of Patent: Mar. 3, 2015

(54) LIGHT EMITTING DEVICE MODULE AND LIGHTING SYSTEM INCLUDING THE SAME

(75) Inventors: Gun Kyo Lee, Seoul (KR); Nam Seok Oh, Seoul (KR); Young Hun Ryu, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 113 days.

(21) Appl. No.: 13/242,140

(22) Filed: Sep. 23, 2011

(65) Prior Publication Data

US 2012/0012880 A1  Jan. 19, 2012

(30) Foreign Application Priority Data

May 30, 2011 (KR) .................. 10-2011-0051331

(51) Int. Cl.
*H01L 33/00* (2010.01)
*H01L 33/64* (2010.01)
*H01L 33/48* (2010.01)
*H01L 33/62* (2010.01)
*H05K 1/18* (2006.01)

(52) U.S. Cl.
CPC .............. *H01L 33/642* (2013.01); *H01L 33/486* (2013.01); *H01L 33/62* (2013.01); *H05K 1/181* (2013.01); *H05K 2201/09072* (2013.01); *H05K 2201/10106* (2013.01); *H01L 2224/48137* (2013.01); *H01L 2224/48471* (2013.01); *H01L 2924/3025* (2013.01)
USPC 257/84; 257/99; 257/E33.006; 257/E33.056; 257/E33.058; 438/26; 438/28

(58) Field of Classification Search
USPC ...................... 257/84, 99, E33.006, E33.056, 257/E33.058; 438/26, 28
See application file for complete search history.

(56) References Cited

U.S. PATENT DOCUMENTS

| | | | |
|---|---|---|---|
| 4,935,665 A * | 6/1990 | Murata | 313/500 |
| 2005/0073846 A1* | 4/2005 | Takine | 362/296 |
| 2006/0006405 A1* | 1/2006 | Mazzochette | 257/99 |
| 2008/0006837 A1* | 1/2008 | Park et al. | 257/98 |
| 2008/0191605 A1* | 8/2008 | Lin et al. | 313/501 |
| 2010/0078662 A1* | 4/2010 | Shi et al. | 257/98 |
| 2010/0164092 A1* | 7/2010 | Lu | 257/702 |

FOREIGN PATENT DOCUMENTS

JP   05-021649   * 1/1993

* cited by examiner

*Primary Examiner* — Su Kim
(74) *Attorney, Agent, or Firm* — KED & Associates LLP

(57) ABSTRACT

Disclosed herein is a light emitting device module comprising: a heat transfer member having a cavity; first conductive layer and second conductive layer contacting the heat transfer member via an insulating layer, the first conductive layer and the second conductive layer being electrically isolated from each other in accordance with exposure of the insulating layer or exposure of the heat transfer member; and at least one light emitting diode electrically connected to the first conductive layer and second conductive layer, the at least one light emitting device is thermally contacted to an exposed portion of the heat transfer member, wherein the heat transfer member has an exposed portion disposed within the cavity between the first conductive layer and the second conductive layer.

20 Claims, 52 Drawing Sheets

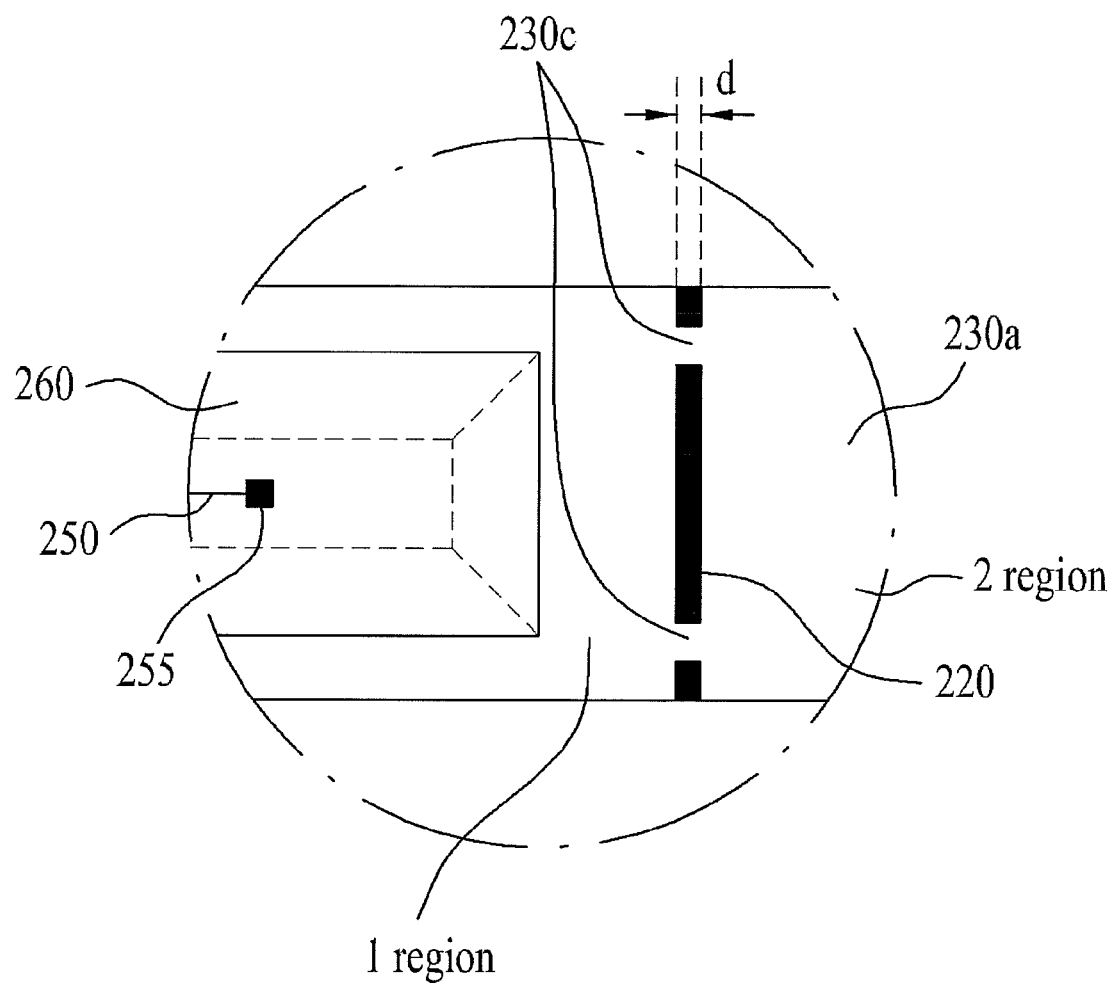

Fig. 17
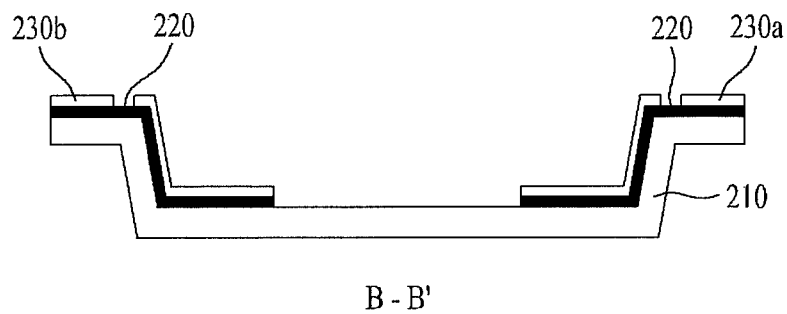
B - B'
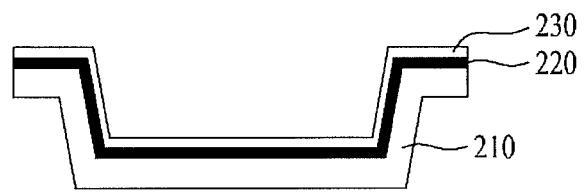
C - C'

Fig. 24G
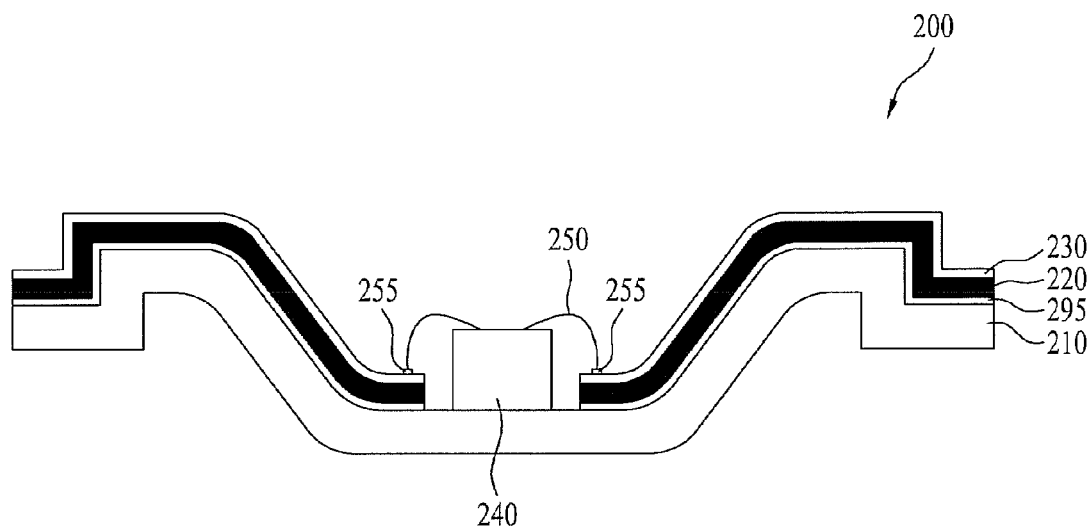
Fig. 25
A - A'
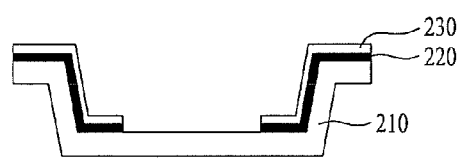
B - B'

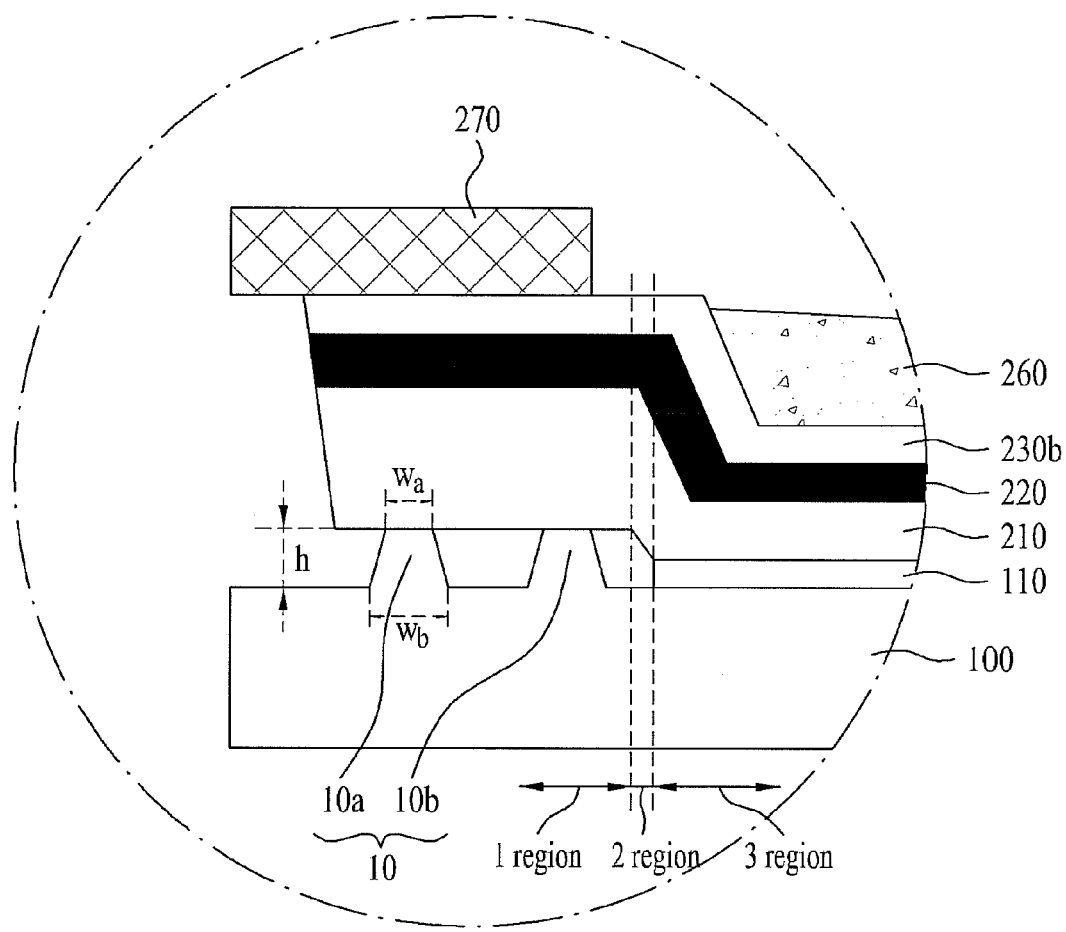

Fig. 36
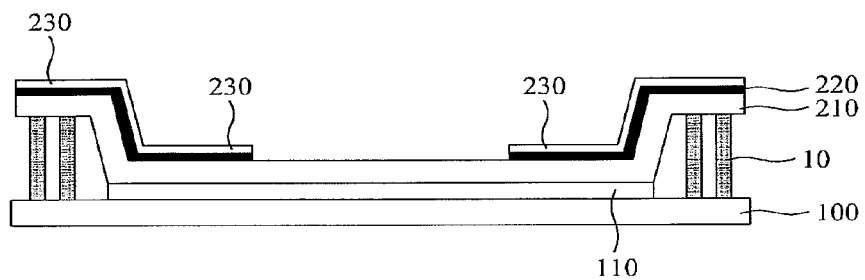
A - A'
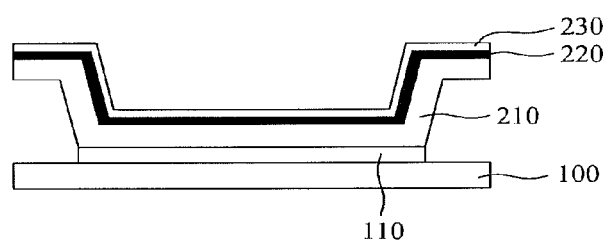
B - B'
Fig. 37
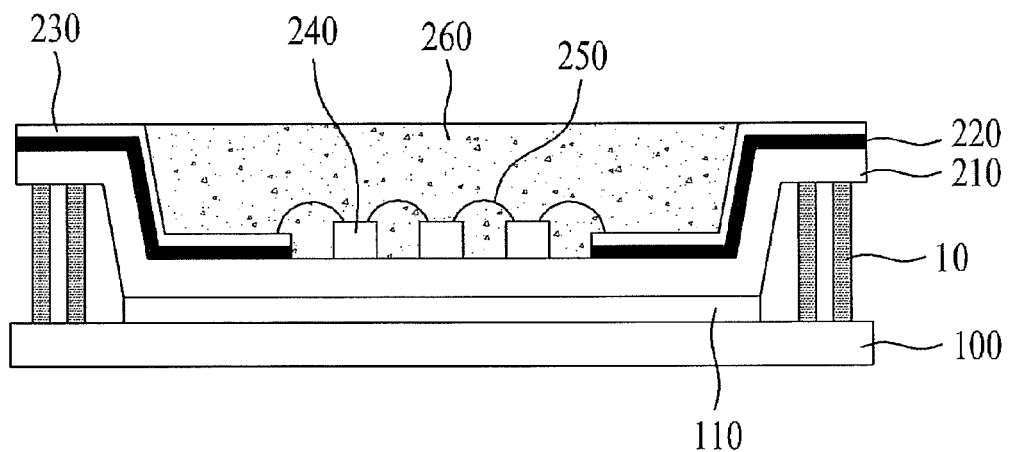

Fig. 40
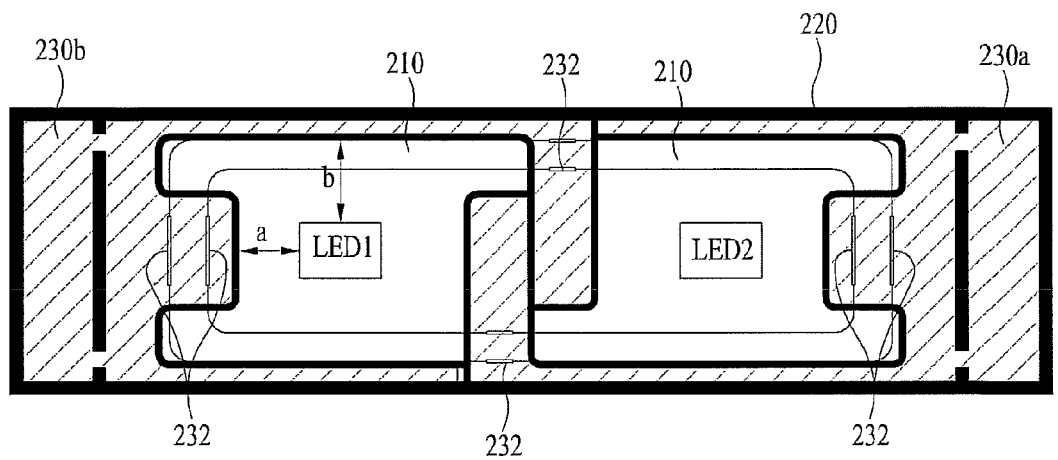
Fig. 41a
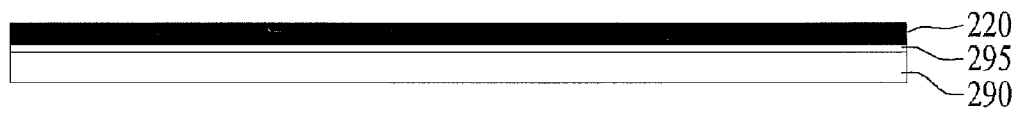
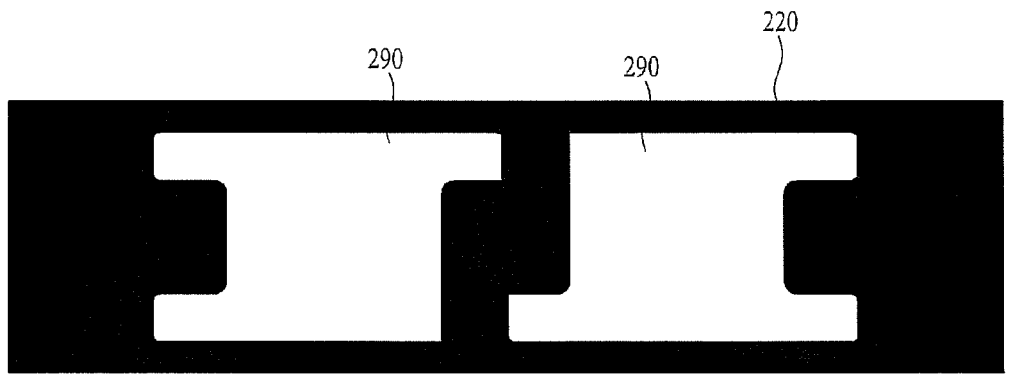

Fig. 41f
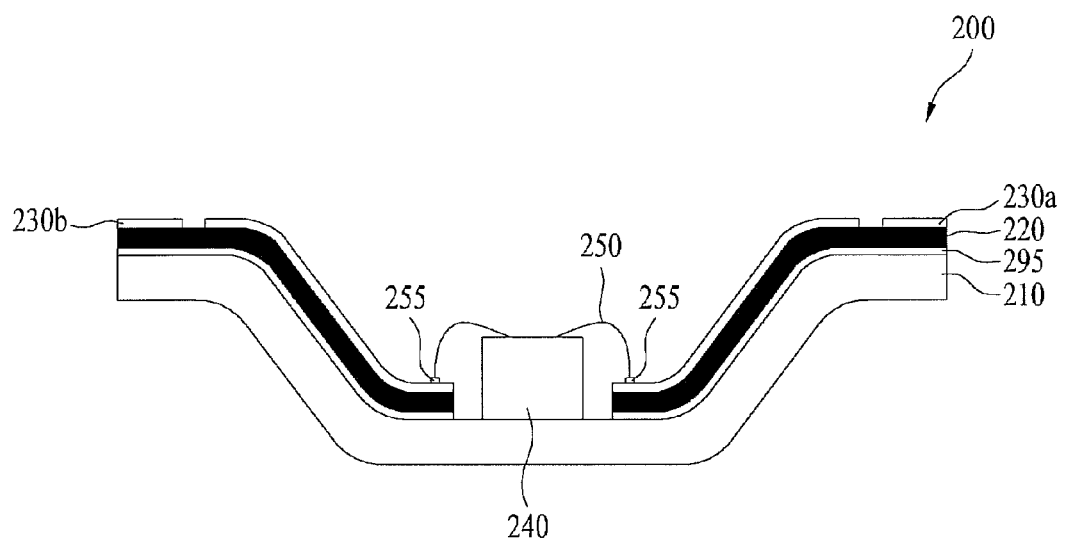
Fig. 42a
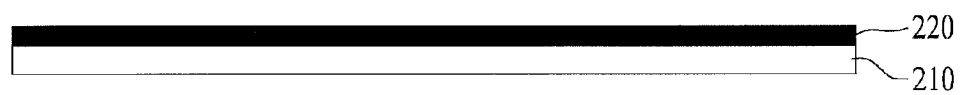
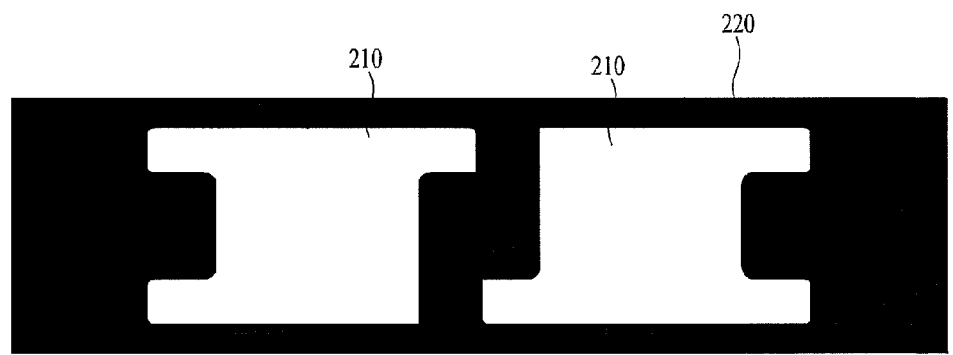

LIGHT EMITTING DEVICE MODULE AND LIGHTING SYSTEM INCLUDING THE SAME

This application claims the benefit of Korean Patent Application No. 10-2011-0051331, filed on May 30, 2011 which is hereby incorporated in its entirety by reference as if fully set forth herein.

BACKGROUND OF THE INVENTION

1. Field of the Invention

The embodiment relates to a light emitting device module and a lighting system including the same.

2. Discussion of the Related Art

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light having high efficiency using fluorescent materials or through color mixing. Further, the light emitting devices have advantages, such as low power consumption, semi-permanent lifespan, fast response time, safety, and environmentally friendly properties as compared to conventional light sources, such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles and traffic lights.

Light emitting device modules are widely used in lighting apparatuses and display apparatuses. Such a light emitting device module is mounted in a package body such that they are electrically connected.

SUMMARY OF THE INVENTION

Accordingly, the embodiment is directed to a light emitting device module and a lighting system including the same, which are capable of achieving an improvement in optical efficiency.

Additional advantages, objects, and features of the embodiment will be set forth in part in the description which follows and in part will become apparent to those having ordinary skill in the art upon examination of the following or may be learned from the embodiment. The objectives and other advantages of the embodiment may be realized and attained by the structure particularly pointed out in the written description and claims hereof as well as the appended drawings.

To achieve this object and other advantages and in accordance with the purpose of the embodiment, as embodied and broadly described herein, a light emitting device module comprising: a heat transfer member having a cavity; first conductive layer and second conductive layer contacting the heat transfer member via an insulating layer, the first conductive layer and the second conductive layer being electrically separated from each other in accordance with exposure of the insulating layer or exposure of the heat transfer member; and at least one light emitting device electrically connected to the first conductive layer and second conductive layer, the at least one light emitting device is thermally contacted an exposed portion of the heat transfer member, wherein the heat transfer member has an exposed portion disposed within the cavity between the first conductive layer and the second conductive layer.

At least one of the first conductive layer and the second conductive layer may extend from an edge of the cavity to a side wall of the cavity and then to a bottom portion of the cavity adjacent to the side wall.

At least one of the first conductive layer and the second conductive layer may extend from a longer-axis edge of the cavity to a longer-axis side wall of the cavity and then to a bottom portion of the cavity adjacent to the longer-axis side wall.

The insulating layer has a exposed portion may be disposed between the exposed portion of the heat transfer member and a portion of each of the first conductive layer and second conductive layer disposed on the bottom portion of the cavity.

The light emitting device may be spaced apart from the exposed portion of the insulating layer by a distance of 400 to 500 μm.

The insulating layer may have another exposed portion disposed between the heat transfer member and a portion of each of the first conductive layer and the second conductive layer disposed outside the cavity. The semiconductor light emitting device may be spaced apart from the another exposed portion of the insulating layer by a distance of 150 to 250 μm.

At least one of the first conductive layer and the second conductive layer may extend from a shorter-axis edge of the cavity to a shorter-axis side wall of the cavity and then to a bottom portion of the cavity adjacent to the shorter-axis side wall.

The insulating layer may be exposed between a portion of the first conductive layer disposed on the bottom portion of the cavity and a portion of the second conductive layer disposed on the bottom portion of the cavity to electrically isolate the first conductive layer and second conductive layer.

Portions of the first conductive layer disposed on the bottom portion of the cavity and the second conductive layer disposed on the bottom portion of the cavity may be parallel.

The insulating layer may be exposed between the portions of the first conductive layer and the second conductive layer disposed on the bottom portion of the cavity to electrically isolate the first conductive layer and the second conductive layer.

The light emitting device may be electrically connected to a portion of the first conductive layer and second conductive layer disposed on a bottom of the cavity.

The light emitting device may be spaced apart from the exposed portion of the insulating layer by at least 100 μm.

The exposed portion of the heat transfer member may include an exposed portion exposed at a bottom of the cavity while being 35 to 50% of the entirety of the exposed portion of the heat transfer member.

The exposed portion of the heat transfer member may include an exposed portion exposed at a side wall of the cavity while being 45 to 65% of the entirety of the exposed portion of the heat transfer member.

The exposed portion of the heat transfer member may include an exposed portion exposed outside the cavity while being 10% or less of the entirety of the exposed portion of the heat transfer member.

In another aspect of the embodiment, a light emitting device module includes a heat transfer member having a cavity, an insulating layer formed on a portion of the heat transfer member, first conductive layer and second conductive layer respectively formed on portions of the insulating layer while being electrically isolated from each other, and a light emitting device thermally contacting the heat transfer member and electrically connected to the first conductive layer and the second conductive layer, wherein the heat transfer member is exposed at a portion of the cavity.

At least one of the first conductive layer and the second conductive layer may extend from a longer-axis edge of the cavity to a longer-axis side wall of the cavity and then to a bottom portion of the cavity adjacent to the longer-axis side wall.

The exposed portion of the insulating layer may be disposed between the heat transfer member and a portion of each of the first conductive layer and the second conductive layer disposed on the bottom portion of the cavity.

At least one of the first conductive layer and the second conductive layer may extend from a shorter-axis edge of the cavity to a shorter-axis side wall of the cavity and then to a bottom portion of the cavity adjacent to the shorter-axis side wall. Portions of the first conductive layer disposed on the bottom portion of the cavity and the second conductive layers disposed on the bottom portion of the cavity may be parallel.

In another aspect of the embodiment, a lighting system includes a semiconductor light emitting device module including a heat transfer member having a cavity, first conductive layer and the second conductive layer contacting the heat transfer member via an insulating layer, the first conductive layer and the second conductive layer being electrically isolated from each other in accordance with exposure of the insulating layer or exposure of the heat transfer member, and at least one semiconductor light emitting device electrically connected to the first conductive layer and the second conductive layer, the at least one semiconductor light emitting device is thermally contacted an exposed portion of the heat transfer member, the insulating layer having an exposed portion disposed within the cavity between the first conductive layer and the second conductive layer, at least one circuit board for supplying current to the light emitting device module, and an optical member for transmitting light emitted from the light emitting device module.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 2 to 6 are views illustrating light emitting device modules according to different embodiments, respectively;

FIG. 17 shows cross-sectional views respectively taken in directions corresponding to longer and shorter axes of FIG. 16.

FIGS. 24A to 24G are views illustrating a method for manufacturing the light emitting device module of FIG. 21 in accordance with an exemplary embodiment;

FIG. 25 shows cross-sectional views respectively taken in directions corresponding to a longer axis and a shorter axis in the light emitting device module of FIG. 21;

FIGS. 32B to 32G are enlarged views corresponding to the portion "A" of FIG. 21 to illustrate different embodiments from that of FIG. 32A;

FIG. 36 shows cross-sectional views respectively taken in directions corresponding to a longer axis and a shorter axis in the light emitting device module of FIG. 31;

FIG. 37 is a sectional view illustrating a light emitting device module according to a nineteenth embodiment;

FIG. 40 is a plan view corresponding to FIG. 39;

FIGS. 41A to 41F are views illustrating a method for manufacturing the light emitting device module of FIG. 39 in accordance with an exemplary embodiment;

FIGS. 42A to 42E are views illustrating a method for manufacturing the light emitting device module of FIG. 39 in accordance with another exemplary embodiment;

DETAILED DESCRIPTION OF THE INVENTION

Figure 1A:
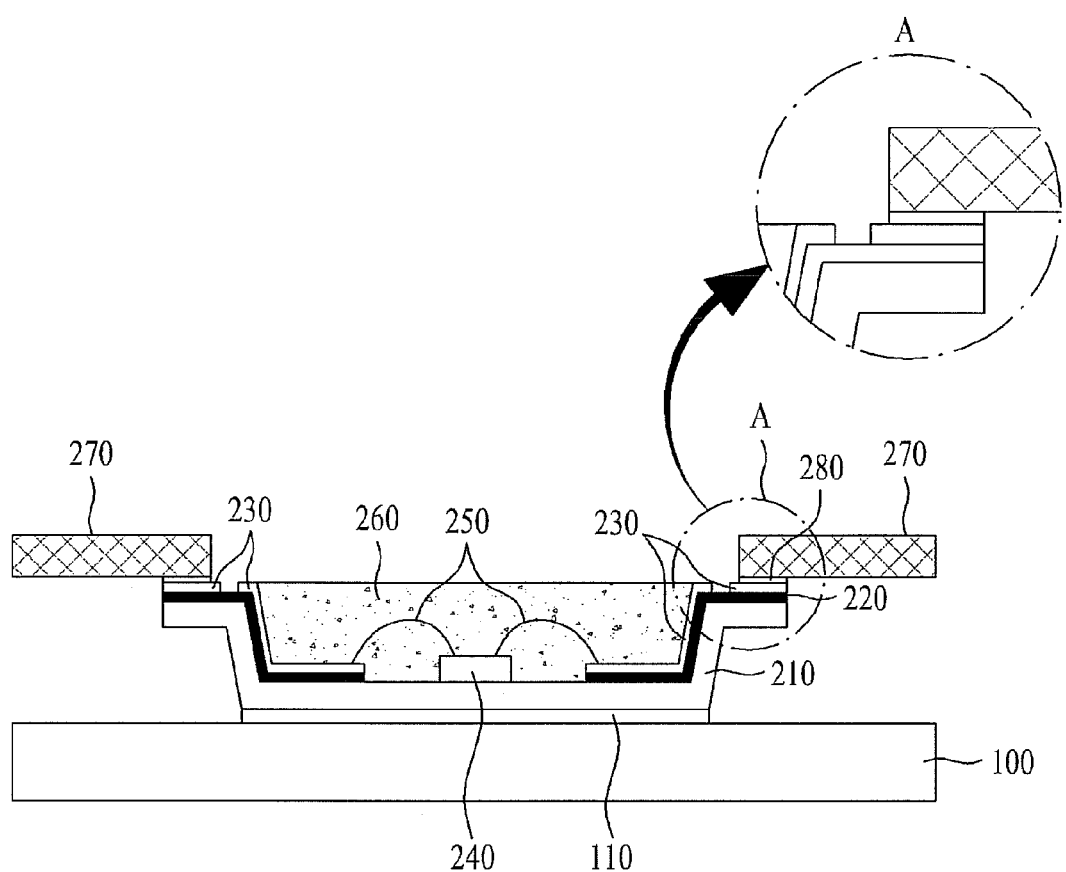
FIGS. 1A and 1B are sectional views illustrating light emitting device modules according to first and second embodiments of the embodiment, respectively.

Reference will now be made in detail to the preferred embodiments, examples of which are illustrated in the accompanying drawings.

In the following description of the embodiments, it will be understood that, when an element such as a layer (film), region, pattern, or structure is referred to as being "on" or "under" another element, it can be "directly" on or under another element or can be "indirectly" formed such that an intervening element may also be present. Also, terms such as "on" or "under" should be understood on the basis of the drawings.

In the drawings, dimensions of layers are exaggerated, omitted or schematically illustrated for clarity and description convenience. In addition, dimensions of constituent elements do not entirely reflect actual dimensions thereof.

Figure 1B:
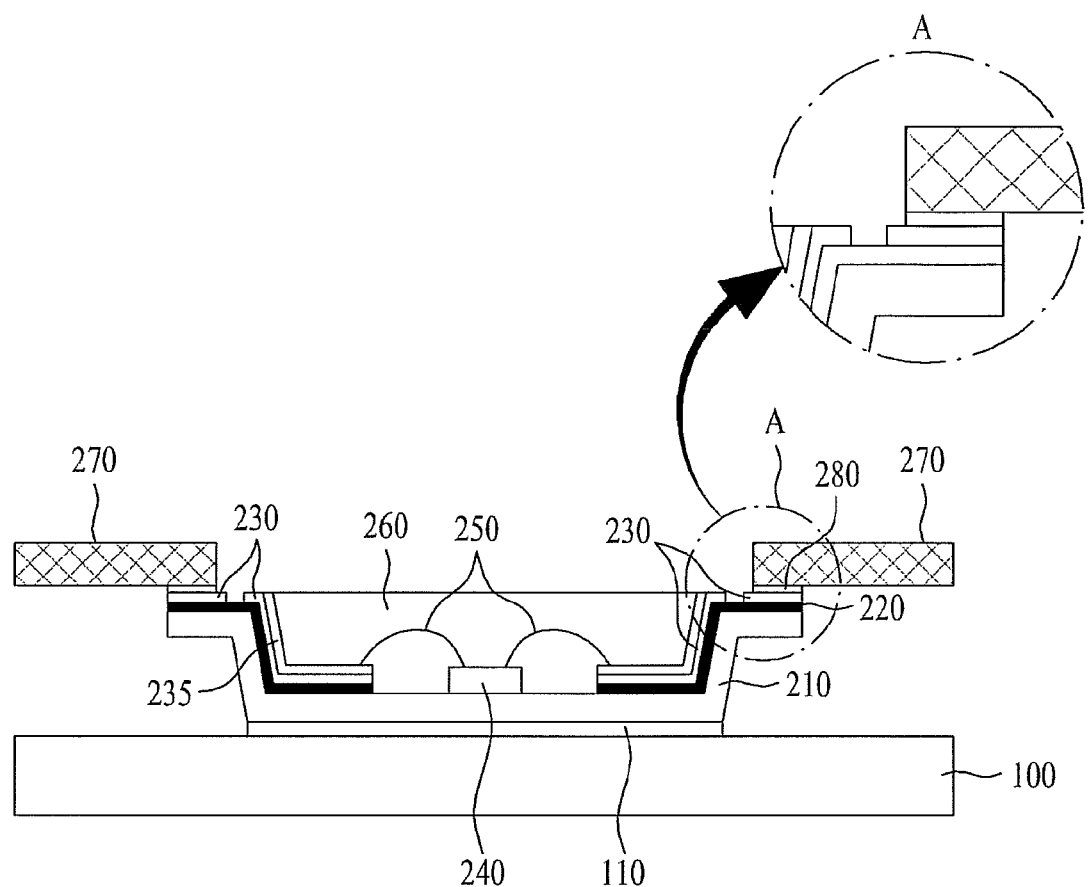

FIGS. 1A and 1B illustrate light emitting device modules according to first and second embodiments, respectively.

In the light emitting device module according to each embodiment, a light emitting device 240 is disposed in a cavity formed at a heat transfer member 210. The light emitting device 240 may include a vertical light emitting device, a horizontal light emitting device, or a flip-chip type light emitting device. In these embodiments or other embodiments, the light emitting device 240 may be semiconductor light emitting device, for example light emitting diode. The heat transfer member 210 may be made of a material having excellent thermal conductivity. For example, copper (Cu) or aluminum may be used for the material of the heat transfer member 210.

The light emitting device 240 may be disposed on a bottom of the cavity formed at the heat transfer member 210. The cavity may have side walls extending vertically. In the illustrated embodiments, the side walls of the cavity are outwardly inclined as they extend upwardly such that the width of the cavity is increased as the cavity extends upwardly, when viewing in the drawings.

Although the heat transfer member 210, which defines the cavity, is illustrated as being sharply bent, it may be bent in a streamlined shape.

An insulating layer 220 is formed over the heat transfer member 210. The insulating layer 220 may be made of, for example, polyimide. The insulating layer 220 may be patterned to expose at least a portion of the heat transfer member 210 at the bottom of the cavity. That is, the insulating layer 220 may not be formed on at least a portion of the bottom of the cavity.

A first conductive layer 230a and a second conductive layer 230b are formed such that the insulating layer 220 is interposed between the heat transfer member 210 and the first conductive layer 230a and the second conductive layer 230b. In accordance with this structure, the first conductive layer 230a the and second conductive layer 230b, which supply current to the light emitting device 240, are electrically insulated from the heat transfer member 210 by the insulating layer 220. This will be described later.

The first conductive layer 230a and the second conductive layer 230b may have the same shape as the insulating layer 220. However, each of the first conductive layer 230a and the second conductive layer 230b may be formed to have an open region at a portion thereof adjacent to a circuit board 270, so as to expose a portion of the insulating layer 220. This will be described later. The first conductive layer 230a and the second conductive layer 230b may be made of a copper foil.

The light emitting device 240 is electrically connected to the first conductive layer 230a and the second conductive layer 230b. This electrical connection may be achieved through bonding of wires 250 as in the illustrated embodiments. A resin layer 260 fills the cavity to protect the light emitting device 240 and wires 250. A fluorescent substance is contained in the resin layer 260. Accordingly, it may be possible to vary the wavelength of light emitted from the light emitting device 240.

A portion of the heat transfer member 210 extends horizontally at a region around a top of the cavity. A circuit board 270 is connected to the horizontal portion of the heat transfer member 210 via the insulating layer 220 and the first conductive layer 230a and the second conductive layer 230b.

The circuit board 270 may be coupled to the first conductive layer 230a and the second conductive layer 230b by a conductive adhesive 280. The circuit board 270 may include a printed circuit board (PCB), a metal PCB (MPCB), or a metal core PCB (MCPCB).

As shown in a portion "A" of FIG. 1A, the insulating layer 220 is partially exposed in a region between the cavity and the circuit board 270. That is, the first conductive layer 230a and the second conductive layer 230b are not formed in the above-described region such that they are opened in the region to expose a portion of the insulating layer 220 corresponding to the region. In this case, the conductive adhesive 280 may also not be formed on the exposed portion of the insulating layer.

In the embodiment of FIG. 1B, a reflective layer 235 is formed on the first conductive layer 230a and the second conductive layer 230b within the cavity. The reflective layer 235 may be made of a material capable of reflecting light emitted from the light emitting device 240 in order to send the reflected light to an outside of the cavity. A silver (Ag) may be coated over the reflective layer 235.

The heat transfer member 210 may be coupled to a substrate 100 via an adhesive layer 110. The substrate 100 may function as a body of the light emitting device module. When the substrate 100 is made of a metal, it may function as a bracket to support a light source module in a backlight unit or a lighting apparatus.

The adhesive layer 110 has excellent thermal conductivity. The adhesive layer 110 may bond the heat transfer member 210 to the substrate 100. When the substrate 100 is made of a metal to function as a bracket, heat emitted from the light emitting device 240 is directly transferred to the substrate 100 because it is unnecessary to use a resin such as polyphthalamide (PPA) in the backlight unit or lighting apparatus.

Figure 5:
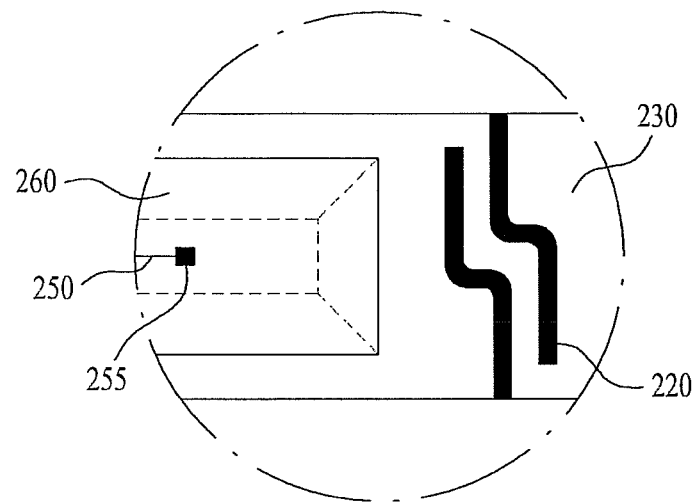
Figure 6:
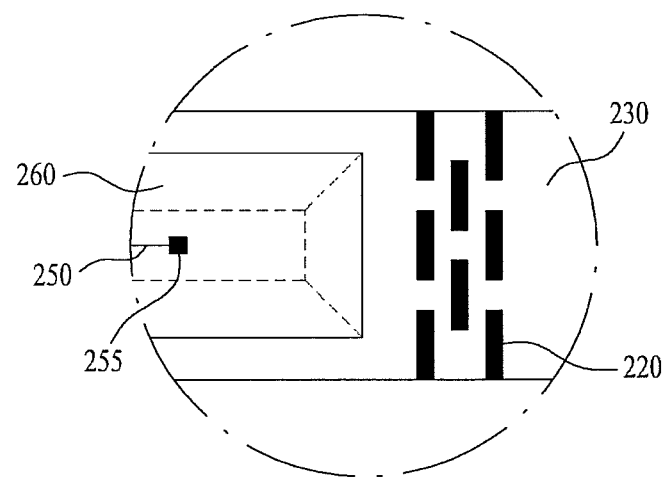
Figure 7:
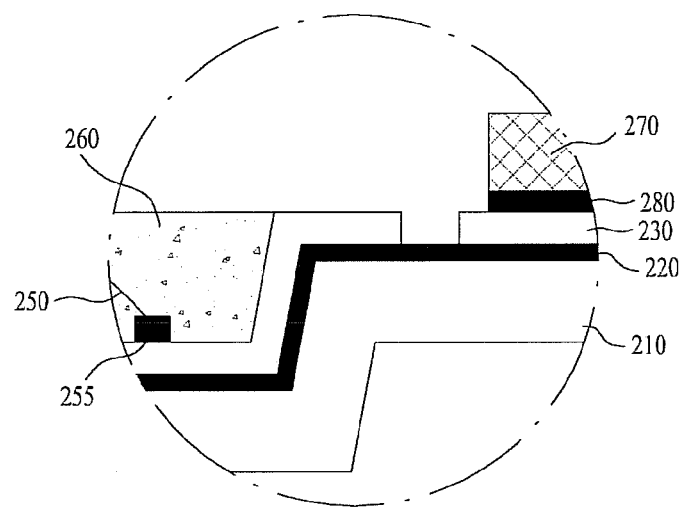
FIG. 7 is an enlarged view corresponding to the portion "A" of FIG. 1.

FIGS. 2 to 6 are views illustrating various patterns of the exposed portion of the insulating layer in the light emitting device module according to each of the above-described embodiments, respectively. FIG. 7 is an enlarged view corresponding to the portion "A" of FIG. 1.

As shown in the drawings, the insulating layer 220 is partially exposed in a region between the circuit board 270 and the cavity. Of course, portions of the first conductive layer 230a or second conductive layer 230b arranged at opposite sides of the exposed portion of the insulating layer 220 are electrically connected in order to electrically connect the light emitting device 240 and the circuit board 270.

The insulating layer 220 may have at least one line pattern in a region adjacent to the circuit board 270. At least one of the first conductive layer 230*a* and the second conductive layer 230*b* is formed on at least a portion of the line pattern of the insulating layer 220 to electrically connect the light emitting device 240 and the circuit board 270.

That is, in the embodiments shown in FIGS. 2 to 6, the first conductive layer 230*a* or second conductive layer 230*b* is formed on portions of the exposed pattern of the insulating layer 220.

Figure 3:
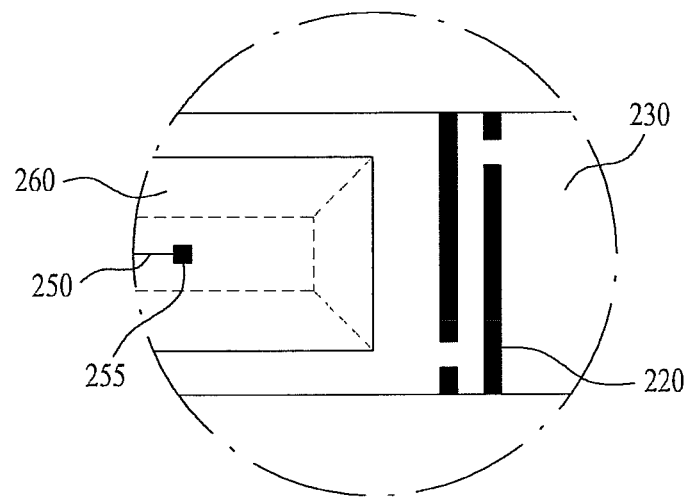
Figure 4:
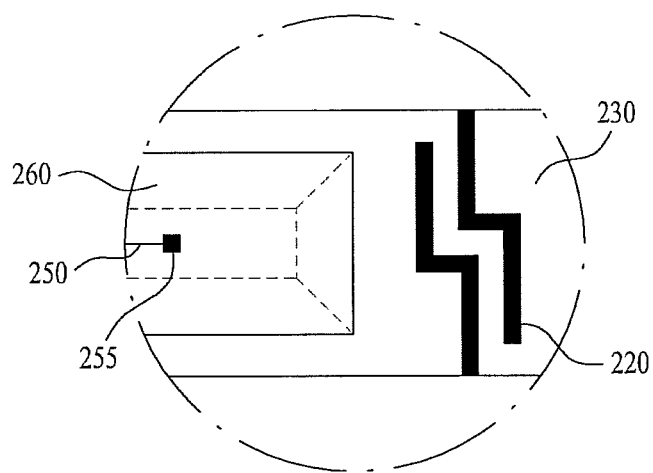

In the case of FIG. 2, the insulating layer 220 is exposed in the form of a single line pattern. In the case of FIG. 3, the insulating layer 220 is exposed in the form of two line patterns. In the cases of FIGS. 4 and 5, the insulating layer 220 is exposed in the form of two line patterns bent by a certain angle. In the case of FIG. 6, the insulating layer 220 is exposed in the form of three line patterns.

Since the insulating layer 220 is exposed as described above, it may be possible to prevent the conductive adhesive 280 from penetrating into the cavity after overflowing in a process of bonding the first conductive layer 230*a* and the second conductive layer 230*b* and the circuit board 270.

The exposed portion of the insulating layer 220 may have a width d (FIG. 3) of 10 to 50 μm. When the exposed portion is excessively narrow, it may be insufficient to block the conductive adhesive 280. On the other hand, when the exposed portion is excessively wide, the light emitting device module may be inefficient, or the design of the light emitting device may be inefficient.

That is, there may be a possibility that a portion of the conductive adhesive 280 penetrates into the cavity after flowing over the first conductive layer 230*a* and the second conductive layer 230*b*, thereby resulting in discoloration of the resin layer 260, or brightness degradation or color sensation variation of light emitted from the light emitting device 240. In the illustrated embodiments, however, the conductive adhesive 280 may be blocked by the exposed portion of the insulating layer 220. That is, it is difficult for the conductive adhesive 280 to flow on the surface of the insulating layer 220. As described above, the first conductive layer 230*a* or second conductive layer 230*b* is partially formed in the region where the insulating layer 220 is exposed, in order to electrically connect the light emitting device 240 and the circuit board 270.

In the case of FIG. 2, the insulating layer 220 is exposed in the form of a straight line pattern. Portions of the first conductive layer 230*a* or second conductive layer 230*b* in regions arranged at opposite sides of the exposed portion of the insulating layer 220 (first and second regions) are electrically connected. For this electrical connection, the first conductive layer 230*a* or second conductive layer 230*b* is formed on a portion of the exposed straight line pattern of the insulating layer 220.

When the insulating layer 220 is exposed in the form of two or more line patterns, and the shapes of the line patterns are different, as shown in FIGS. 3 to 6, it may be possible to greatly enhance the effect of blocking the conductive adhesive 280. In the case of FIG. 3, the first conductive layer 230*a* or second conductive layer 230*b* is formed on portions of the insulating layer 220 exposed in the form of two line patterns, and the portions of the first conductive layer 230*a* or second conductive layer 230*b* do not correspond to each other. The portions of the first conductive layer 230*a* or second conductive layer 230*b* are formed at ends of the line patterns of the insulating layer 220 opposite to each other, respectively.

That is, each of the first conductive layer 230*a* and the second conductive layer 230*b* has at least two open regions each having a line pattern, which has a straight line or curved line shape. The portions of each of the first conductive layer 230*a* and the second conductive layer 230*b* arranged at opposite sides of each open region (first and second portions) may be electrically connected by at least one connector arranged on each of the different line patterns.

Accordingly, even when the conductive adhesive 280 penetrates into one exposed line pattern of the insulating layer 220, the penetrated conductive adhesive 280 is difficult to pass through the other exposed line pattern of the insulating layer 220 because the connectors on the different line patterns do not spatially overlap with each other or do not spatially correspond to each other.

The exposed line patterns of the insulating layer 220 may have a curved line shape, as shown in FIG. 5, in place of a straight line shape. In this case, the open regions may have the same line pattern shape.

FIGS. 8A to 8G are views illustrating a method for manufacturing the light emitting device module of FIG. 1 in accordance with an exemplary embodiment.

Figure 8A:
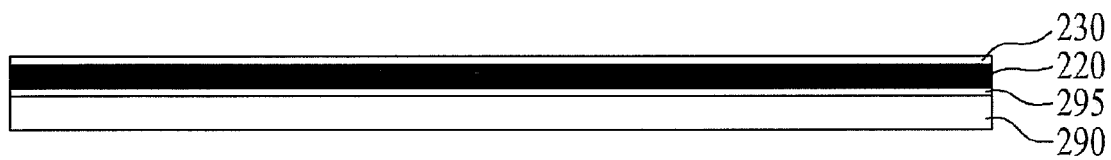
FIGS. 8A to 8G are views illustrating a method for manufacturing the light emitting device module of FIG. 1 in accordance with an exemplary embodiment of the present invention.

In accordance with the illustrated method, as shown in FIG. 8A, the insulating layer 220 and a conductive layer 230 are first formed over a base substrate 290. In this case, the insulating layer 220 may be fixed to the base substrate 290 by an adhesive 295.

For the conductive layer 230, which is bonded to the insulating layer 220, a copper foil, to which a polyimide film is bonded, may be used. Since the polyimide film has a small thickness of, for example, 5 μm, it is very advantageous in terms of thermal resistance.

Figure 8B:
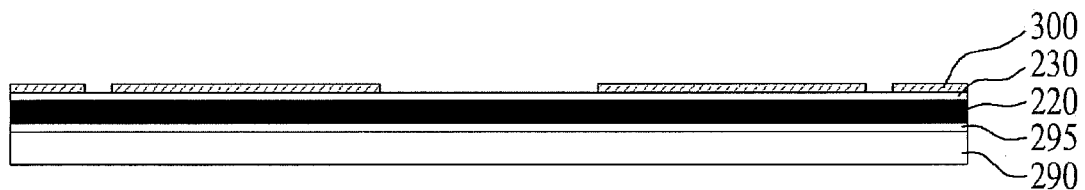

As shown in FIG. 8B, a mask 300 is formed on the conductive layer 230. Using the mask 300, the conductive layer 230 is subsequently patterned.

Figure 8C:
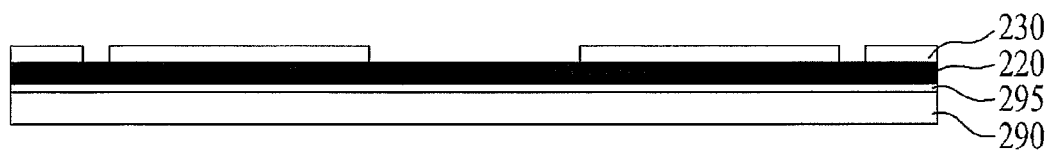

As the conductive layer 230 is patterned, three open regions are formed as shown in FIG. 8C. The intermediate open region corresponds to the bottom of the cavity shown in FIG. 1A. The portions of the conductive layer 230 arranged at opposite sides of the intermediate open region respectively correspond to the first conductive layer 230*a* and the second conductive layer 230*b*. The open regions arranged at opposite sides of the intermediate open region are narrow. These narrow open regions correspond to the exposed portions of the insulating layer 220 in FIG. 1A.

Figure 8D:
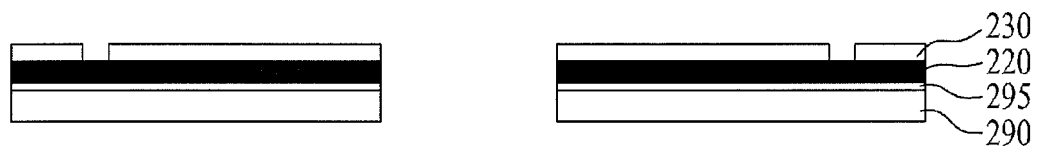

Thereafter, the insulating layer 220 is removed from a region corresponding to the bottom of the cavity, as shown in FIG. 8D. In this case, the base substrate 290 may be patterned along with the layers arranged thereon or may not be patterned because it will be removed in a subsequent process.

Figure 8E:
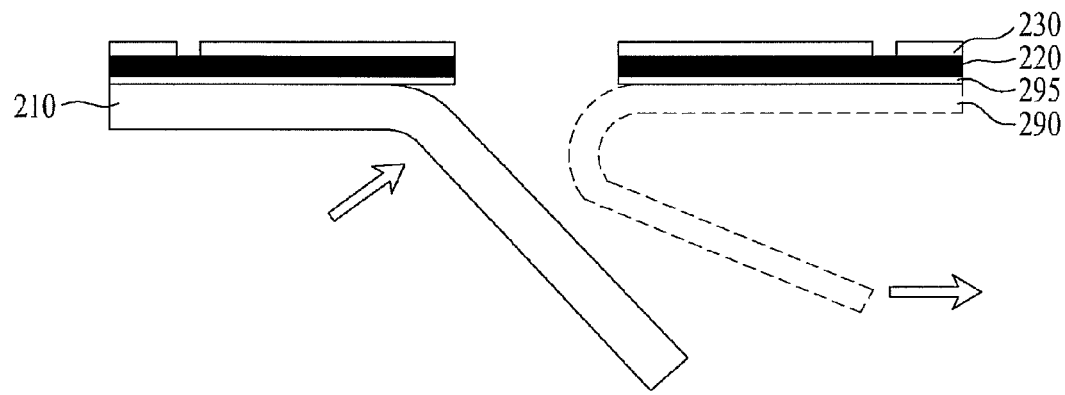

As shown in FIG. 8E, the base substrate 290 is then removed. Subsequently, the heat transfer member 210 is bonded to the insulating layer 220. In this case, the bonding may be achieved using the previously-coated adhesive 295 or an additional adhesive 295. The base substrate 290 is removed after functioning as a stiffener in the manufacturing procedure.

In this case, the insulating layer 220 and adhesive 295 form two layers between the heat transfer member 210 and the first conductive layer 230*a* and the second conductive layer 230*b*. Since the polyimide of the insulating layer 220 function as an electrical insulator, and the adhesive 295 performs a bonding function, an optimal structure capable of achieving an improvement in heat transfer characteristics may be obtained.

Since the heat transfer member 210, which has a metal structure thicker than the copper foil, supports the light emitting device 240, it may be possible to achieve a remarkable enhancement in reliability. It is also unnecessary to achieve an increase in stiffness using a transparent resin. Accordingly, the material of the resin layer may be selected from more various materials, and thus, cost reduction may be achieved.

Furthermore, it may be possible to achieve a great enhancement in heat dissipation characteristics in accordance with a combination of the insulating layer 220 and adhesive 295. For example, when only the insulating layer 220, which is made of polyimide, is applied between the first conductive layer 230a and the second conductive layer 230b, each of which is made of a copper foil having a thickness of, for example, 18 μm, and the heat transfer member 210, which is made of a copper foil having a thickness of 125 μm, the insulating layer 220 is required to have a thickness of, for example, 20 to 30 μm.

However, when the insulating layer 220 is applied along with the adhesive 295, it may be possible to reduce the thickness of the polyimide insulating layer 220. This may be achieved by thinly coating polyimide on the conductive layer 230 made of a copper foil, to form the insulating layer 220. Thus, the thickness of the polyimide insulating layer 220 may be reduced to 5 μm. Since the polyimide insulating layer 220, which has a thickness of 5 μm, provides insulation characteristics, the adhesive 295 may achieve an enhancement in thermal conductivity.

Figure 8F:
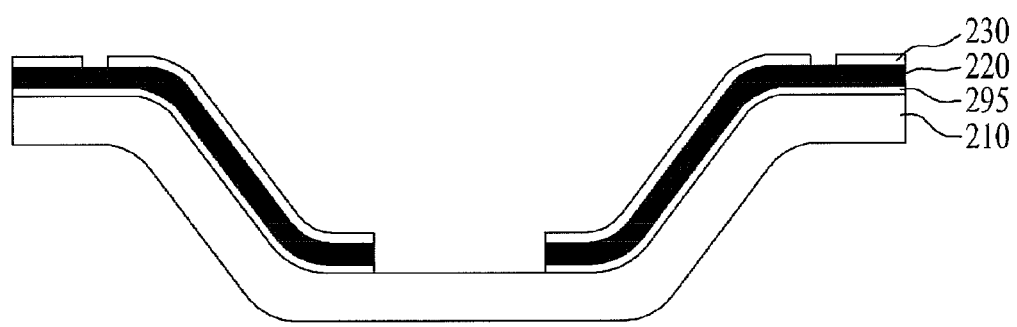

Thereafter, a pressure is applied to the heat transfer member 210 to bend the heat transfer member 210, and thus to form the cavity, as shown in FIG. 8F. At this time, the insulating layer 220 and the first conductive layer 230a and the second conductive layer 230b are also bent. The cavity may have a shape in which the edges of the cavity have a curved shape, or a shape in which the edges of the cavity have a point of inflection, as shown in FIG. 1A.

Figure 8G:
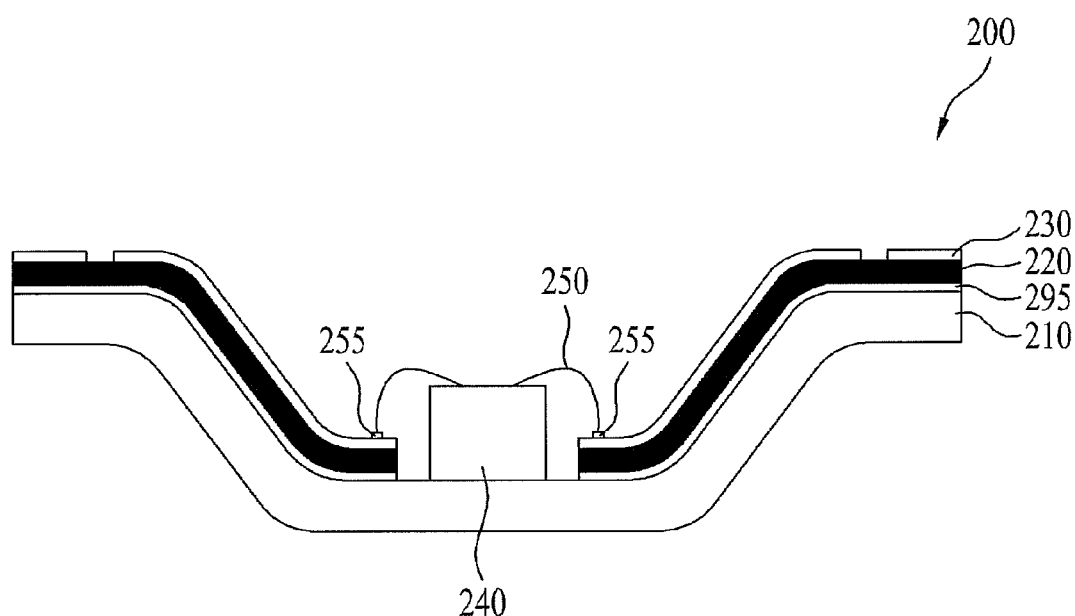

Subsequently, the light emitting device 240 is mounted on the bottom of the cavity, as shown in FIG. 8G. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255.

Figure 9:
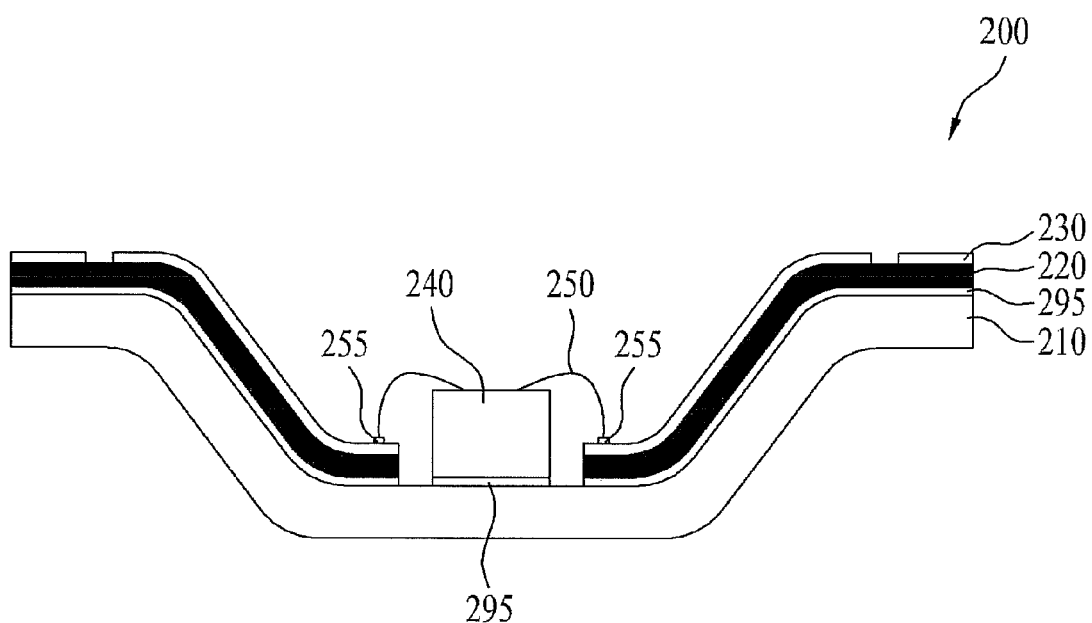
FIG. 9 is a view illustrating a light emitting device module according to a third embodiment.

FIG. 9 is a view illustrating a light emitting device module according to a third embodiment.

The light emitting device module of this embodiment is similar to that of FIG. 8G, except that the heat transfer member 210 is boned to the light emitting device 240 by the adhesive 295. Thermal pads may be used for the adhesive 295.

FIGS. 10A to 10E and FIG. 11 are views illustrating a light emitting device module according to a fourth embodiment and a method for manufacturing the same.

Figure 10A:
FIGS. 10A to 10E and FIG. 11 are views illustrating a light emitting device module according to a fourth embodiment of the present invention and a method for manufacturing the same.

In this embodiment, the base substrate 290 is not used, different form the embodiment of FIG. 8A, etc. First, the heat transfer member 210 is prepared, as shown in FIG. 10A. The heat transfer member 210 may be made of a material having excellent thermal conductivity. For example, copper (Cu) or aluminum (Al) may be used for the material of the heat transfer member 210.

Figure 10B:
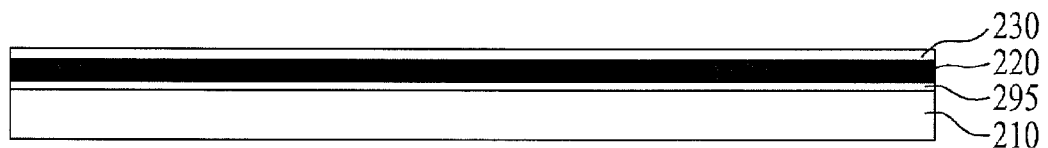

As shown in FIG. 10B, the insulating layer 220 and the conductive layer 230 are fixed on the heat transfer member 210 by the adhesive 295.

Figure 10C:
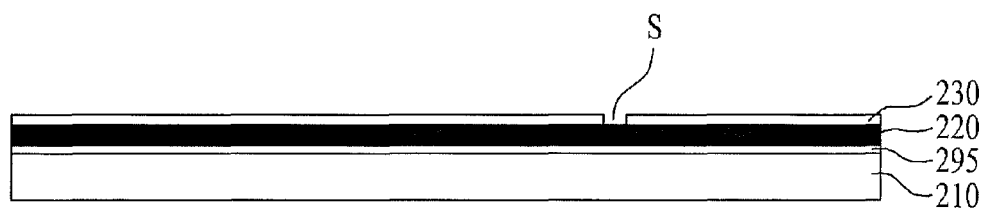

The conductive layer 230 is then patterned as shown in FIG. 10C. In this case, the conductive layer 230 is partially removed to partially expose the insulating layer 220. The conductive layer 230 is divided into first conductive layer 230a and the second conductive layer 230b by the region S where the insulating layer is exposed.

The process of partially removing the conductive layer 230 may be achieved using a mask, which is coated, as shown in FIG. 8B, etc., to selectively remove a portion of the conductive layer 230. Although opposite ends of the conductive layer 230 are not removed, namely, portions of the insulating layer 220 corresponding to the opposite ends are not exposed, in the illustrated embodiment, an open region, through which the insulating layer 220 is exposed, may be formed around the cavity, as shown in FIG. 8C, etc. This may also be implemented in embodiments to be described later.

Figure 10D:
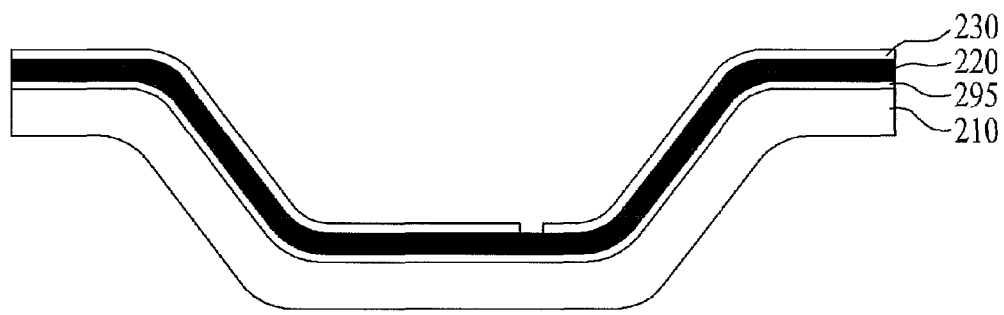

Thereafter, a pressure is applied to the heat transfer member 210 to bend the heat transfer member 210, and thus to define the cavity, as shown in FIG. 10D. At this time, the insulating layer 220 and the first conductive layer 230a and the second conductive layer 230b are also bent. The cavity may be formed to have a shape in which the edges of the cavity have a curved shape, or a shape in which the edges of the cavity have a point of inflection.

Figure 10E:
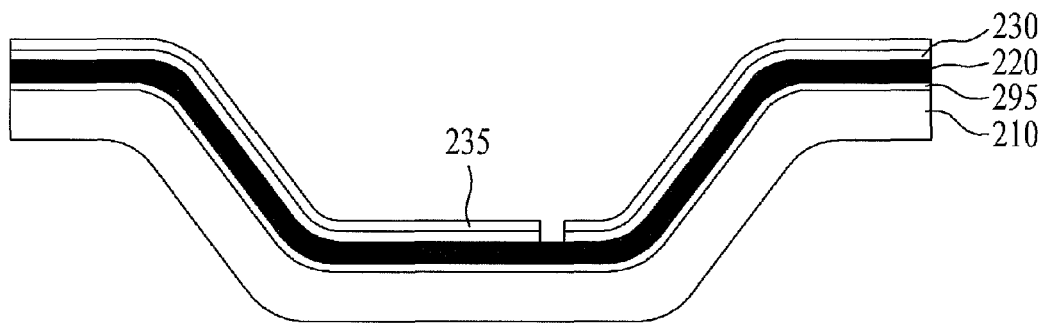

The reflective layer 235 is then formed over the first conductive layer 230a and the second conductive layer 230b, as shown in FIG. 10E. The reflective layer 235 may be made of a material capable of reflecting light emitted from the light emitting device 240 in order to send the reflected light to an outside of the cavity. A silver (Ag) may be coated over the reflective layer 235.

Figure 11:
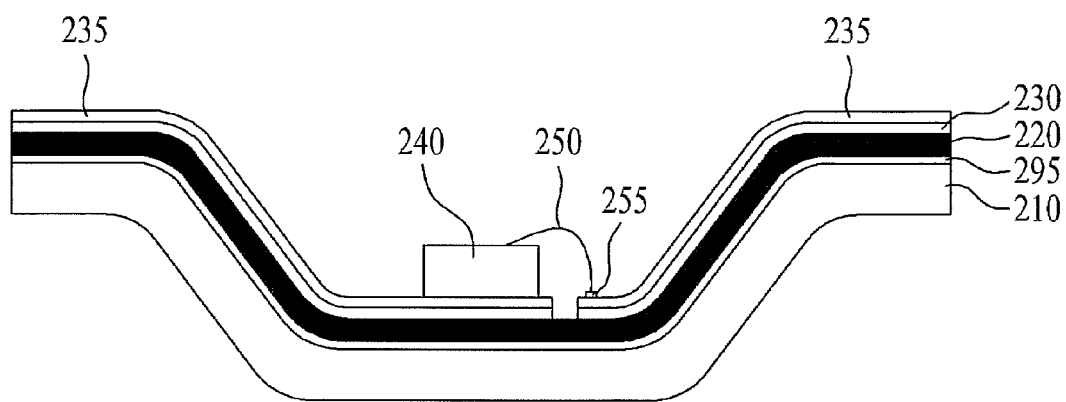

Thereafter, the light emitting device 240 is disposed in the cavity of the heat transfer member 210. Thus, a light emitting device module as shown in FIG. 11 is completely obtained. Finally, the heat transfer member 210 of the light emitting device module is coupled to the substrate 100 via the adhesive layer 110.

The substrate 100 may function as a body of the light emitting device module. When the substrate 100 is made of a metal, it may function as a bracket to support a light source module in a backlight unit. As shown in FIG. 11, the light emitting device 240 is wire-bonded to the first conductive layer 230a and the second conductive layer 230b by the wires 250. If the light emitting device 240 is bonded to the first conductive layer 230a and the second conductive layer 230b using a conductive material, satisfactory wire bonding may be achieved using only one wire 250. Although the light emitting device 240 is illustrated as being electrically connected to the reflective layer 235 in FIG. 11, it may be electrically connected to the first conductive layer 230a and the second conductive layer 230b. This may also be implemented in embodiments to be described later.

Electrode pads 255 may be formed on the first conductive layer 230a and the second conductive layer 230b. The wires 250 are bonded to the electrode pads 255. Thereafter, a resin layer (not shown) fills the cavity to protect the light emitting device 240 and wires 250. In the following embodiments, this is achieved in the same manner as described above.

The embodiment shown in FIG. 11 may exhibit degraded heat dissipation effects, as compared to the embodiments of FIGS. 1A and 1B, because the light emitting device 240 contacts the heat transfer member 210 via the first conductive layer 230a and the second conductive layer 230b and the insulating layer 220 in the embodiment of FIG. 11. However, the circuit board may be arranged in a region corresponding to the edge portions of the first conductive layer 230a and the second conductive layer 230b around the cavity, as in the embodiments of FIGS. 1A and 1B. It may also be unnecessary to form a package body using a polyphthalamide (PPA) resin. Accordingly, the effect of transferring heat emitted from the light emitting device 240 to the heat transfer member 210 is great.

Figure 12:
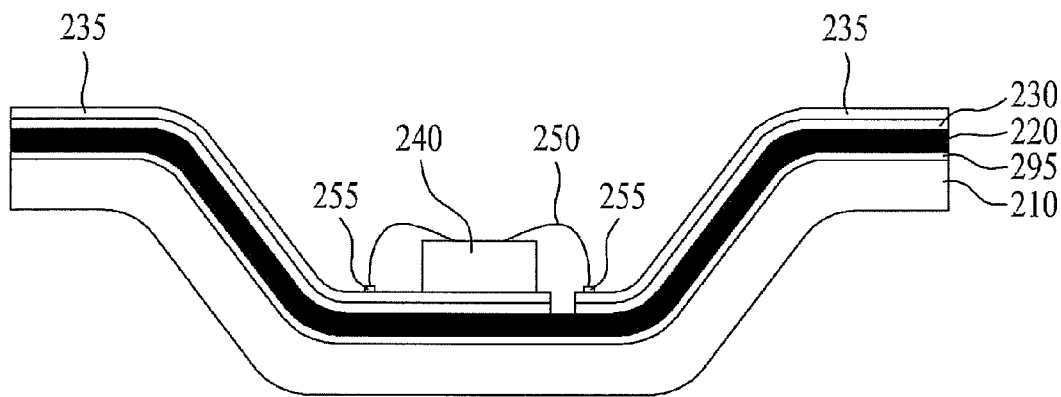
FIG. 12 is a view illustrating a light emitting device module according to a fifth embodiment.

FIG. 12 is a view illustrating a light emitting device module according to a fifth embodiment. In this embodiment, the light emitting device 240 is wire-bonded to the first conductive layer 230a and the second conductive layer 230b by two wires 250, different from the embodiment of FIG. 11.

Figure 13:
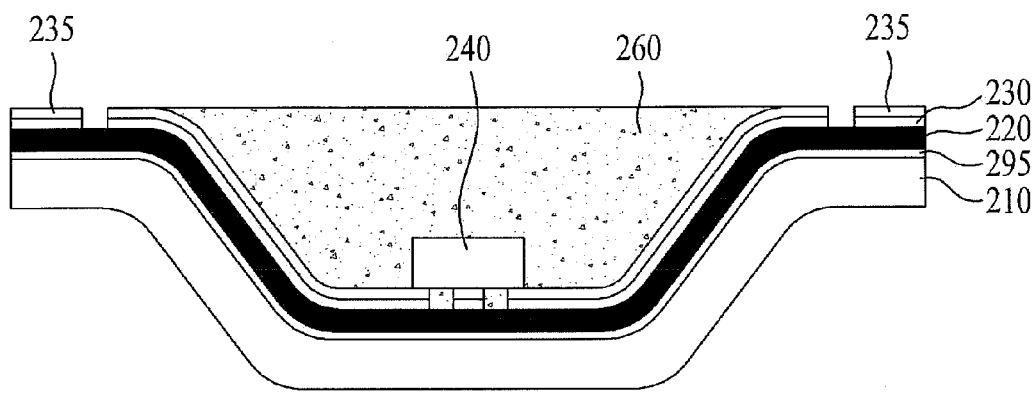
FIG. 13 is a view illustrating a light emitting device module according to a sixth embodiment.

FIG. 13 is a view illustrating a light emitting device module according to a sixth embodiment. In this embodiment, the light emitting device 240 is electrically connected to the first conductive layer 230a and the second conductive layer 230b without using wire bonding. That is, in this embodiment, the light emitting device 240 is of a flip-chip type so that it may be directly bonded to the first conductive layer 230a and the second conductive layer 230b.

Figure 14:
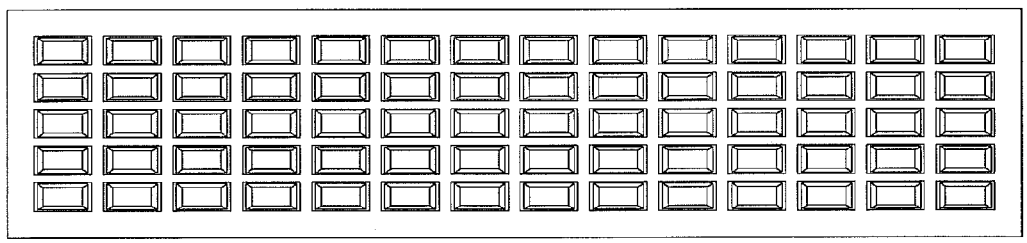
FIGS. 14 and 15 are plan views illustrating light emitting device arrays according to different embodiments.
Figure 15:
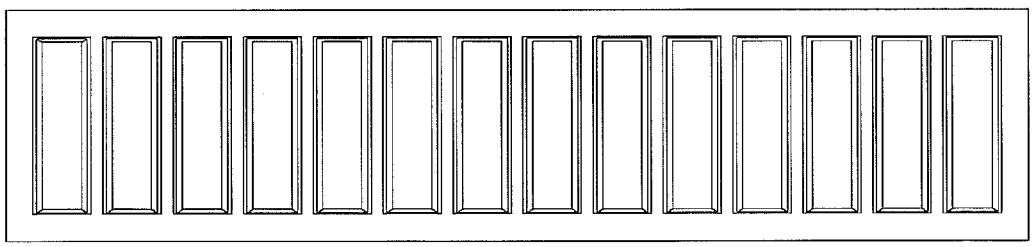

FIGS. 14 and 15 are views illustrating light emitting device module arrays according to exemplary embodiments, respectively.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member. FIG. 14 is a view illustrating a state in which the light emitting device array has not been separated into individual light emitting device modules. FIG. 15 illustrates a structure in which a plurality of light emitting devices can be disposed in each cavity.

Figure 16:
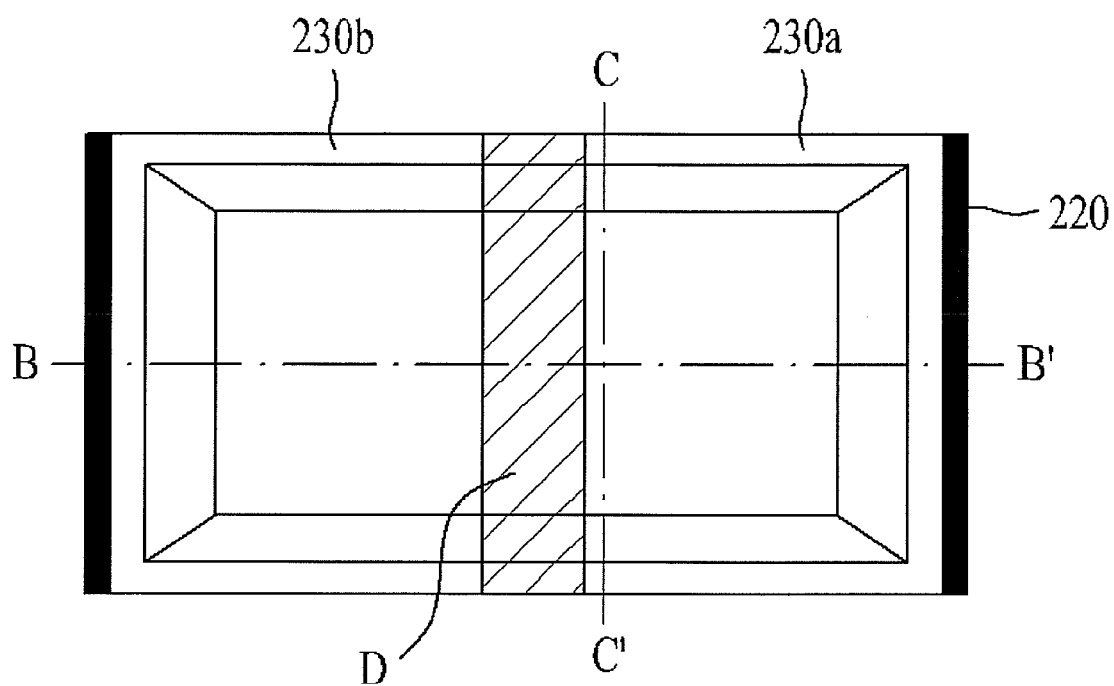
FIG. 16 is an enlarged view illustrating a part of the light emitting device module array shown in FIG. 14.

FIG. 16 is an enlarged view illustrating a part of the light emitting device module array shown in FIG. 14. FIG. 17 shows cross-sectional views respectively taken in directions corresponding to a longer axis B-B' and a shorter axis C-C' of FIG. 16.

Referring to FIG. 16, the first conductive layer 230a and the second conductive layer 230b, which define a cavity, are shown. Also, FIG. 16 shows partial exposure of the insulating layer 220 in a region around the cavity. The heat transfer member (not shown) may be directly exposed in a region C corresponding to a portion of the bottom of the cavity.

FIG. 17(B-B'), which is a cross-sectional view taken along the line B-B' of FIG. 16, shows exposure of the heat transfer member 210 in a central portion of the cavity. However, in FIG. 17(C-C'), which is a cross-sectional view taken along the line C-C' of FIG. 16, the heat transfer member 210 is not exposed at the bottom of the cavity. That is, the heat transfer member 210 is exposed in a short-axis direction within the cavity.

Figure 18A:
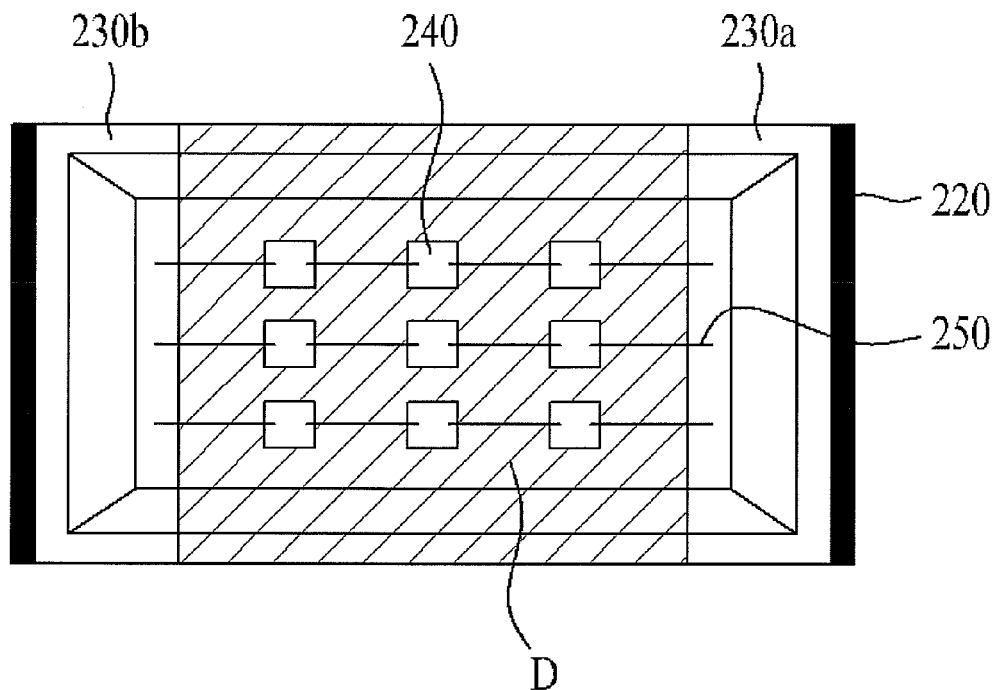
FIGS. 18A and 18B are a plan view and a sectional view illustrating a light emitting device module according to a seventh embodiment, respectively.
Figure 18B:
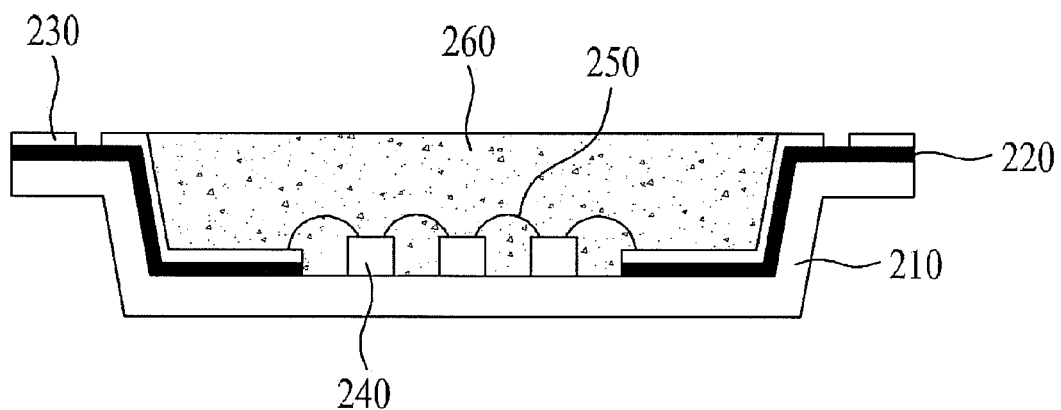

FIGS. 18A and 18B illustrate a light emitting device module according to a seventh embodiment through a plan view and a sectional view, respectively.

In this embodiment, a plurality of light emitting devices 240 is disposed in the cavity. The light emitting devices are wire-bonded to one another by wires 250. The light emitting devices 240 arranged at opposite side edges of the cavity are wire-bonded to the first conductive layer 230a and the second conductive layer 230b by wires 250.

Similarly to the previous embodiments, the heat transfer member may be exposed at the central region D of the cavity. As shown in FIG. 18B, each light emitting device 240 directly contacts the heat transfer member 210 exposed at the bottom of the cavity.

Figure 18C:
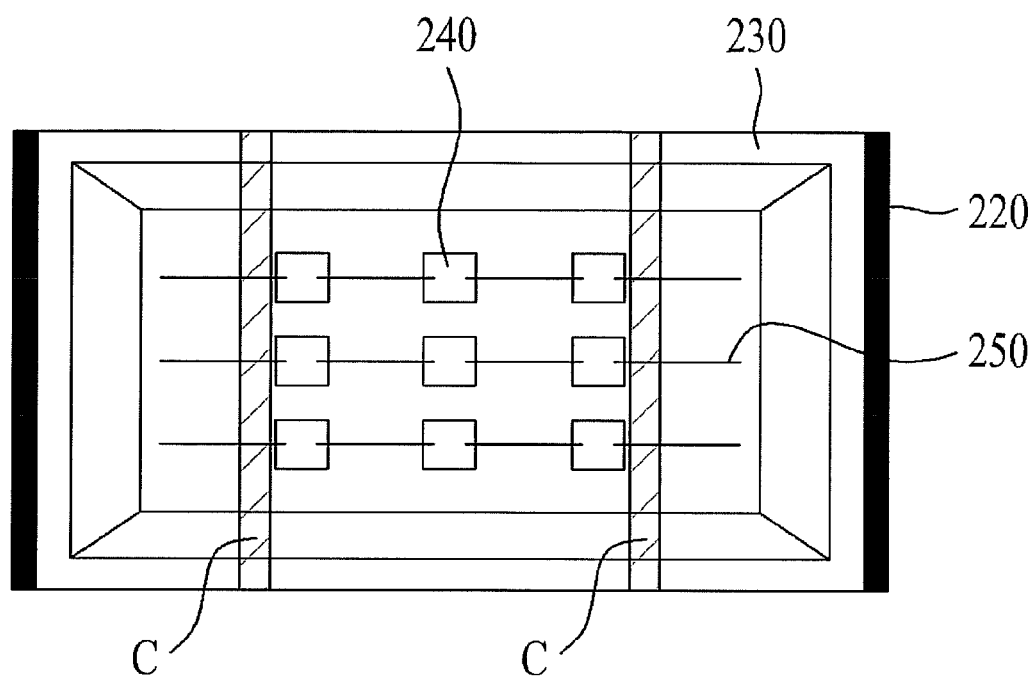
FIGS. 18C and 18D are a plan view and a sectional view illustrating light emitting device module according to an eighth embodiment, respectively.
Figure 18D:
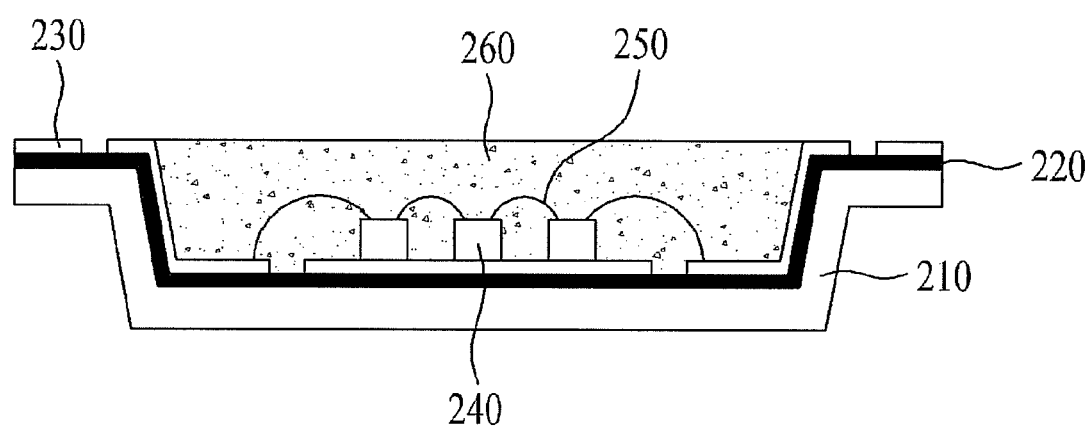

FIGS. 18C and 18D illustrate a light emitting device module according to an eighth embodiment through a plan view and a sectional view, respectively.

This embodiment is similar to the embodiment of FIGS. 18A and 18B, except that the heat transfer member 210 is not exposed at the bottom of the cavity. That is, the insulating layer 220 and the first conductive layer 230a and the second conductive layer 230b are completely disposed on the heat transfer member 210 in a region corresponding to the bottom of the cavity where the light emitting devices 240 are disposed.

In order to avoid short of current supplied to each light emitting device 240, the first conductive layer 230a and the second conductive layer 230b are removed from a region D corresponding to a portion of the bottom of the cavity. Although the insulating layer 220 has been shown as being left in the region D, as shown in FIG. 18D, this insulating layer 220 may be removed to expose the heat transfer member 210, as in the previous embodiments.

In the embodiments of FIGS. 18A to 18D, the light emitting devices 240 disposed in the cavity may be electrically connected to one another through wire bonding or the like. The light emitting devices 240 arranged at the opposite side edges of the cavity may be electrically connected to one of the first conductive layer 230a and the second conductive layer 230b by wire bonding or the like.

Figure 19:
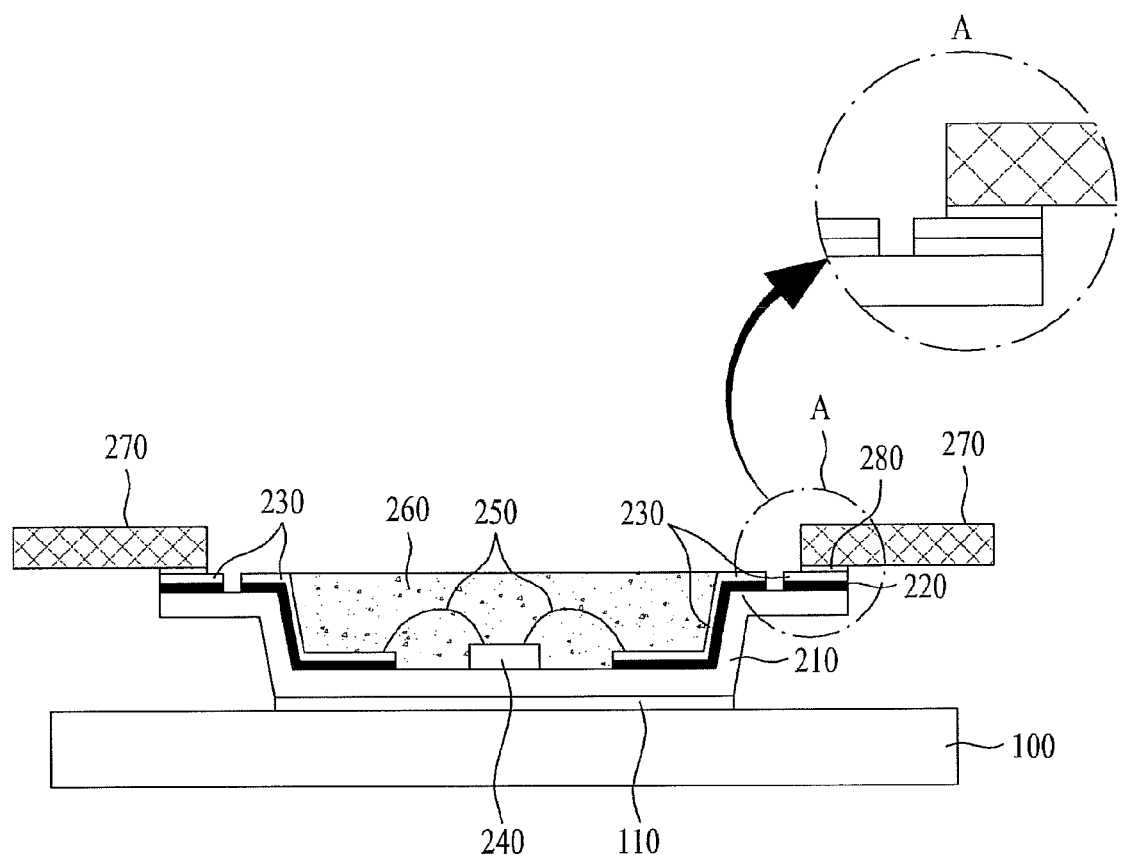
FIG. 19 is a sectional view illustrating a light emitting device module according to a ninth embodiment.

FIG. 19 is a view illustrating a light emitting device module according to a ninth embodiment. In this embodiment, an open region is formed not only at the first conductive layer 230a and the second conductive layer 230b, but also at the insulating layer 220. The heat transfer member 210 is exposed in the open region. The shape of the open region is identical to those of the above-described embodiments.

Figure 20:
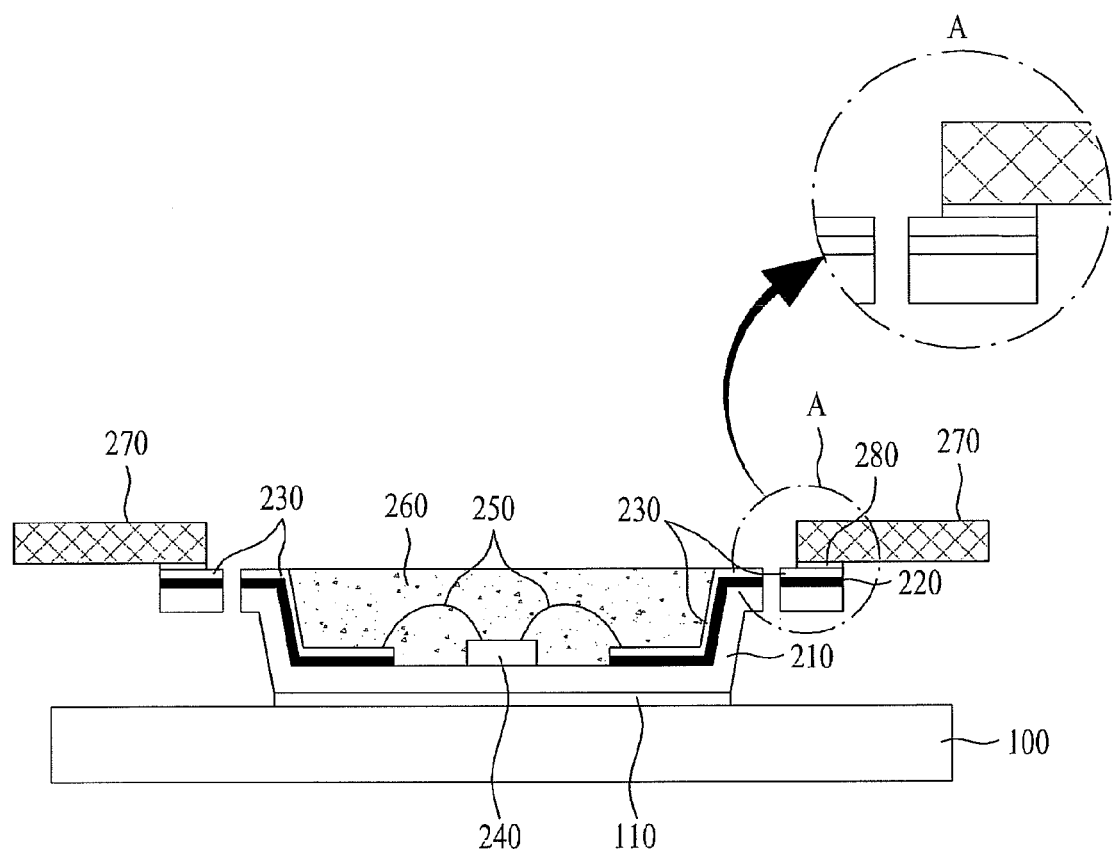
FIG. 20 is a sectional view illustrating a light emitting device module according to a tenth embodiment.

FIG. 20 is a view illustrating a light emitting device module according to a tenth embodiment. In this embodiment, an open region is formed not only at the first conductive layer 230a and the second conductive layer 230b and the insulating layer 220, but also at the heat transfer member 210. The shape of the open region is identical to those of the above-described embodiments. Although each of the first conductive layer 230a and the second conductive layer 230b, the insulating layer 220, and the heat transfer member 210 is shown as being divided into portions, the actual shape of the open region is a line shape as shown in FIG. 2, etc., and the separated portions of each of the first conductive layer 230a and the second conductive layer 230b, the insulating layer 220, and the heat transfer member 210 are connected at a portion of the open region.

Figure 21:
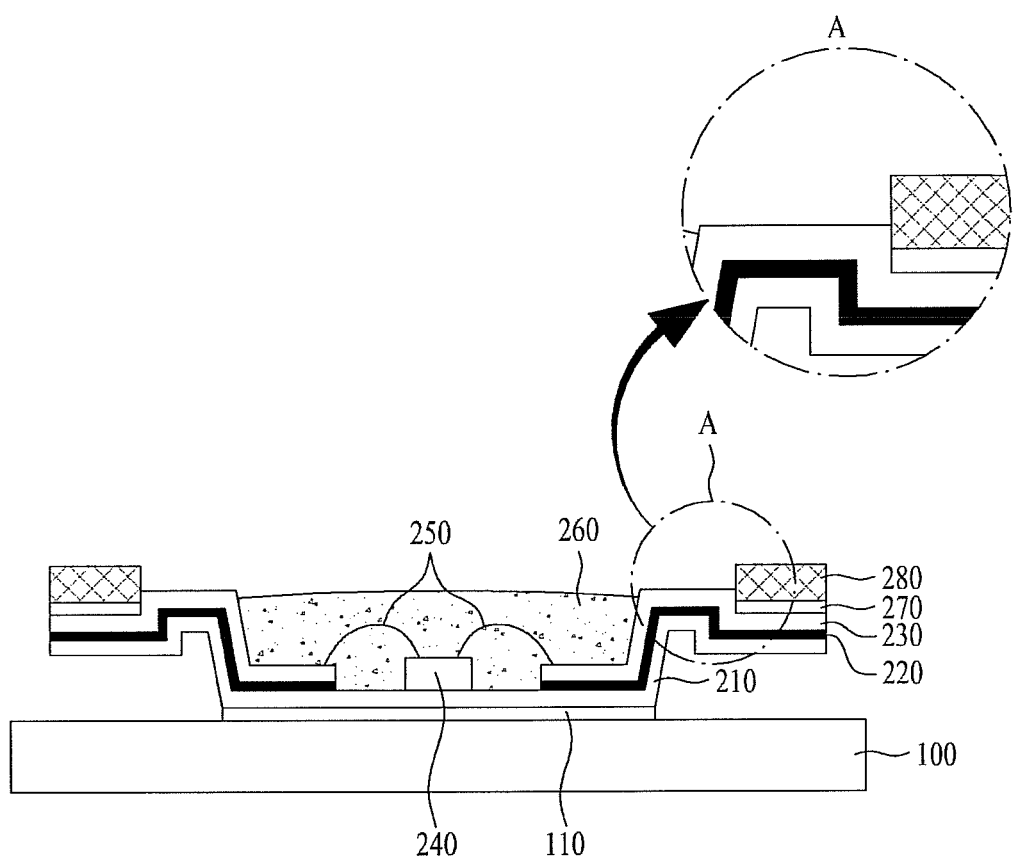
FIG. 21 is a sectional view illustrating a light emitting device module according to an eleventh embodiment.
Figure 22:
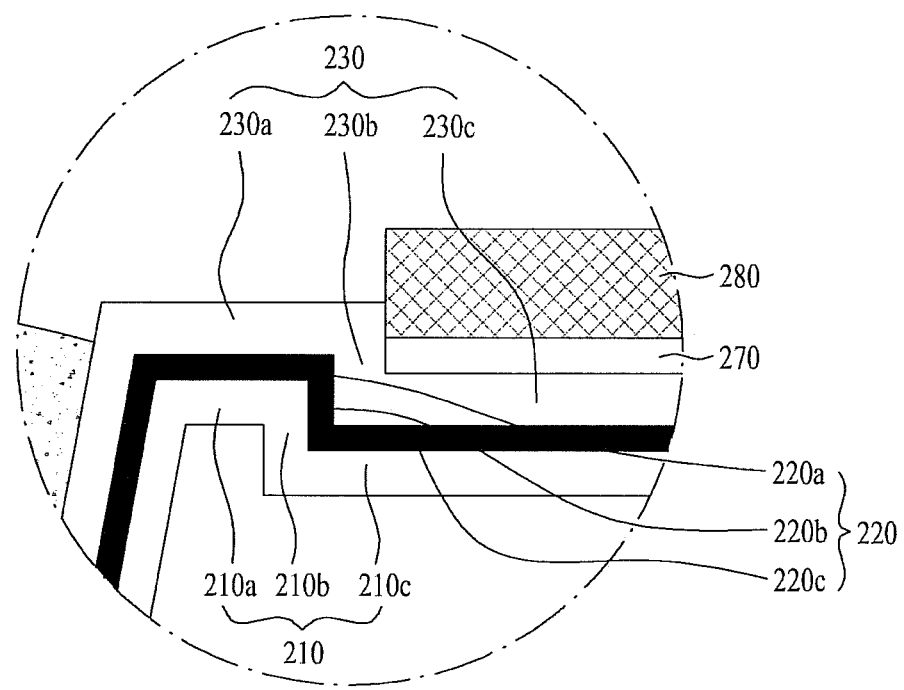
FIGS. 22 and 23 are enlarged views corresponding to a portion "A" of FIG. 21.
Figure 23:
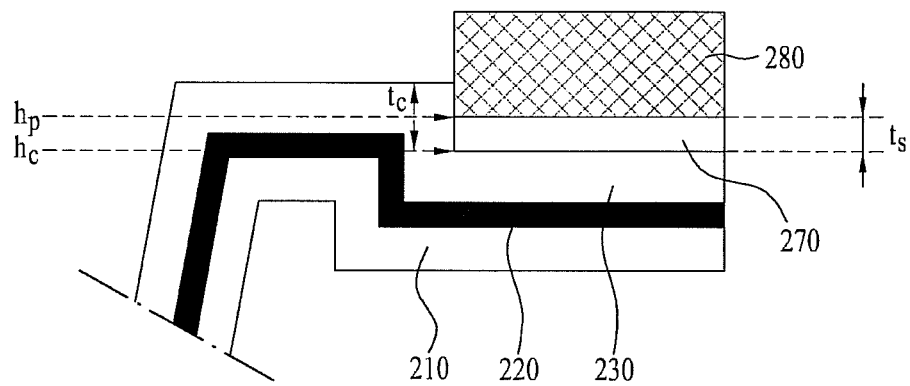

FIG. 21 is a view illustrating a light emitting device module according to an eleventh embodiment. FIGS. 22 and 23 are enlarged views corresponding to a portion "A" of FIG. 21.

The light emitting device module according to this embodiment is similar to that of FIG. 1. In this embodiment, however, the heat transfer member 210 is formed with a step at a portion thereof corresponding to a region outside the cavity so that the portion of the heat transfer member 210 arranged far away from the cavity is lower than the portion of the heat transfer member 210 arranged adjacent to the cavity.

Since the heat transfer member 210 has a step as described above, the insulating layer 220 and the first conductive layer 230a and the second conductive layer 230b, which have the same pattern as the heat transfer member 210, have steps, respectively.

The circuit board 270 is electrically connected to the first conductive layer 230a and the second conductive layer 230b by the conductive adhesive 280. The circuit board 270 is disposed on a surface region lower than the step of the heat transfer member 210. That is, the circuit board 270 is disposed on a surface region lower than the steps of the first conductive layer 230a and the second conductive layer 230b.

In accordance with this structure, each of the heat transfer member 210 and the first conductive layer 230a and the second conductive layer 230b has a portion formed at a higher level between the resin layer 260 in the cavity and the conductive adhesive 270/circuit board 280. Accordingly, it may be possible to prevent the resin layer 260 inside the cavity and the conductive adhesive 270 outside the cavity from flowing over the first conductive layer 230a and the second conductive layer 230b.

In particular, when the maximum heights of the first conductive layer 230a and the second conductive layer 230b between the cavity and the circuit board 270 is greater than the maximum height of the conductive adhesive 270 and/or the resin layer 260, it may be possible to prevent flowing of the conductive adhesive 270 and resin layer 260.

Similarly to the open region formed at a portion of the insulating layer 220 in the embodiment of FIG. 1, the steps of the first conductive layer 230a and the second conductive layer 230b in this embodiment may function as a blocking unit for blocking introduction of an unnecessary material from the outside of the cavity into the cavity.

Hereinafter, the structure of the step will be described in detail. As shown in FIG. 22, the heat transfer member 210 includes a first step portion 210a corresponding to an upper portion of the step, a second step portion 210c corresponding to a lower portion of the step, and a connecting portion 210b for connecting the first and second step portions 210a and 210b.

The conductive layer 230 is also patterned to have a step corresponding to the step of the heat transfer member 210. Accordingly, the conductive layer 230 includes a first step portion 230d corresponding to an upper portion of the step, a second step portion 230e corresponding to a lower portion of the step, and a connecting portion 230e for connecting the first and second step portions 230d and 230e.

The insulating layer 220, which is interposed between the heat transfer member 210 and the conductive layer 230, is also patterned to have a step corresponding to the steps of the heat transfer member 210 and conductive layer 230. Accordingly, the insulating layer 220 includes a first step portion 220a corresponding to an upper portion of the step, a second step portion 220b corresponding to a lower portion of the step, and a connecting portion 220c for connecting the first and second step portions 220a and 220b.

When the conductive adhesive 270 to bond the circuit board 280 to the conductive layer 230 has a thickness equal to or less than a thickness or height of the step, it may be possible to prevent the conductive adhesive 270 from flowing into the cavity. That is, the lower surface of the circuit board 280 may be flush with or lower than an upper surface of the conductive layer 230 to the thickness of the conductive adhesive 270.

Referring to FIG. 23, the thickness or height of the step is defined by "$t_c$", and the thickness of the conductive adhesive 270 is defined by "$t_s$". Since "$t_s$" is equal to or less than "$t_c$", the conductive adhesive 270 may not flow over the conductive layer 230 toward the cavity.

The thickness $t_s$ corresponds to a difference between a height $h_p$ at which the conductive adhesive 270 contacts the circuit board 280 and a height $h_c$ at which the conductive adhesive 270 contacts the conductive layer 230.

Although not shown, a reflective layer may be formed over the conductive layer 230 within the cavity. The reflective layer may be made of a material capable of reflecting light emitted from the light emitting device 240 in order to send the reflected light to an outside of the cavity. A silver (Ag) may be coated over the reflective layer.

FIGS. 24A to 24G are views illustrating a method for manufacturing the light emitting device module of FIG. 21 in accordance with an exemplary embodiment.

Figure 24A:
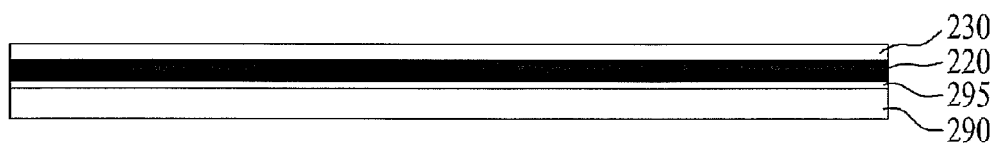

In accordance with the illustrated method, as shown in FIG. 24A, the insulating layer 220 and the conductive layer 230 are first formed over a base substrate 290. In this case, the insulating layer 220 may be fixed to the base substrate 290 by an adhesive 295.

For the conductive layer 230, which is bonded to the insulating layer 220, a copper foil, to which a polyimide film is bonded, may be used. Since the polyimide film has a small thickness of, for example, 5 μm, it is very advantageous in terms of thermal resistance.

Figure 24B:
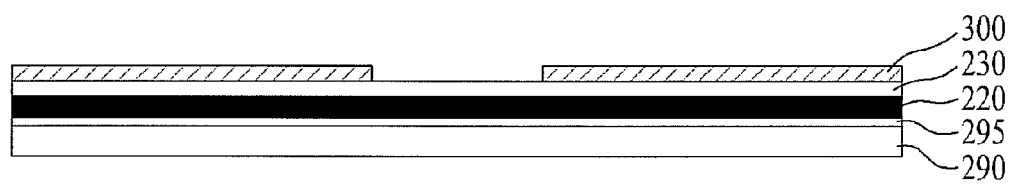
Figure 24C:
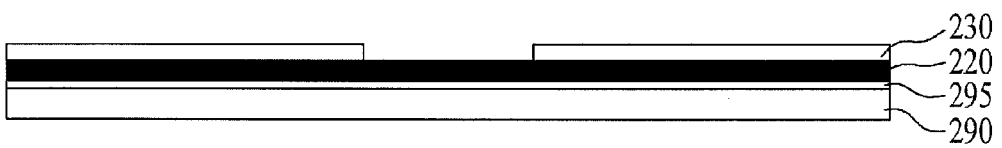
Figure 24D:

As shown in FIG. 24B, a mask 300 is selectively formed on the conductive layer 230. Using the mask 300, the conductive layer 230 is subsequently patterned, as shown in FIG. 24C. In this case, the conductive layer 230 may be divided into two portions, namely, the first conductive layer 230a and the second conductive layer 230b.

The insulating layer 220, base substrate 290 and adhesive 295 may be patterned in the same manner as the conductive layer 230. The middle region of FIG. 24D, from which the insulating layer 220, etc. are removed, corresponds to the bottom of the cavity in FIG. 21.

Figure 24E:
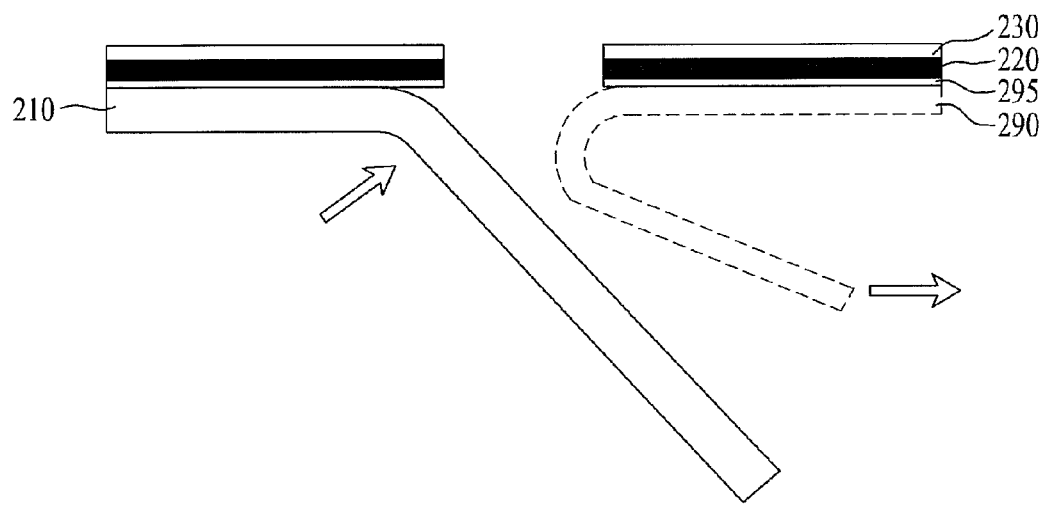

As shown in FIG. 24E, the base substrate 290 is then removed. Subsequently, the heat transfer member 210 is bonded to the insulating layer 220. In this case, the bonding may be achieved using the previously-coated adhesive 295 or an additional adhesive 295. The base substrate 290 is removed after functioning as a stiffener in the manufacturing procedure.

In this case, the insulating layer 220 and adhesive 295 form two layers between the heat transfer member 210 and each of the first and second conductive layers 230a and 230b. Since the polyimide of the insulating layer 220 function as an electrical insulator, and the adhesive 295 performs a bonding function, an optimal structure capable of achieving an improvement in heat transfer characteristics may be obtained.

Since the heat transfer member 210, which has a metal structure thicker than the copper foil, supports the light emitting device 240, it may be possible to achieve a remarkable enhancement in reliability. It is also unnecessary to achieve an increase in stiffness using a transparent resin. Accordingly, the material of the resin layer may be selected from more various materials, and thus, cost reduction may be achieved.

Furthermore, it may be possible to achieve a great enhancement in heat dissipation characteristics in accordance with a combination of the insulating layer 220 and adhesive 295. For example, when only the insulating layer 220, which is made of polyimide, is applied between each of the first conductive layer 230a and the second conductive layer 230b, which is made of a copper foil having a thickness of, for example, 18 μm, and the heat transfer member 210, which is made of a copper foil having a thickness of 125 μm, the insulating layer 220 is required to have a thickness of, for example, 20 to 30 μm, when tolerance and bonding force are taken into consideration.

However, when the insulating layer 220 is applied along with the adhesive 295, it may be possible to reduce the thickness of the polyimide insulating layer 220. This may be achieved by thinly coating polyimide over the conductive layer 230 made of a copper foil, to form the insulating layer 220. Thus, the thickness of the polyimide insulating layer 220 may be reduced to 5 μm. Since the thin polyimide insulating layer 220, which has a thickness of 5 μm, provides insulation characteristics, the adhesive 295 may achieve an enhancement in thermal conductivity.

Figure 24F:
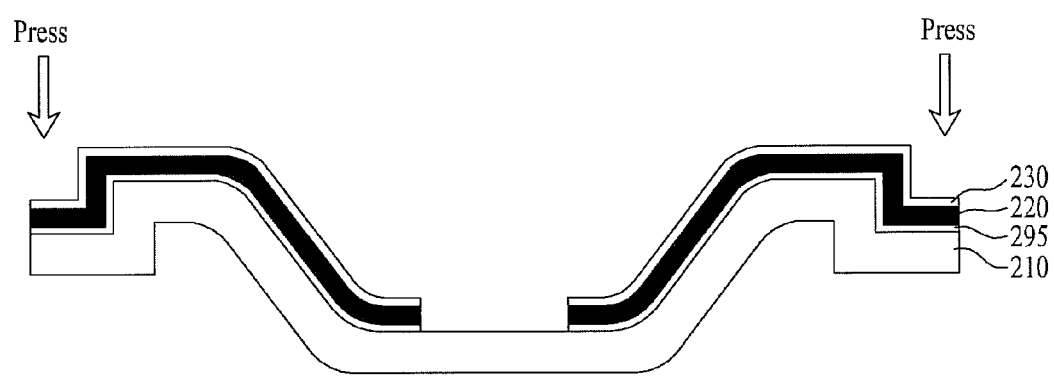

Thereafter, a pressure is applied to the edges of the heat transfer member 210 to form a step at the heat transfer member 210, as shown in FIG. 24F. At this time, the insulating layer 220 and the first conductive layer 230a and the second conductive layer 230b are also stepped in the same manner as the heat transfer member 210.

The above-described step may be formed using a method for pressing the heat transfer member 210 or the like. The step may be formed as the heat transfer member 210 is bent in a vertical direction or in a streamlined shape.

Thereafter, a pressure is applied to the heat transfer member 210 to bend the heat transfer member 210, and thus to form the cavity. At this time, the insulating layer 220 and the first conductive layer 230a and the second conductive layer 230b are also bent. The cavity may have a shape in which the edges of the cavity have a curved shape, as shown in FIG. 9, or a shape in which the edges of the cavity have a point of inflection, as shown in FIG. 21.

Subsequently, the light emitting device 240 is mounted on the bottom of the cavity, as shown in FIG. 24G. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member.

FIG. 25 shows cross-sectional views respectively taken in directions corresponding to a longer axis and a shorter axis in the light emitting device module of FIG. 21. FIG. 25 shows only the heat transfer member 210, insulating layer 220, and the first conductive layer 230a and the second conductive layer 230b while omitting illustration of the light emitting device, etc.

FIG. 25(B-B'), which is a cross-sectional view taken in the longer axis direction of the light emitting device module, shows exposure of the heat transfer member 210 in a central portion of the cavity. However, in FIG. 25(C-C'), which is a cross-sectional view taken in the shorter axis direction of the light emitting device module, the heat transfer member 210 is not exposed at the bottom of the cavity. That is, the heat transfer member 210 is exposed in a short-axis direction within the cavity.

FIGS. 26A to 26F are views illustrating a light emitting device module according to a twelfth embodiment and a method for manufacturing the same.

In this embodiment, the base substrate 290 is not used, different form the embodiment of FIG. 24A, etc. Also, the insulating layer 220 may be fixed to the heat transfer member 210 without using the adhesive 295. In this case, a material having a bonding property such as polyimide may be used for the insulating layer 220. In other embodiments, the adhesive 295 may be dispensed with.

Figure 26A:
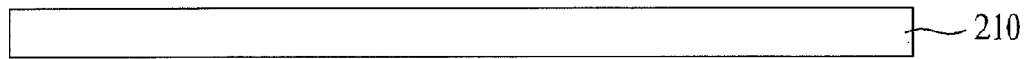
FIGS. 26A to 26F are views illustrating a method for manufacturing a light emitting device module according to a twelfth embodiment.

First, the heat transfer member 210 is prepared, as shown in FIG. 26A. The heat transfer member 210 may be made of a material having excellent thermal conductivity. For example, copper (Cu) or aluminum (Al) may be used for the material of the heat transfer member 210.

Figure 26B:
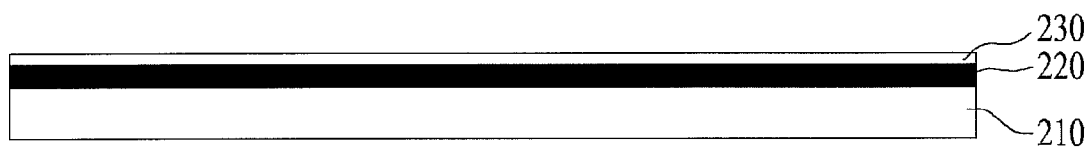

As shown in FIG. 26B, the insulating layer 220 and the conductive layer 230 are fixed on the heat transfer member 210 by the adhesive 295.

Figure 26C:
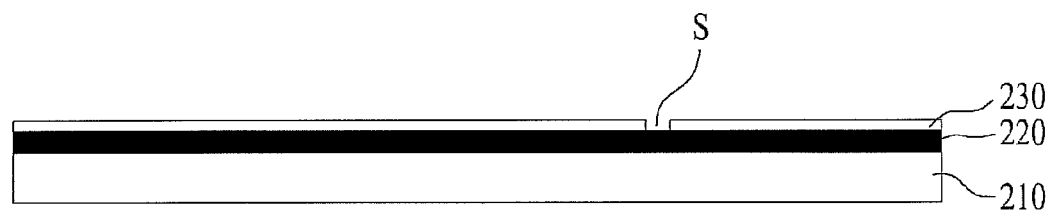

The conductive layer 230 is then patterned as shown in FIG. 26C. In this case, the conductive layer 230 is partially removed to partially expose the insulating layer 220. The conductive layer 230 is divided into first conductive layer 230a and the second conductive layer 230b by the region S where the insulating layer is exposed.

The process of partially removing the conductive layer 230 may be achieved using a mask to selectively remove a portion of the conductive layer 230.

Figure 26D:
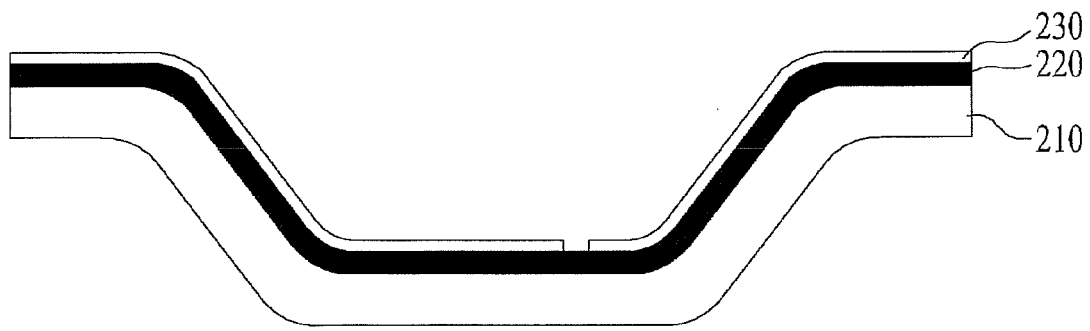

Thereafter, a pressure is applied to the heat transfer member 210 to bend the heat transfer member 210, and thus to form the cavity, as shown in FIG. 26D. At this time, the insulating layer 220 and the first conductive layer 230a and the second conductive layer 230b are also bent. The cavity may have a shape in which the edges of the cavity have a curved shape, or a shape in which the edges of the cavity have a point of inflection, as shown in FIG. 26D.

Figure 26E:
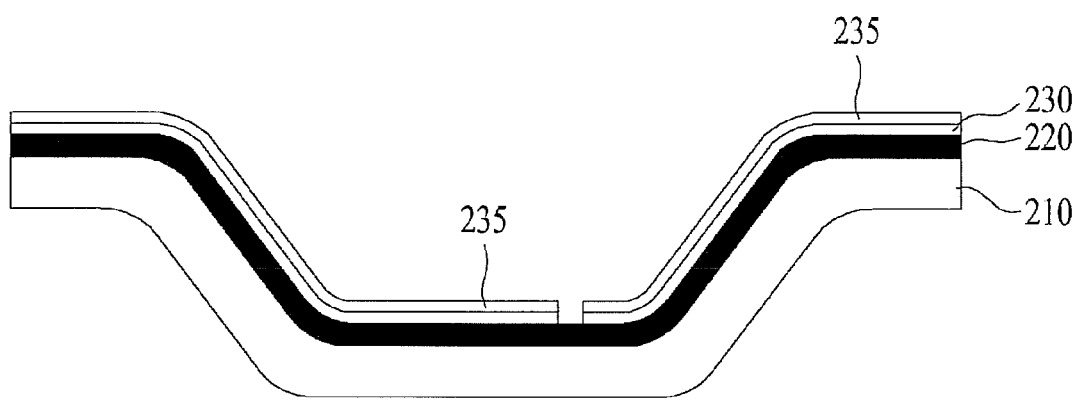

The reflective layer 235 is then formed over the first conductive layer 230a and the second conductive layer 230b, as shown in FIG. 26E. The reflective layer 235 may be made of a material capable of reflecting light emitted from the light emitting device 240 in order to send the reflected light to an outside of the cavity. A silver (Ag) may be coated over the reflective layer 235.

Figure 26F:
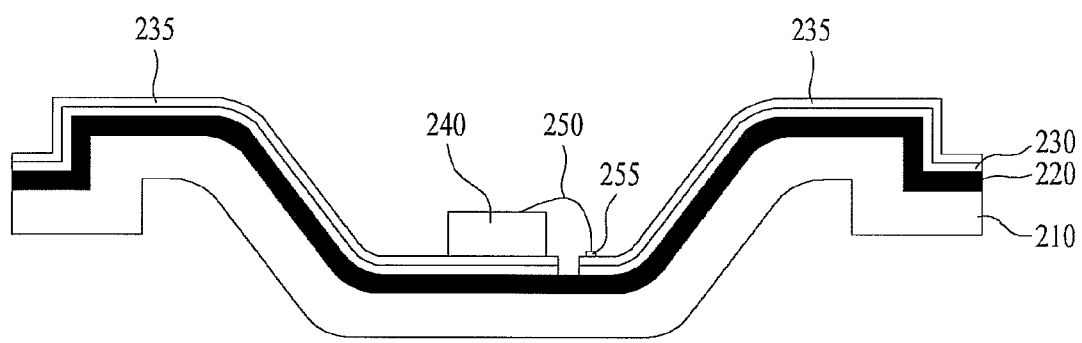

Thereafter, a pressure is applied to the edges of the heat transfer member 210 to form a step at the heat transfer member 210, as shown in FIG. 26F. At this time, the insulating layer 220 and the first conductive layer 230a and the second conductive layer 230b are also stepped in the same manner as the heat transfer member 210. In the illustrated case, the reflective layer 235 is also stepped in the same manner as described above. Of course, the reflective layer 235 may be formed only within the cavity.

The above-described step may be formed using a method for pressing the heat transfer member 210 or the like. The step may be formed as the heat transfer member 210 is bent in a vertical direction or in a streamlined shape.

The detailed structure of the above-described step is identical to the structure described with reference to FIGS. 22 and 23. In the following embodiments, this structure may also be used.

Subsequently, the light emitting device 240 is mounted on the bottom of the cavity. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255. When a circuit board is coupled to the region where the step is formed, using a conductive adhesive, a light emitting device module is completely obtained. When a resin layer (not shown) fills the cavity of FIG. 26F, it may be possible to protect the light emitting device 240 and wires 250. In the following embodiments, this is achieved in the same manner as described above.

The embodiment shown in FIG. 26F may exhibit degraded heat dissipation effects, as compared to the embodiments of FIG. 21, because the light emitting device 240 contacts the heat transfer member 210 via the first conductive layer 230a and the second conductive layer 230b and the insulating layer 220 in the embodiment of FIG. 26F. However, the circuit board may be arranged in a region corresponding to the edge portions of the first conductive layer 230a and the second conductive layer 230b around the cavity, as in the embodiments of FIG. 21. It may also be unnecessary to form a package body using a polyphthalamide (PPA) resin. Accordingly, the effect of transferring heat emitted from the light emitting device 240 to the heat transfer member 210 is great.

Figure 27:
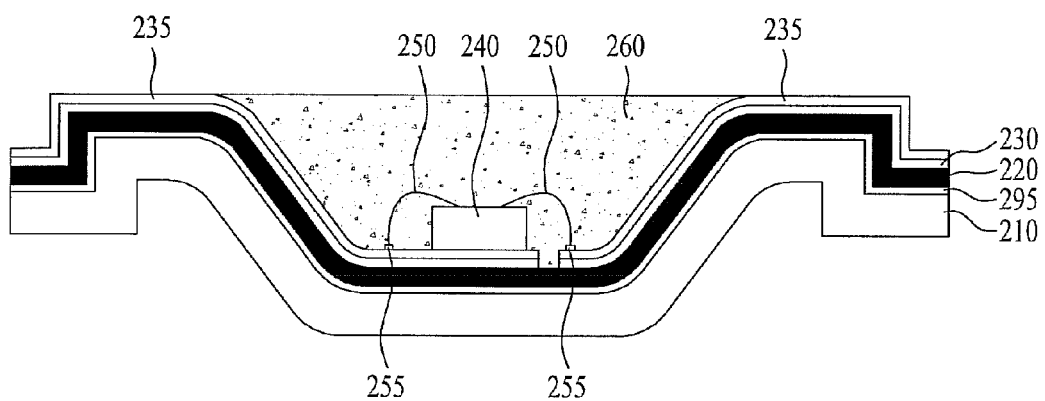
FIGS. 27 and 28 are views illustrating light emitting device modules according to thirteenth and fourteenth embodiments, respectively.
Figure 28:
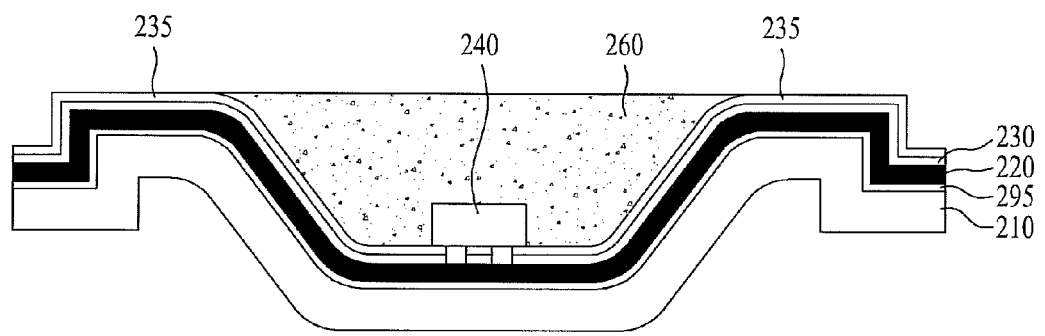

FIGS. 27 and 28 are views illustrating light emitting device modules according to thirteenth and fourteenth embodiments, respectively. The embodiment of FIG. 27 is different from the embodiment of FIG. 26F in that the light emitting device 240 is wire-bonded to the first conductive layer 230a and the second conductive layer 230b by two wires 250. On the other hand, in the embodiment of FIG. 28, the light emitting device 240 is electrically connected to the first conductive layer 230a and the second conductive layer 230b without using wire bonding. That is, in this embodiment, the light emitting device 240 is of a flip-chip type so that it may be directly bonded to the first conductive layer 230a and the second conductive layer 230b.

Figure 29:
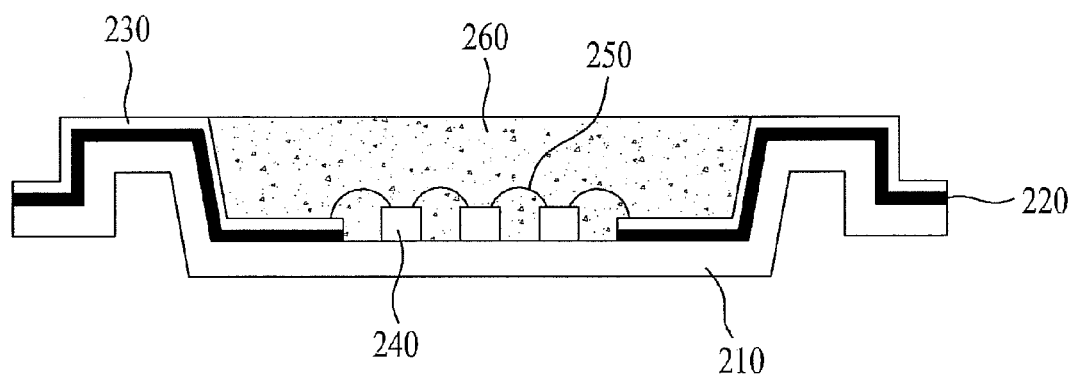
FIG. 29 is a sectional view illustrating a light emitting device module according to a fifteenth embodiment.

FIG. 29 is a sectional view illustrating a light emitting device module according to a fifteenth embodiment.

In this embodiment, a plurality of light emitting devices 240 is disposed in the cavity. The light emitting devices are wire-bonded to one another by wires 250. The light emitting devices 240 arranged at opposite side edges of the cavity are wire-bonded to the first conductive layer 230a and the second conductive layer 230b by wires 250.

Similarly to the previous embodiments, the heat transfer member may be exposed at the central region C of the cavity. As shown in FIG. 29, each light emitting device 240 directly contacts the heat transfer member 210 exposed at the bottom of the cavity. Similarly to the embodiment of FIG. 21, the heat transfer member 210, etc. are stepped at a region outside the cavity.

Figure 30:
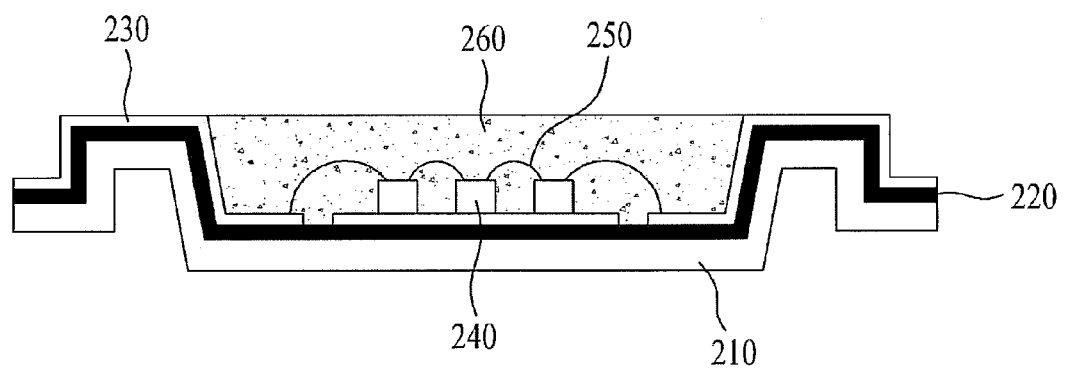
FIG. 30 is a sectional view illustrating a light emitting device module according to a sixteenth embodiment.

FIG. 30 is a sectional view illustrating a light emitting device module according to a sixteenth embodiment.

This embodiment is similar to the embodiment of FIG. 29, except that the heat transfer member 210 is not exposed at the bottom of the cavity. That is, the insulating layer 220 and the first conductive layer 230a and the second conductive layer 230b are completely disposed on the heat transfer member 210 in a region corresponding to the bottom of the cavity where the light emitting devices 240 are disposed.

In order to avoid short of current supplied to each light emitting device 240, the first conductive layer 230a and the second conductive layer 230b are removed from a region C corresponding to a portion of the bottom of the cavity. Although the insulating layer 220 has been shown as being left in the region C, as shown in FIG. 30, this insulating layer 220 may be removed to expose the heat transfer member 210, as in the previous embodiments.

Figure 31:
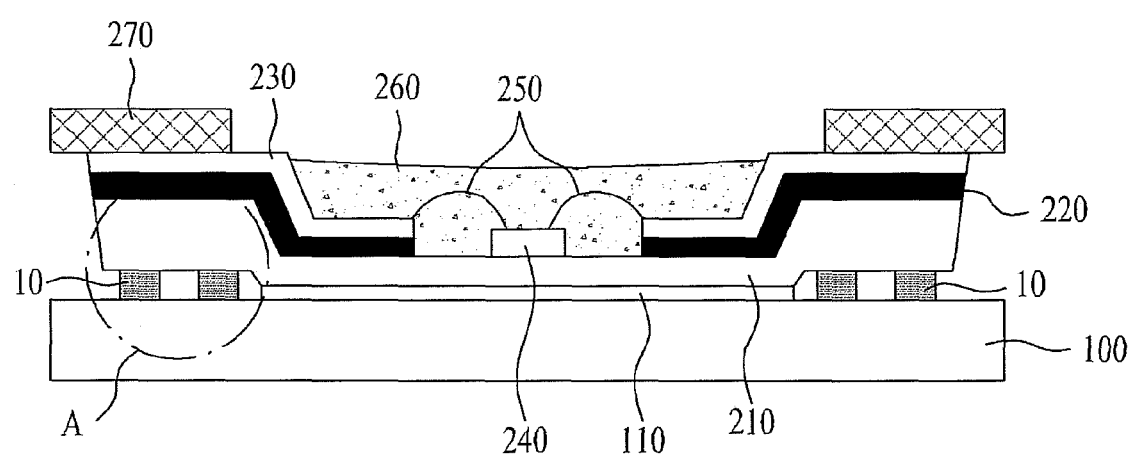
FIG. 31 is a sectional view illustrating a light emitting device module according to a seventeenth embodiment.

FIG. 31 is a sectional view illustrating a light emitting device module according to a seventeenth embodiment.

The light emitting device module according to this embodiment is similar to that of FIG. 1, except that the heat transfer member 210 has a step due to formation of a cavity, so that it is spaced apart from the substrate 100 in a region corresponding to the circuit board 270, and a support 10 is formed at the substrate 100 to withstand the weight of the circuit board 270, etc in the region.

Figure 32A:
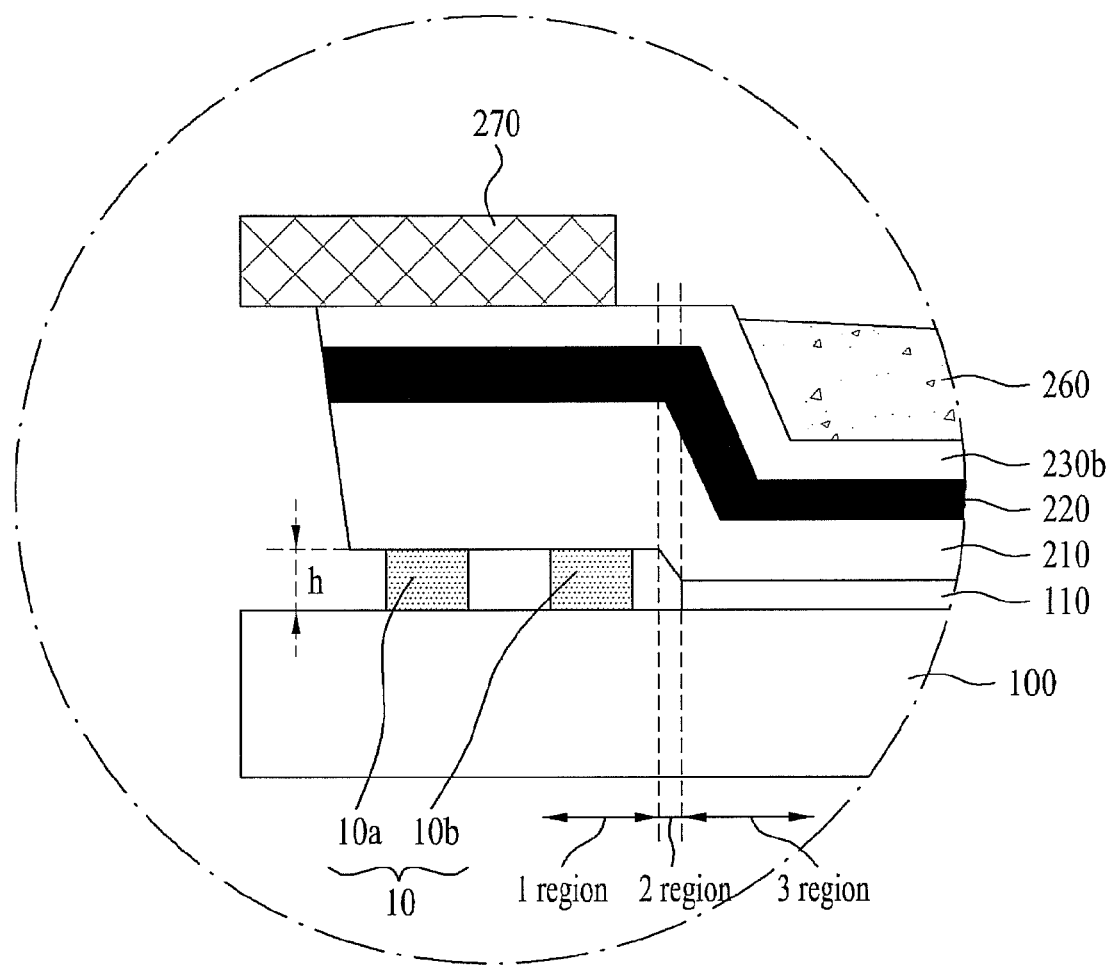
FIG. 32A is an enlarged view corresponding to a portion "F" of FIG. 31.

FIG. 32A is an enlarged view corresponding to a portion "F" of FIG. 31.

Referring to FIG. 32A, the support 10 is formed at the substrate 100 in the region corresponding to the circuit board 270 in order to support the heat transfer member 210. Practically, in one light emitting device module, supports 10 are provided in regions at opposite sides of the cavity, respectively. For simplicity of description, the following description will be given only in conjunction with the support 10 provided in the region at one side of the cavity.

The support 10 is disposed on the substrate 100 in a region where the heat transfer member 210 does not contact the substrate 100. Referring to FIG. 32A, three regions, namely, first to three regions, are defined. In the third region, the substrate 100 contacts the heat transfer member 210 via the adhesive layer 110. Accordingly, it is unnecessary to dispose the support 10 in the third region.

In the second region, the heat transfer member 210 has an inclination. This inclination is caused by the fact that the heat transfer member 210 has different heights in a region where the cavity is formed and a region where the circuit board is disposed, while extending horizontally in the regions.

In the first region, the heat transfer member 210 is spaced apart from the substrate 100 by a certain distance. To this end, in the first region, the support 10 is formed on the substrate to contact the heat transfer member 210, and thus to support the heat transfer member 210. In this case, the support member 10 receives a load applied from the circuit board 270 to the heat transfer member 210. Therefore, at least a portion of the support 10 should contact the heat transfer member 210.

In the case of FIG. 32A, the support 10 includes a first support portion 10a and a second support portion 10b. The support 10 may include at least one support portion, taking into consideration the magnitude of load and the width of the first region. The support 10 may be formed of an elastic member to withstand the above-described load. The support 10 may also be made of a heat transferable material to function as a heat transfer layer capable of transferring heat generated from the circuit board 270 to the substrate 100, which is made of a metal material. Such configurations may also be applied to the embodiments, which will be described later.

The height h of the support 10 may be equal to the sum of the height difference in the heat transfer member 210 and the height of the adhesive layer 110.

FIGS. 32B to 32G are enlarged views corresponding to the portion "A" of FIG. 21 to illustrate different embodiments from that of FIG. 32A.

Figure 32B:
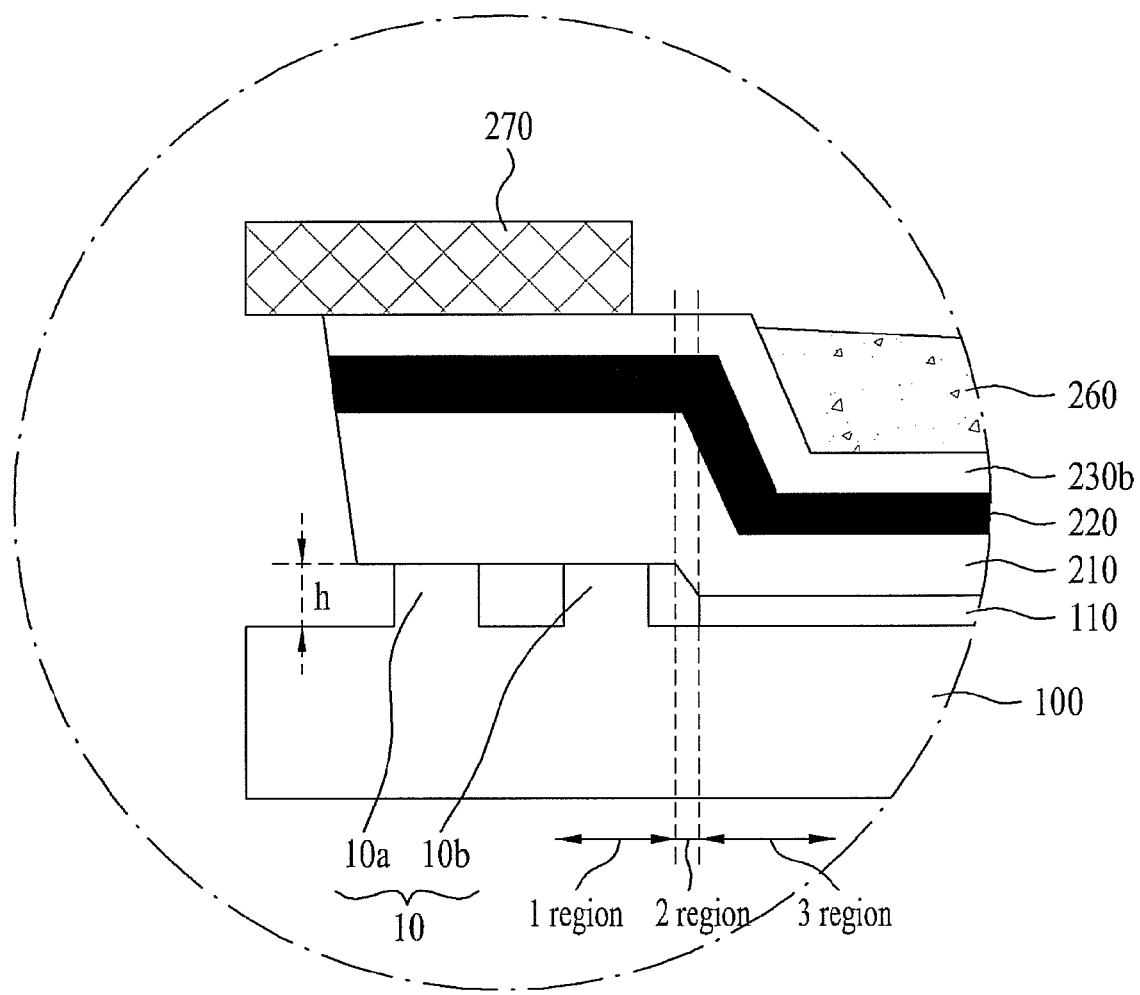

In the embodiment of FIG. 32B, the support 10 is formed in accordance with patterning of the substrate 100 in the region where the substrate 100 does not contact the heat transfer member 210, namely, the first region. That is, in this embodiment, the support 10 is made of the same material as the substrate 100. In this case, the substrate 100 is made of a metal, so that it may be possible to increase the area of the substrate 100 to absorb heat emitted from the circuit board 270.

Similarly to the previous embodiment, the support 10 may include a first support portion 10a and a second support portion 10b in this embodiment. The support 10 may include at least one support portion, taking into consideration the magnitude of load and the width of the first region.

Figure 32C:
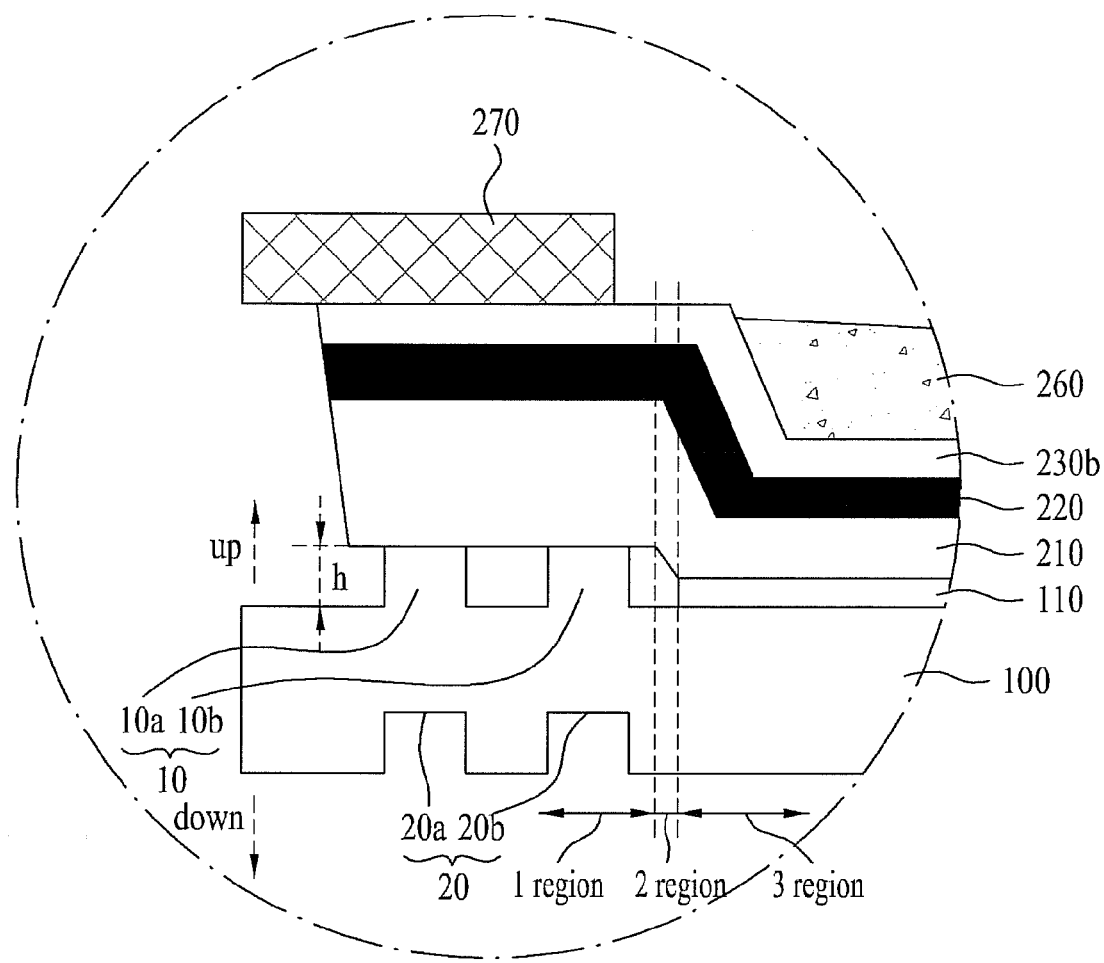

The embodiment of FIG. 32C is similar to the embodiment of FIG. 32B, except that the substrate 100 has the same pattern at the upper and lower surfaces thereof. That is, when it is assumed that the direction of the substrate 100 to face the heat transfer member 210 is a first direction of the substrate 100, and the direction opposite to the first direction is a second direction of the substrate 100, the substrate 100 has the same pattern in the first and second directions.

The embodiments of FIGS. 32B and 32C are different in terms of manufacturing processes. That is, in the case of FIG. 23B, the substrate 100 may be injection-molded to have the support 10, whereas, in the case of FIG. 32C, the substrate 100 is injection-molded without having the support 100, and then pressed to form the support 10.

Figure 32D:
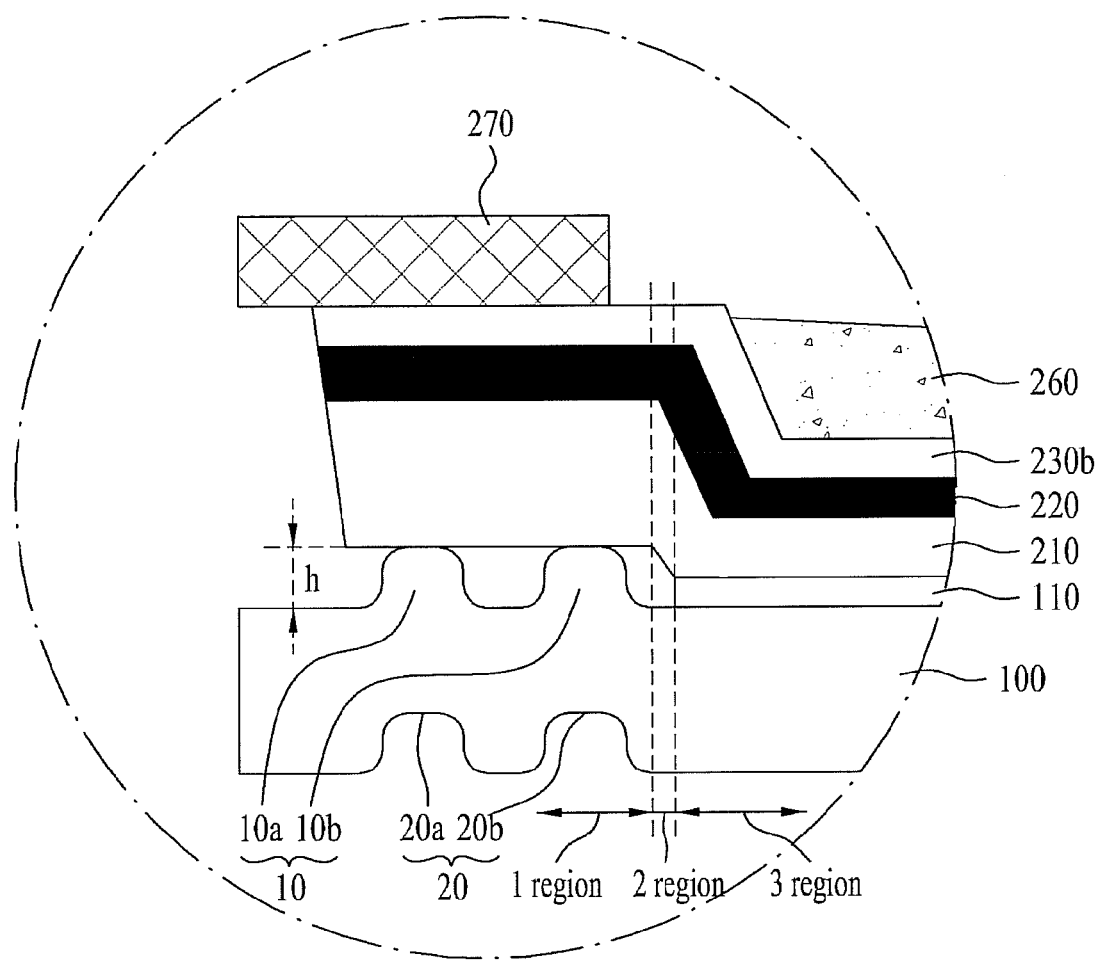

The embodiment of FIG. 32D is similar to the embodiment of FIG. 32C, except that the pattern forming the support 10 is subjected to a rounding process. That is, the support 10 has a round edge to prevent impact from being generated at a portion of the support 10 contacting the heat transfer member 210.

Figure 32F:
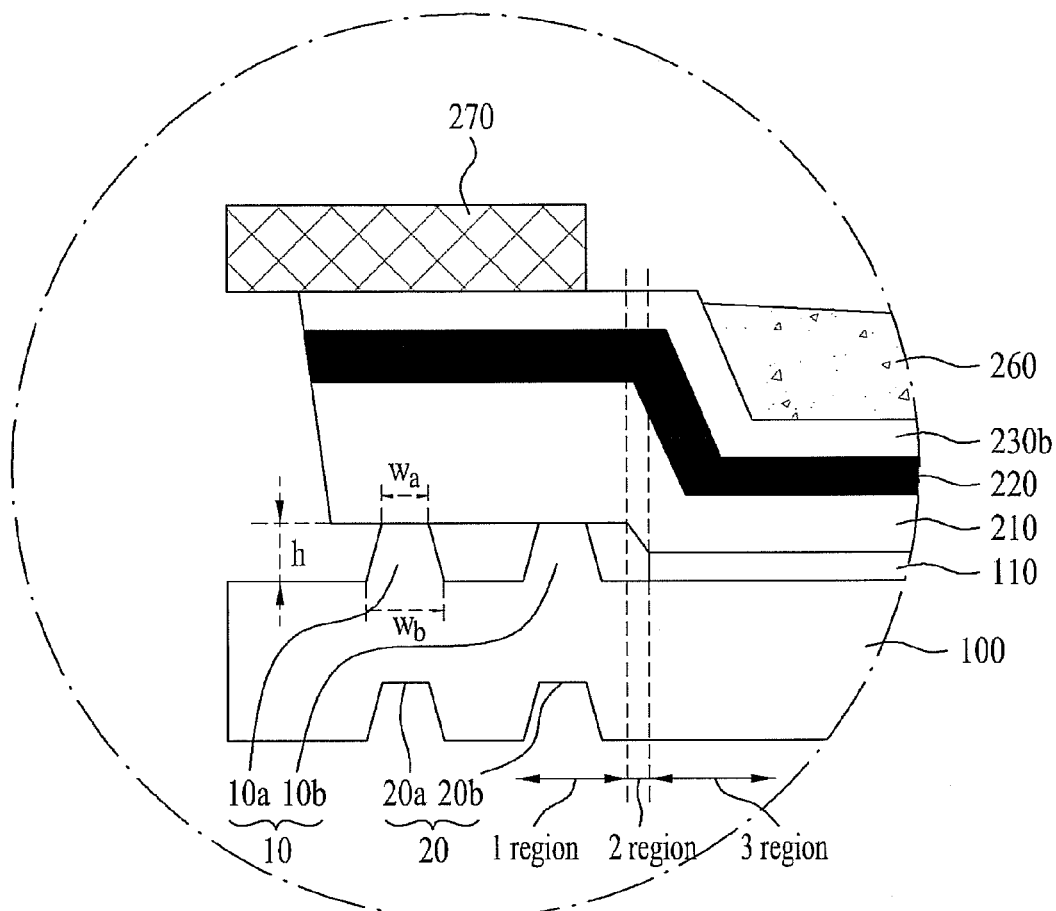
Figure 32G:
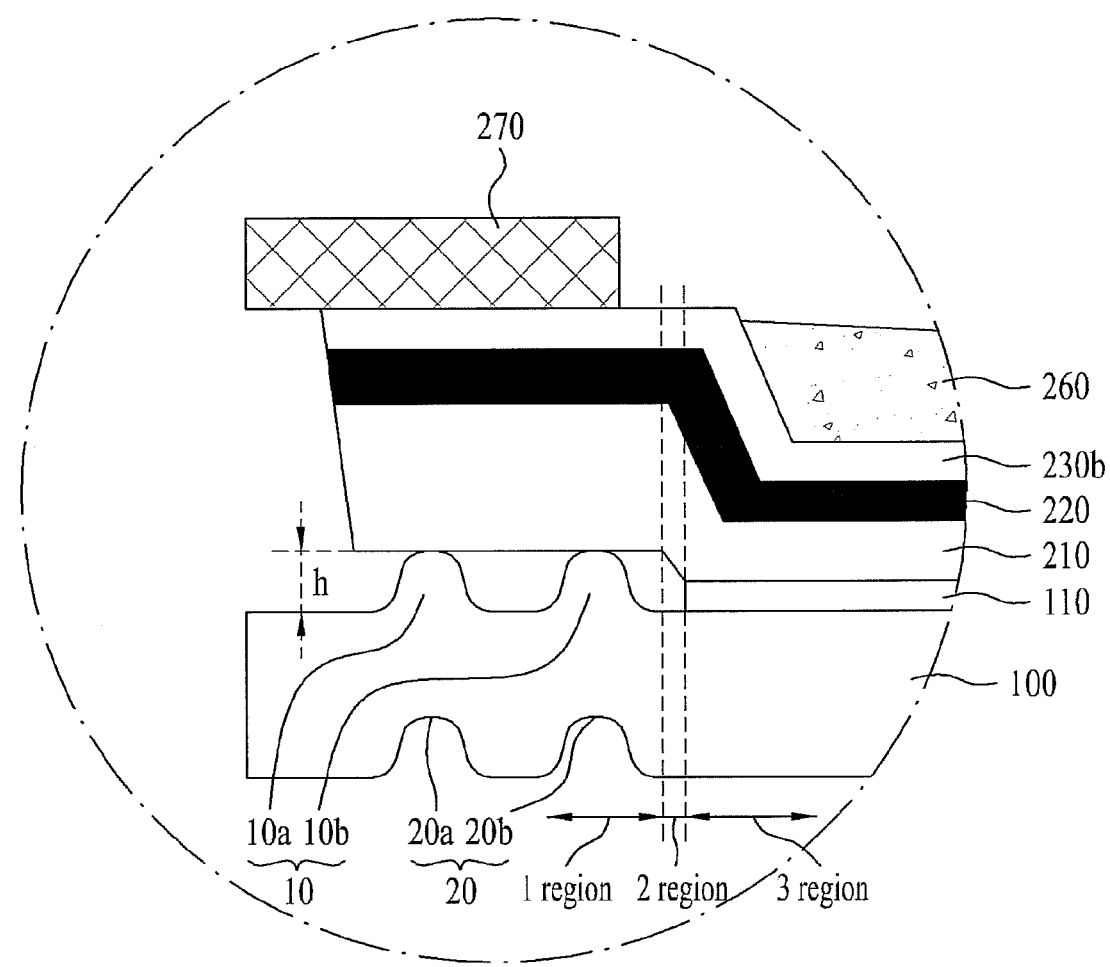

In each embodiment of FIGS. 32E to 32G, the support 10 is formed in accordance with patterning of the substrate 100. The size or area of the support 10 in the direction of the support 10 contacting the heat transfer member 210 is smaller than that of the support 10 in the direction of the support 10 contacting the substrate 100. For example, the support 10 has a shape similar to a trapezoidal shape.

In the above-described structure, the support 10, which has a trapezoidal shape, stably supports the heat transfer member 210. The support 10 may be protruded from the substrate 100, as in the structure of FIG. 32A. The support 10 may also be formed by pressing the substrate 100 after injection molding thereof to respectively form patterns at two surfaces of the substrate 100, as in the structure of FIG. 32F. Alternatively, the patterns of the substrate 100 in the structure of FIG. 32F may be subjected to a rounding process to form the structure of FIG. 32G.

FIGS. 33A to 33I are views illustrating a method for manufacturing the light emitting device module of FIG. 31 in accordance with an exemplary embodiment.

Figure 33A:
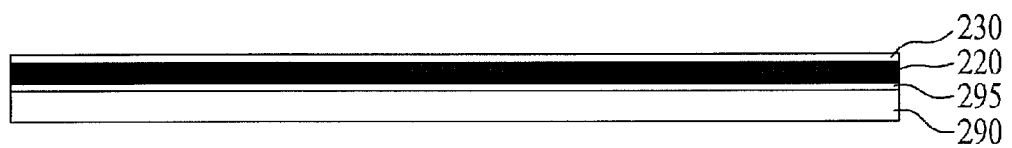
FIGS. 33A to 33I are views illustrating a method for manufacturing the light emitting device module of FIG. 31 in accordance with an exemplary embodiment.

In accordance with the illustrated method, as shown in FIG. 33A, the insulating layer 220 and a conductive layer 230 are first formed over a base substrate 290. In this case, the insulating layer 220 may be fixed to the base substrate 290 by an adhesive 295.

For the conductive layer 230, which is bonded to the insulating layer 220, a copper foil, to which a polyimide film is bonded, may be used. Since the polyimide film has a small thickness of, for example, 5 μm, it is very advantageous in terms of thermal resistance.

Figure 33B:
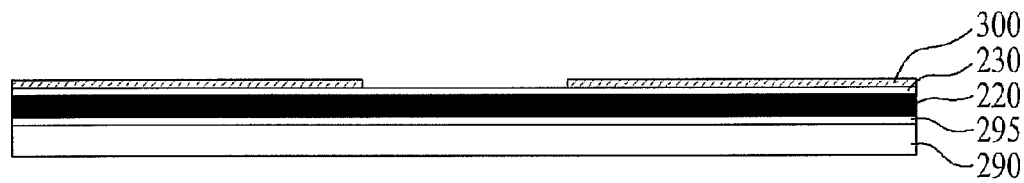

As shown in FIG. 33B, a mask 300 is selectively formed on the conductive layer 230. Using the mask 300, the conductive layer 230 and insulating layer 220 are subsequently patterned. In this case, the conductive layer 230 may be divided into two portions, namely, the first conductive layer 230a and the second conductive layer 230b.

Figure 33C:
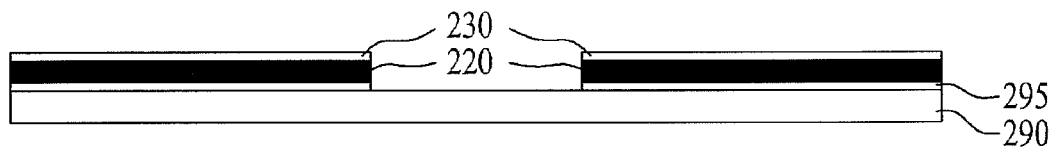

The middle region of FIG. 33C, from which the insulating layer 220, etc. are removed, corresponds to the bottom of the cavity in FIG. 31.

Figure 33D:
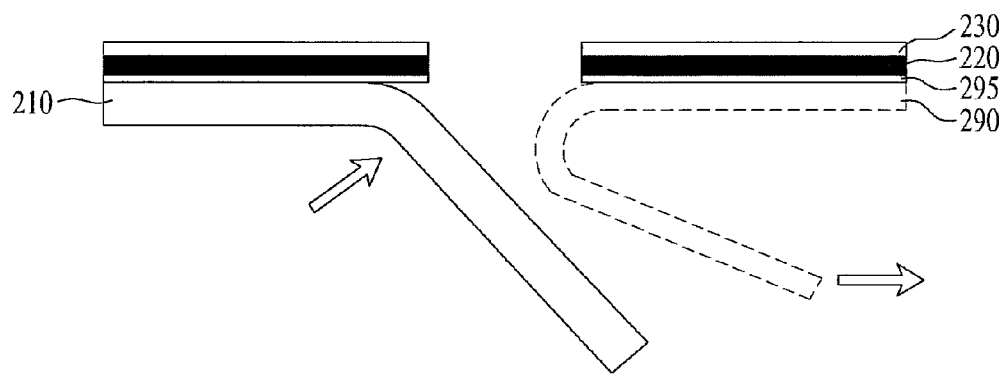

As shown in FIG. 33D, the base substrate 290 is then removed. Subsequently, the heat transfer member 210 is bonded to the insulating layer 220. In this case, the bonding may be achieved using the previously-coated adhesive 295 or an additional adhesive 295. The base substrate 290 is removed after functioning as a stiffener in the manufacturing procedure.

In this case, the insulating layer 220 and adhesive 295 form two layers between the heat transfer member 210 and each of the first and second conductive layers 230a and 230b. Since the polyimide of the insulating layer 220 function as an electrical insulator, and the adhesive 295 performs a bonding function, an optimal structure capable of achieving an improvement in heat transfer characteristics may be obtained.

Since the heat transfer member 210, which has a metal structure thicker than the copper foil, supports the light emitting device 240, it may be possible to achieve a remarkable enhancement in reliability. It is also unnecessary to achieve an increase in stiffness using a transparent resin. Accordingly, the material of the resin layer may be selected from more various materials, and thus, cost reduction may be achieved.

Furthermore, it may be possible to achieve a great enhancement in heat dissipation characteristics in accordance with a combination of the insulating layer 220 and adhesive 295. For example, when only the insulating layer 220, which is made of polyimide, is applied between each of the first conductive layer 230a and the second conductive layer 230b, which is made of a copper foil having a thickness of, for example, 18 μm, and the heat transfer member 210, which is made of a copper foil having a thickness of 125 μm, the insulating layer 220 is required to have a thickness of, for example, 20 to 30 μm, when tolerance and bonding force are taken into consideration.

However, when the insulating layer 220 is applied along with the adhesive 295, it may be possible to reduce the thickness of the polyimide insulating layer 220. This may be achieved by thinly coating polyimide over the conductive layer 230 made of a copper foil, to form the insulating layer 220. Thus, the thickness of the polyimide insulating layer 220 may be reduced to 5 μm. Since the thin polyimide insulating layer 220, which has a thickness of 5 μm, provides insulation characteristics, the adhesive 295 may achieve an enhancement in thermal conductivity.

Figure 33E:
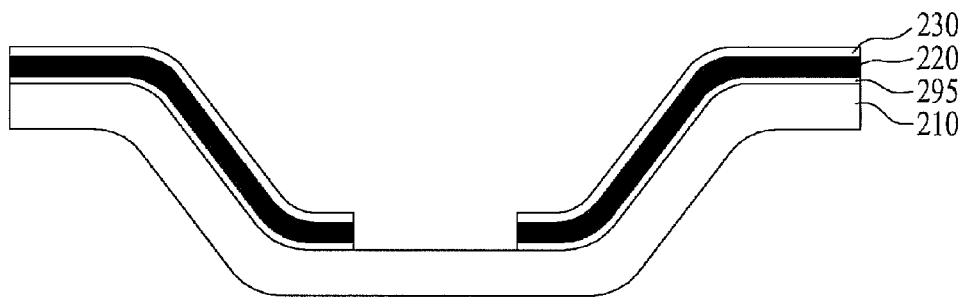

Thereafter, a pressure is applied to the edges of the heat transfer member 210 to form a step at the heat transfer member 210, as shown in FIG. 33E. At this time, the insulating layer 220 and the first conductive layer 230a and the second conductive layer 230b are also stepped in the same manner as the heat transfer member 210.

The above-described step may be formed using a method for pressing the heat transfer member 210 or the like. The step may be formed as the heat transfer member 210 is bent in a vertical direction or in a streamlined shape.

Thereafter, a pressure is applied to the heat transfer member 210 to bend the heat transfer member 210, and thus to form the cavity. At this time, the insulating layer 220 and the first conductive layer 230a and the second conductive layer 230b are also bent. The cavity may have a shape in which the edges of the cavity have a curved shape or a shape in which the edges of the cavity have a point of inflection, as shown in FIG. 31.

The support, which will be described later, may have a height varying in accordance with the bending degree of the heat transfer member 210.

Figure 33F:
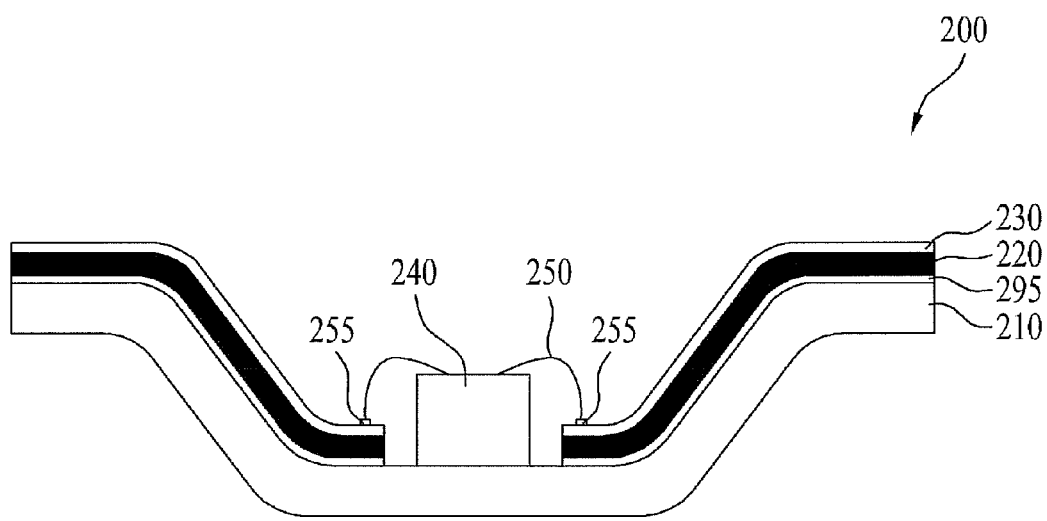

Subsequently, the light emitting device 240 is mounted on the bottom of the cavity, as shown in FIG. 33F. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255.

Figure 33G:
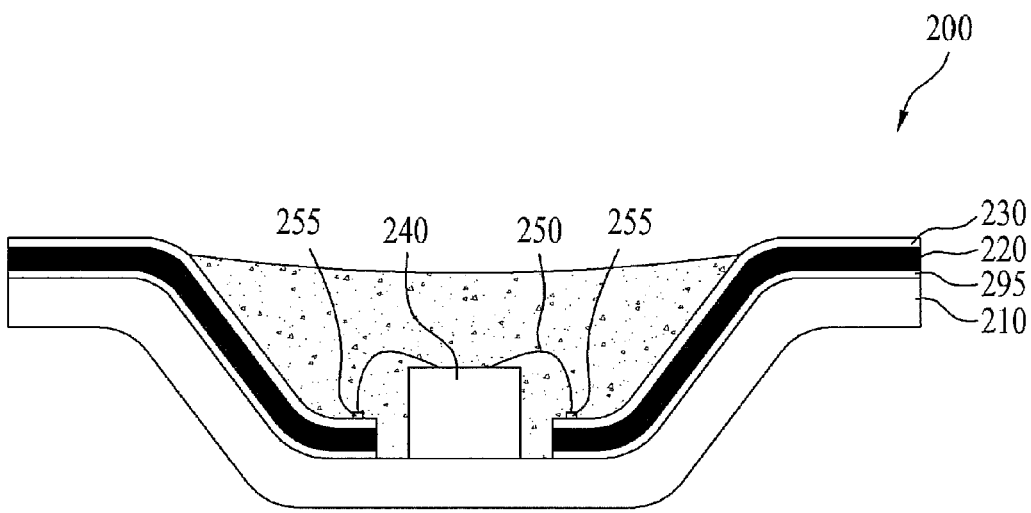

Thereafter, a resin layer 260 fills the cavity to protect the light emitting device 240 and wires 250, as shown in FIG. 33G. A fluorescent substance is contained in the resin layer 260. Accordingly, it may be possible to vary the wavelength of light emitted from the light emitting device 240.

Figure 33H:
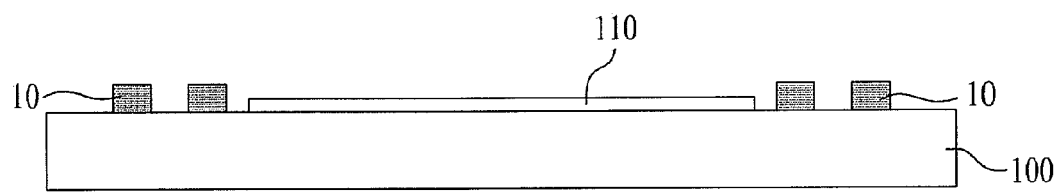

Subsequently, the support 10 is prepared to be provided at the substrate 100, as shown in FIG. 33H. The support 10 may be prepared in the form of a separate member made of a material different from that of the substrate 100, as in this embodiment, or in the form of a structure integral with the substrate 100, as in other embodiments. An adhesive layer 110 is formed on the substrate 100 to bond the support 10 to the substrate 100.

Figure 33I:
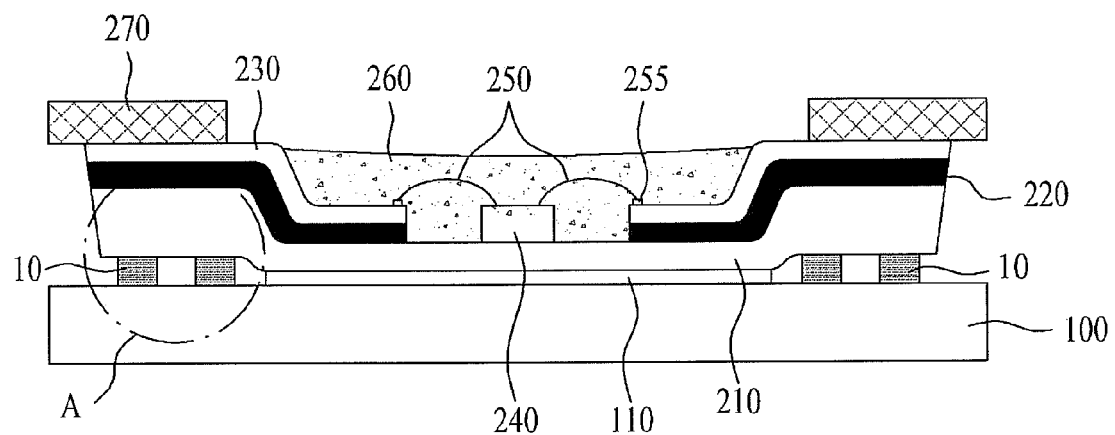

As shown in FIG. 33I, the heat transfer member 210 is boned to the substrate 100 by the adhesive layer 110 while coming into contact with the substrate 100 via the support 10. The shape in a portion "F" of FIG. 33I has been described with reference to FIG. 32A, etc.

FIGS. 34A to 34G are views illustrating a method for manufacturing the light emitting device module of FIG. 31 according to another embodiment.

In this embodiment, the base substrate 290 is not used, different form the embodiment of FIG. 33A, etc. Also, the insulating layer 220 may be fixed to the heat transfer member 210 without using the adhesive 295. In this case, a material having a bonding property such as polyimide may be used for the insulating layer 220. In other embodiments, the adhesive 295 may be dispensed with.

Figure 34A:
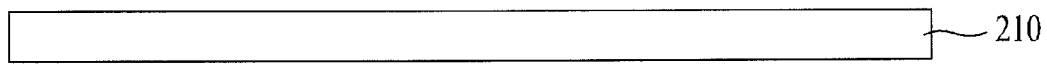
FIGS. 34A to 34G are views illustrating a method for manufacturing the light emitting device module of FIG. 31 according to another embodiment.

First, the heat transfer member 210 is prepared, as shown in FIG. 34A. The heat transfer member 210 may be made of a material having excellent thermal conductivity. For example, copper (Cu) or aluminum (Al) may be used for the material of the heat transfer member 210.

Figure 34B:
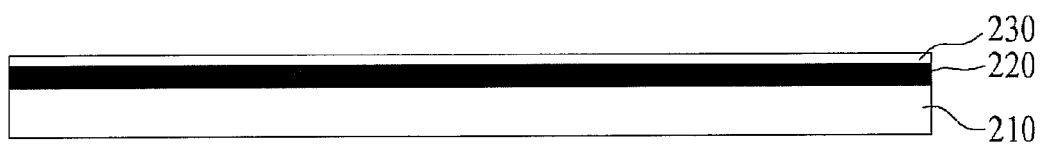

As shown in FIG. 34B, the insulating layer 220 and the conductive layer 230 are fixed on the heat transfer member 210 by the adhesive 295.

Figure 34C:
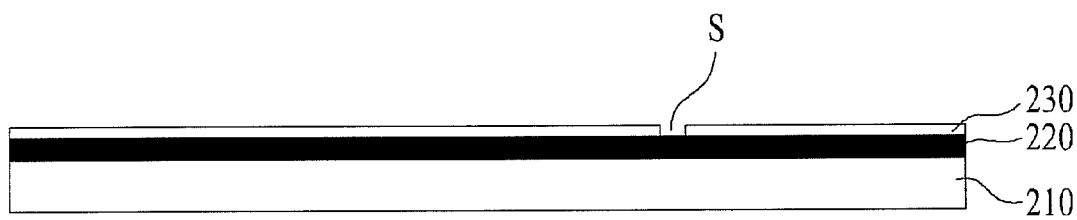

The conductive layer 230 is then patterned as shown in FIG. 34C. In this case, the conductive layer 230 is partially removed to partially expose the insulating layer 220. The conductive layer 230 is divided into first conductive layer 230a and the second conductive layer 230b by the region S where the insulating layer is exposed.

The process of partially removing the conductive layer 230 may be achieved using a mask, which is coated, as shown in FIG. 34B, etc., to selectively remove a portion of the conductive layer 230. Although opposite ends of the conductive layer 230 are not removed, namely, portions of the insulating layer 220 corresponding to the opposite ends are not exposed, in the illustrated embodiment, an open region, through which the insulating layer 220 is exposed, may be formed around the cavity, as shown in FIG. 34C, etc.

Figure 34D:
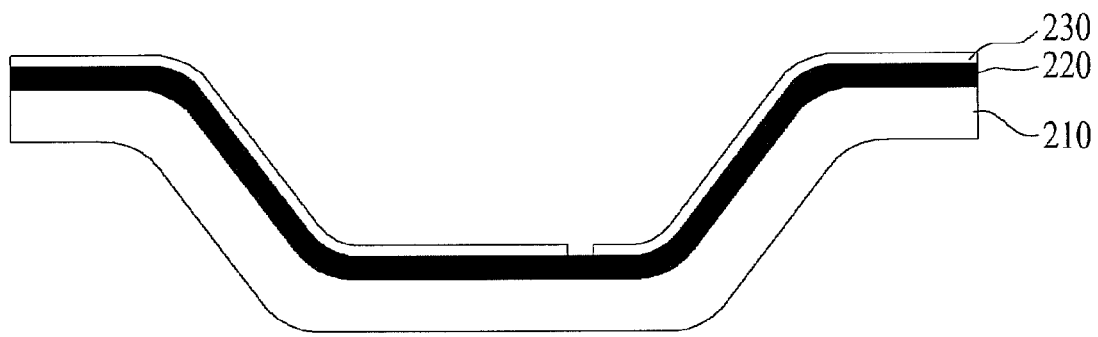

Thereafter, a pressure is applied to the heat transfer member 210 to bend the heat transfer member 210, and thus to define the cavity, as shown in FIG. 34D. At this time, the insulating layer 220 and the first conductive layer 230a and the second conductive layer 230b are also bent. The cavity may be formed to have a shape in which the edges of the cavity have a curved shape, or a shape in which the edges of the cavity have a point of inflection, as shown in FIG. 34D.

Figure 34E:
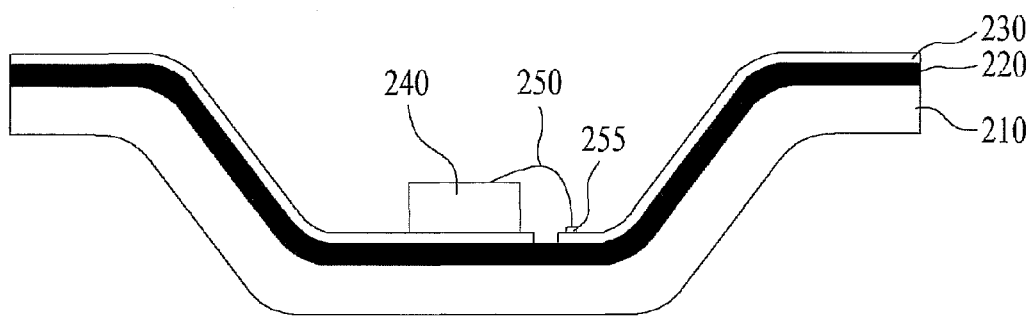

The reflective layer 235 is then formed over the first conductive layer 230a and the second conductive layer 230b, as shown in FIG. 34E. The reflective layer 235 may be made of a material capable of reflecting light emitted from the light emitting device 240 in order to send the reflected light to an outside of the cavity. A silver (Ag) may be coated over the reflective layer 235.

Figure 34F:
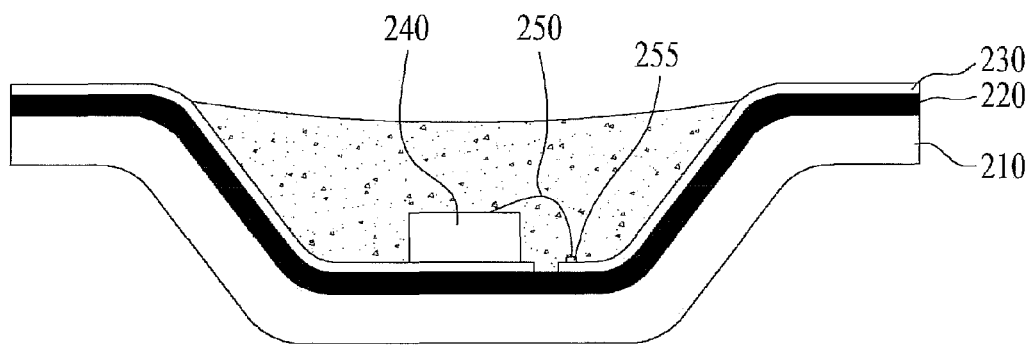

The light emitting device 240 is then disposed in the cavity of the heat transfer member 210. Thus, a light emitting device module as shown in FIG. 34F is completely obtained.

Figure 34G:
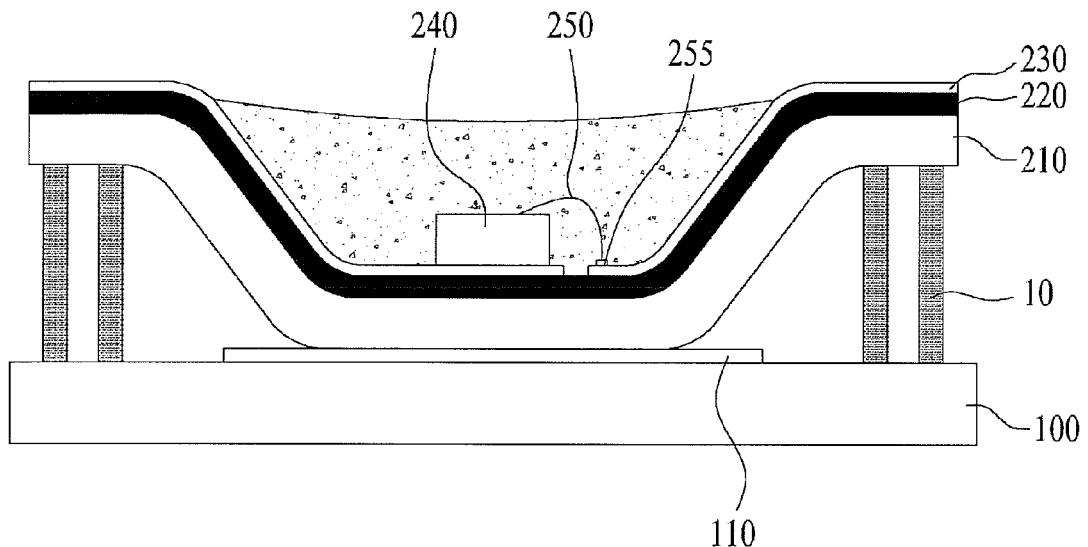

When the heat transfer member 210 of the light emitting device module is bonded to the substrate 100 by the adhesive layer 110, a light emitting device module as shown in FIG. 34G is completely obtained. Since it is unnecessary to form a package body using a polyphthalamide (PPA) resin, the effect of transferring heat emitted from the light emitting device 240 to the heat transfer member 210 is great.

In this case, the supports 10 are formed on the substrate 100 outside the cavity to support the load applied to the heat transfer member 210. As described above, circuit boards (not shown) may be arranged on the first conductive layer 230a and the second conductive layer 230b corresponding to the supports 10, respectively.

Figure 35:
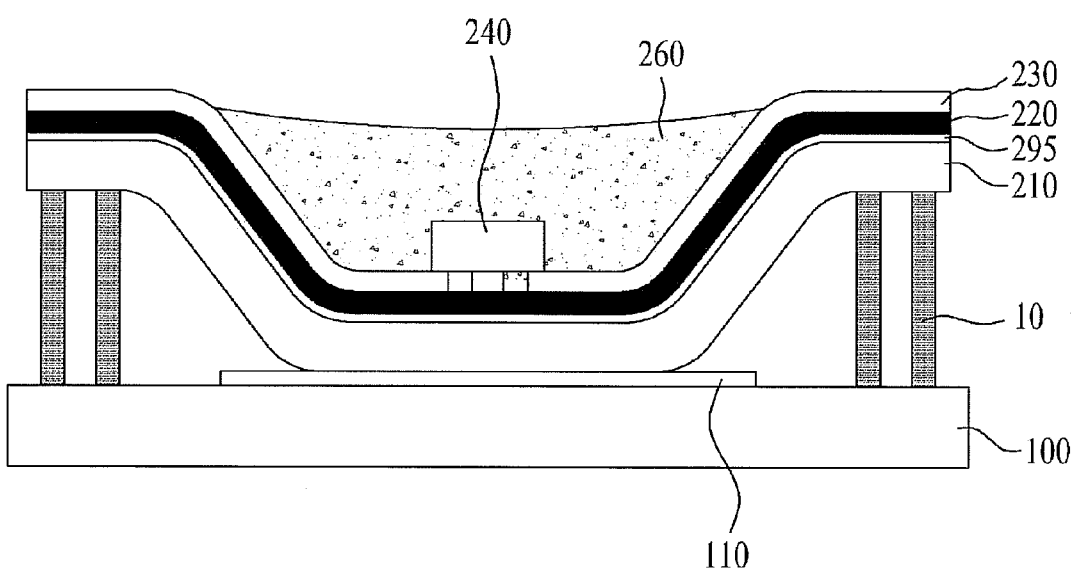
FIG. 35 is a sectional view illustrating a light emitting device module according to an eighteenth embodiment.

In a light emitting device module according to an eighteenth embodiment of FIG. 35, the light emitting device 240 is electrically connected to the first conductive layer 230a and the second conductive layer 230b without using wire bonding. That is, in this embodiment, the light emitting device 240 is of a flip-chip type so that it may be directly bonded to the first conductive layer 230a and the second conductive layer 230b.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member. Each of the separated light emitting device modules is then bonded to the bracket. Alternatively, the separation into the individual light emitting device modules may be achieved after the bonding of the heat transfer member to the bracket.

FIG. 36 shows cross-sectional views respectively taken in directions corresponding to a longer axis and a shorter axis in the light emitting device module of FIG. 31. FIG. 36 omits illustration of the light emitting device, etc.

FIG. 36(B-B'), which is a cross-sectional view taken in the longer axis direction of the light emitting device module, shows exposure of the heat transfer member 210 in a central portion of the cavity. However, in FIG. 36(C-C'), which is a cross-sectional view taken in the shorter axis direction of the light emitting device module, the heat transfer member 210 is not exposed at the bottom of the cavity. That is, the heat transfer member 210 is exposed in a short-axis direction within the cavity.

Referring to FIG. 36(B-B'), the supports 10 are formed between the substrate 100 and the heat transfer member 210 to support the weights of the circuit boards 270, respectively. At the regions shown in FIG. 36(C-C'), however, the circuit boards 270 are not disposed, so that the supports 10 may not be provided at the regions.

FIG. 37 is a sectional view illustrating a light emitting device module according to a nineteenth embodiment.

In this embodiment, a plurality of light emitting devices 240 is disposed in the cavity. The light emitting devices are wire-bonded to one another by wires 250. The light emitting devices 240 arranged at opposite side edges of the cavity are wire-bonded to the first conductive layer 230a and the second conductive layer 230b by wires 250.

Similarly to the previous embodiments, the heat transfer member may be exposed at the central region C of the cavity. Each light emitting device 240 directly contacts the heat transfer member 210 exposed at the bottom of the cavity.

Circuit boards (not shown) may be disposed on the first conductive layer 230a and the second conductive layer 230b in regions outside the cavity, respectively. Supports 10 are disposed on the substrate 100 beneath the regions outside the cavity, respectively, to support the heat transfer member 210.

Figure 38:
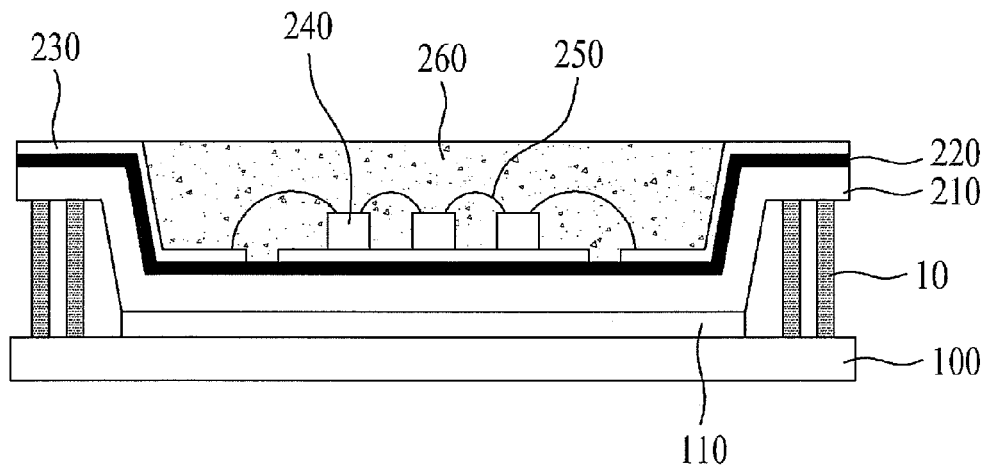
FIG. 38 is a sectional view illustrating a light emitting device module according to a twentieth embodiment.

FIG. 38 is a sectional view illustrating a light emitting device module according to a twentieth embodiment.

This embodiment is similar to the embodiment of FIG. 37, except that the heat transfer member 210 is not exposed at the bottom of the cavity. That is, the insulating layer 220 and the first conductive layer 230a and the second conductive layer 230b are completely disposed on the heat transfer member 210 in a region corresponding to the bottom of the cavity where the light emitting devices 240 are disposed.

In order to avoid short of current supplied to each light emitting device 240, the first conductive layer 230a and the second conductive layer 230b are removed from a region C corresponding to a portion of the bottom of the cavity. Circuit boards (not shown) may be disposed on the first conductive layer 230a and the second conductive layer 230b in regions outside the cavity, respectively. Supports 10 are disposed on the substrate 100 beneath the regions outside the cavity, respectively, to support the heat transfer member 210.

Figure 39:
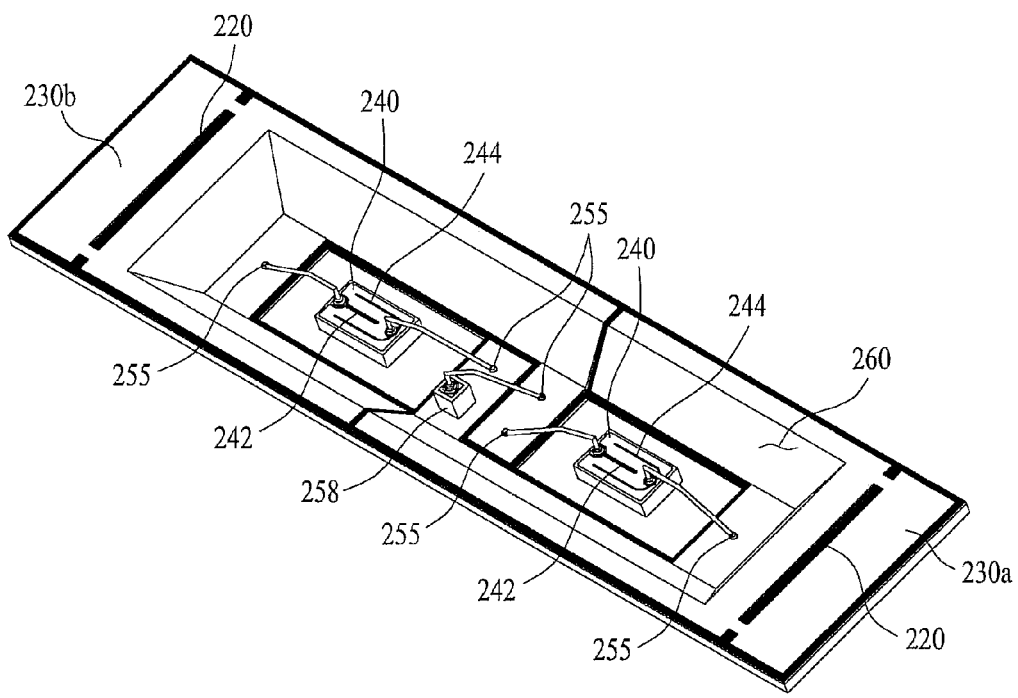
FIG. 39 is a perspective view illustrating a light emitting device module according to a twenty-first embodiment.

FIG. 39 is a perspective view illustrating a light emitting device module according to a twenty-first embodiment.

In this embodiment, two light emitting devices 240 are disposed in the cavity. Wires are connected to two electrode pads 242 and 244 provided at each light emitting device 240, respectively. The two light emitting devices 240 are connected to the first conductive layer 230a and the second conductive layer 230b by wires, respectively. The light emitting devices 240 are electrically connected to each other via a third conductive layer 258, which is of an island type.

Electrode pads 255 are formed at each of the first conductive layer 230a and the second conductive layer 230b connected to respective light emitting devices 240 by wires. A resin layer 260 fills the cavity to protect the light emitting devices 240 and wires.

Similarly to the above-described embodiments, each of the first conductive layer 230a and the second conductive layer 230b is partially patterned in a region between the cavity and an external circuit board (not shown) to expose a portion of the insulating layer 220 in this embodiment.

FIG. 39 is a plan view corresponding to FIG. 39.

FIG. 40 illustrates in detail the relations of the layers in the light emitting device module. The heat transfer member 210 defines the cavity by a portion thereof. The cavity is indicated by a solid line.

The first conductive layer 230a and the second conductive layer 230b are disposed on the heat transfer member 210 via the insulating layer 220, and are electrically isolated from each other. The insulating layer 220 is disposed in a region where the first conductive layer 230a and the second conductive layer 230b are separated from each other. Thus, the insulating layer 220 prevents the first conductive layer 230a and the second conductive layer 230b from being electrically connected.

In the region where the first conductive layer 230a and the second conductive layer 230b are separated from each other, the heat transfer member 210 and insulating layer 220 are exposed. The light emitting devices 240 are disposed in the exposed region. Although the exposed region does not correspond to the cavity, the portions thereof where respective light emitting devices 240 are disposed overlap with the cavity. The light emitting devices 240 may be electrically connected to the first conductive layer 230a and the second conductive layer 230b, respectively.

That is, in FIG. 40, the cavity corresponds to a region including the bottom and side wall indicated by solid lines, whereas the exposed region of the heat transfer member 210 corresponds to a region where the first conductive layer 230a and the second conductive layer 230b and insulating layer 220 are not shown.

The insulating layer 220 is exposed in the exposed region of the heat transfer member 210 and boundary regions of the first conductive layer 230a and the second conductive layer 230b. The regions where the insulating layer 220 is exposed are distributed the bottom and side wall of the cavity and the regions outside the cavity.

The insulating layer 220 is made of an insulating material such as polyimide. The exposed insulating layer 220 may be spaced apart from the light emitting device 240 by at least 100 µm in order to prevent light emitted from the light emitting device 240 from being absorbed into the insulating layer 220, and thus to prevent degradation of optical efficiency.

In this embodiment, the insulating layer 220 is exposed in the form of line patterns in regions outside the cavity at opposite sides of the cavity. Circuit boards may be disposed outside the exposed linear portions of the insulating layer 220, respectively.

That is, at least one of the first conductive layer 230a and the second conductive layer 230b extends from an edge of the cavity in a longer-axis direction (a lateral direction in FIG. 40) to a side wall of the cavity in the longer-axis direction and then to a portion of the bottom of the cavity adjacent to the longer-axis side wall.

Also, the insulating layer 220 extends from the longer-axis edge of the cavity to the longer-axis side wall of the cavity and then to a portion of the bottom of the cavity adjacent to the longer-axis side wall. The insulating 220 may be exposed between each of the portions of the first conductive layer 230a and the second conductive layer 230b disposed on the bottom of the cavity and the heat transfer member 210. In FIG. 40, the distance "a" represents the distance between the light emitting device, for example, LED1, and the portion of the insulating layer 220 exposed between each of the portions of the first conductive layer 230a and the second conductive layer 230b disposed on the bottom of the cavity and the heat transfer member 210. The distance "a" may be 400 to 500 µm.

In this embodiment, two light emitting devices LED1 and LED2 are disposed in the cavity. When it is assumed that, in FIG. 40, the lateral width of the bottom of the cavity is "w", the light emitting device LED1 is arranged at a position spaced apart from a left side wall of the cavity by a distance of w/4, whereas the light emitting device LED2 is arranged at a position spaced apart from the left side wall of the cavity by a distance of 3w/4. If it is assumed that n light emitting devices LED1 to LEDn are disposed on the bottom of the cavity, the n light emitting devices LED1 to LEDn may be arranged at positions spaced apart from the left side wall of the cavity by distances of w/2n, 3w/2n, . . . , and (2n−1)w/2n, respectively.

In FIG. 40, the distance "b" represents the distance between the light emitting device, for example, LED2, and the portion of the insulating layer 220 exposed between each of the portions of the first conductive layer 230a and the second conductive layer 230b disposed outside the cavity and the heat transfer member 210.

The light emitting device, for example, LED1, may be arranged at a central portion of the bottom of the cavity when viewed in a vertical direction in FIG. 40. In FIG. 40, the distance between the light emitting device LED1 and one longitudinal wall of the cavity, for example, an upper longitudinal wall of the cavity, is equal to the distance between the light emitting device LED1 and the other longitudinal wall of the cavity, for example, a lower longitudinal wall of the cavity.

The distance "b" may be 150 to 250 µm. When the distances "a" and "b" are increased, it may be possible to reduce the amount of light absorbed into the insulating layer 220 after being emitted from the light emitting device. In this case, however, an increase in the cost of materials used in wire boding and a difficulty in processes may occur.

As shown in FIG. 40, each of the first conductive layer 230a and the second conductive layer 230b extend partially from the shorter-axis edge of the cavity to the shorter-axis side wall of the cavity and then to a portion of the bottom of the cavity adjacent to the shorter-axis side wall. The first conductive layer 230a and the second conductive layer 230b are also disposed between the two light emitting devices 240.

Figure 44:
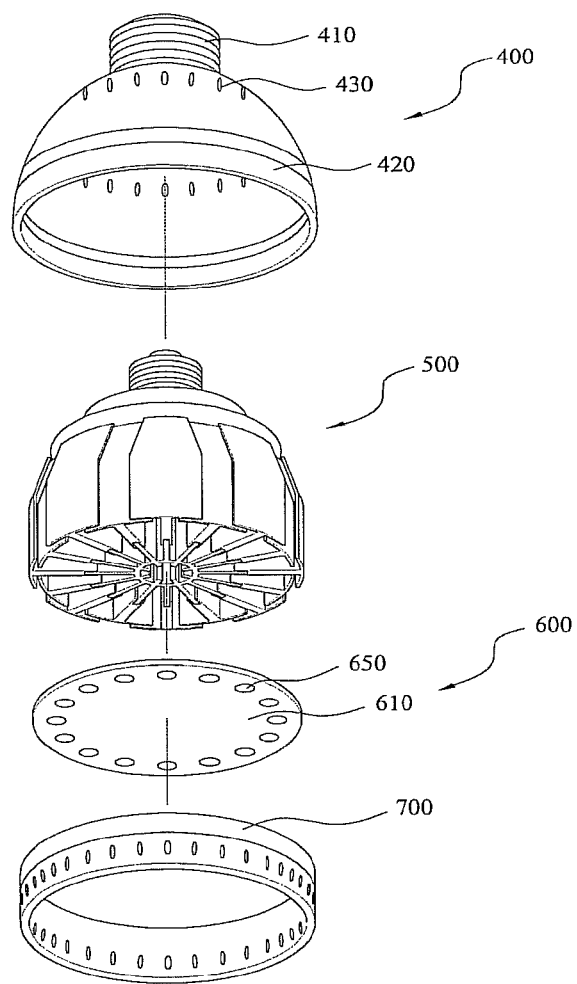
FIG. 44 is an exploded perspective view illustrating a lighting apparatus including the light emitting device module according to one of the above-described embodiments.

Here, the shorter-axis direction corresponds to a vertical direction in FIG. 44. The first conductive layer 230a and the second conductive layer 230b disposed on the bottom of the cavity between the two light emitting devices 240 extend in parallel.

The insulating layer 220 is exposed between the portions of the first conductive layer 230a and the second conductive layer 230b disposed on the bottom of the cavity between the light emitting devices 240, thereby electrically isolating the first conductive layer 230a and the second conductive layer 230b from each other. As shown in FIG. 40, the light emitting devices 240 are electrically connected to respective portions of the first conductive layer 230a and the second conductive layer 230b disposed on the bottom of the cavity between the light emitting devices 240.

In this embodiment, the exposed portion of the heat transfer member 210 at the bottom of the cavity may be 35 to 50% of the exposed region of the cavity. The exposed portion of the heat transfer member 210 at the side wall of the cavity may be 45 to 65% of the exposed region of the cavity. The portion of the heat transfer member 210 disposed outside the cavity may be 10% or less of the entirety of the region where the heat transfer member 210 is exposed.

A portion of the insulating layer 220 is disposed at the edge of the region where the heat transfer member 210 is exposed. Accordingly, it may be possible to reduce absorption of light emitted from the light emitting devices, and to appropriately achieve wire bonding of the light emitting devices.

FIGS. 41A to 41F are views illustrating a method for manufacturing the light emitting device module of FIG. 39 in accordance with an exemplary embodiment.

In accordance with the illustrated method, as shown in FIG. 41A, the insulating layer 220 is first formed over a base substrate 290. In this case, the insulating layer 220 may be fixed to the base substrate 290 by an adhesive 295.

A polyimide film is formed on the insulating layer 220 to a thickness of, for example, 5 μm. Accordingly, it is very advantageous in terms of thermal resistance. As shown in a lower portion of FIG. 41A, the insulating layer 220 is patterned to have two open regions.

The patterning of the insulating layer 220 may be carried out before or after the bonding of the insulating layer 220 to the base substrate 290.

Figure 41B:
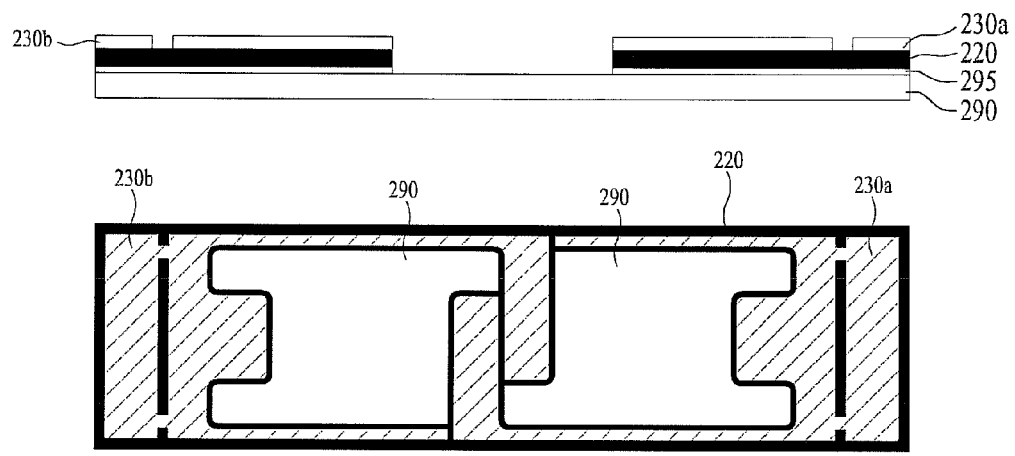

Thereafter, the first conductive layer 230a and the second conductive layer 230b are disposed on the insulating layer 220, as shown in FIG. 41B. The first and second layers 230a and 230b has been patterned to be electrically isolated from each other. The insulating layer 220 is exposed in a region where the first and second layers 230a and 230b are electrically isolated.

Figure 41C:
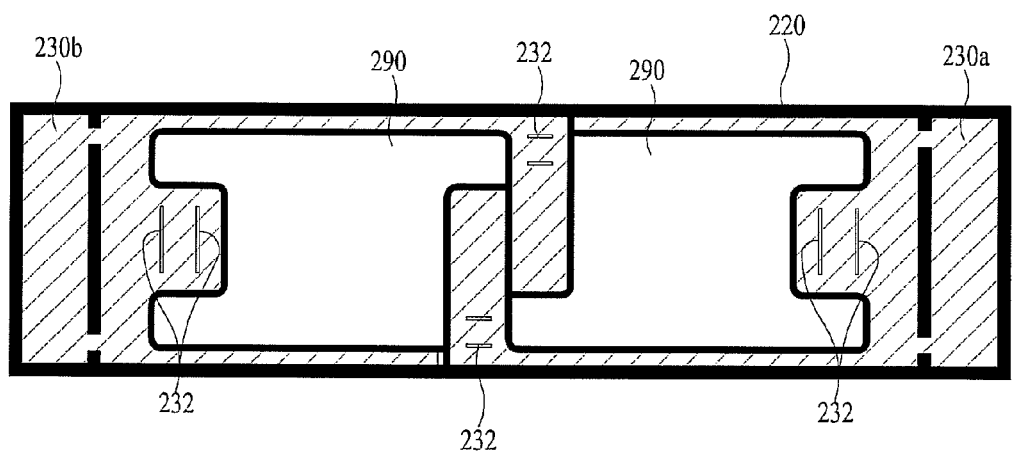

Subsequently, the first conductive layer 230a and the second conductive layer 230b are partially cut out to form cut-out portions 232, as shown in FIG. 41C. Each cut-out portion 232 may be formed at a boundary region of the side wall of the cavity or a boundary region between the side wall of the cavity and the region outside the cavity. In accordance with this structure, when the heat transfer member 210 is bent or curved, the first conductive layer 230a and the second conductive layer 230b may closely contact the bent or curved portions of the heat transfer member 210.

Figure 41D:
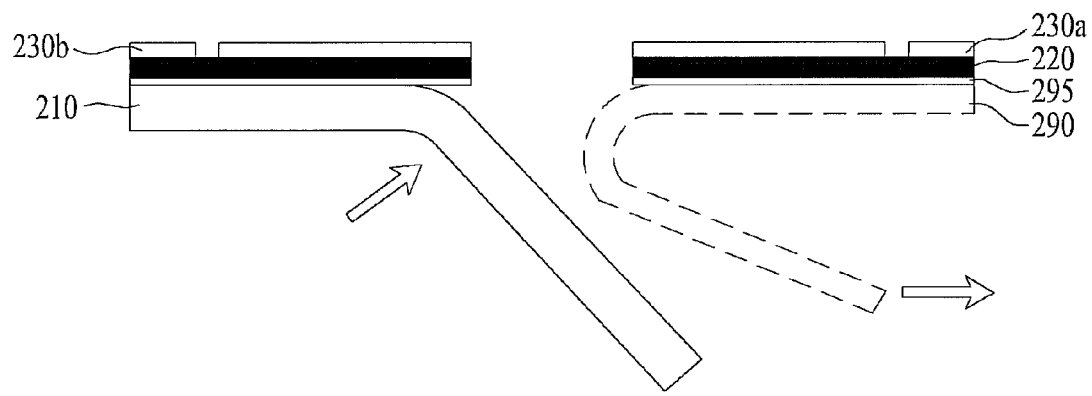

As shown in FIG. 41D, the base substrate 290 is then removed. Subsequently, the heat transfer member 210 is bonded to the insulating layer 220. In this case, the bonding may be achieved using the previously-coated adhesive 295 or an additional adhesive 295. The base substrate 290 is removed after functioning as a stiffener in the manufacturing procedure.

In this case, the insulating layer 220 and adhesive 295 form two layers between the heat transfer member 210 and each of the first and second conductive layers 230a and 230b. Since the polyimide of the insulating layer 220 function as an electrical insulator, and the adhesive 295 performs a bonding function, an optimal structure capable of achieving an improvement in heat transfer characteristics may be obtained.

Since the heat transfer member 210, which has a metal structure thicker than the copper foil, supports the light emitting device 240, it may be possible to achieve a remarkable enhancement in reliability. It is also unnecessary to achieve an increase in stiffness using a transparent resin. Accordingly, the material of the resin layer may be selected from more various materials, and thus, cost reduction may be achieved.

Furthermore, it may be possible to achieve a great enhancement in heat dissipation characteristics in accordance with a combination of the insulating layer 220 and adhesive 295. For example, when only the insulating layer 220, which is made of polyimide, is applied between each of the first conductive layer 230a and the second conductive layer 230b, which is made of a copper foil having a thickness of, for example, 18 μm, and the heat transfer member 210, which is made of a copper foil having a thickness of 125 μm, the insulating layer 220 is required to have a thickness of, for example, 20 to 30 μm, when tolerance and bonding force are taken into consideration.

However, when the insulating layer 220 is applied along with the adhesive 295, it may be possible to reduce the thickness of the polyimide insulating layer 220. This may be achieved by thinly coating polyimide over the conductive layer 230 made of a copper foil, to form the insulating layer 220. Thus, the thickness of the polyimide insulating layer 220 may be reduced to 5 μm. Since the thin polyimide insulating layer 220, which has a thickness of 5 μm, provides insulation characteristics, the adhesive 295 may achieve an enhancement in thermal conductivity.

Figure 41E:
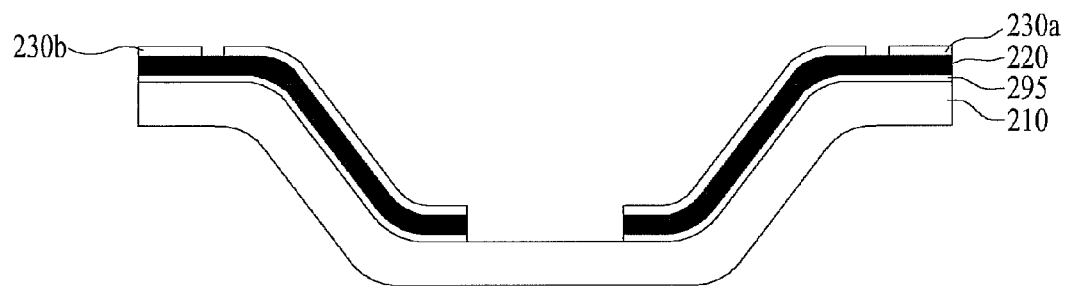

Thereafter, a pressure is applied to the edges of the heat transfer member 210 to form a step at the heat transfer member 210, as shown in FIG. 41E. At this time, the insulating layer 220 and the first conductive layer 230a and the second conductive layer 230b are also stepped in the same manner as the heat transfer member 210.

The above-described step may be formed using a method for pressing the heat transfer member 210 or the like. The step may be formed as the heat transfer member 210 is bent in a vertical direction or in a streamlined shape.

Thereafter, a pressure is applied to the heat transfer member 210 to bend the heat transfer member 210, and thus to form the cavity. At this time, the insulating layer 220 and the first conductive layer 230a and the second conductive layer 230b are also bent. The cavity may have a shape in which the edges of the cavity have a curved shape or a shape in which the edges of the cavity have a point of inflection.

Subsequently, the light emitting device 240 is mounted on the bottom of the cavity, as shown in FIG. 41F. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member.

Figure 42B:
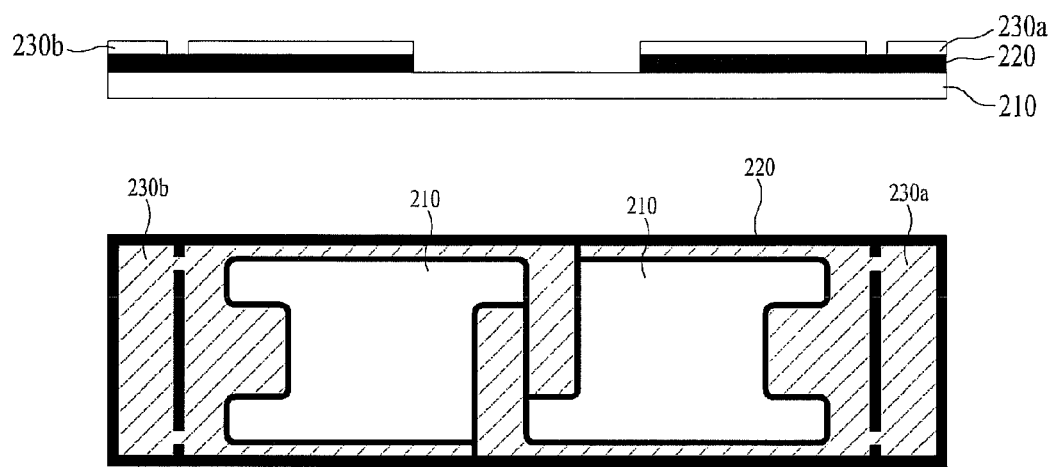
Figure 42C:
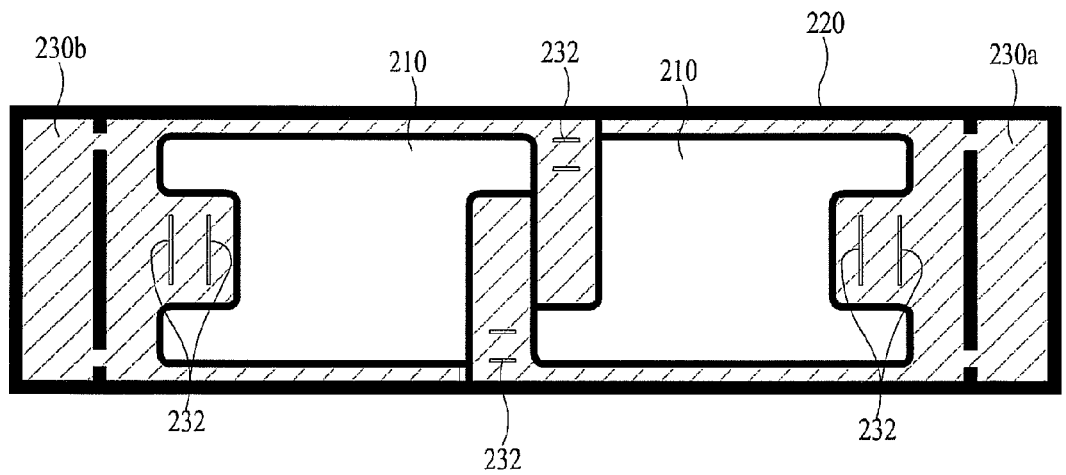
Figure 42D:
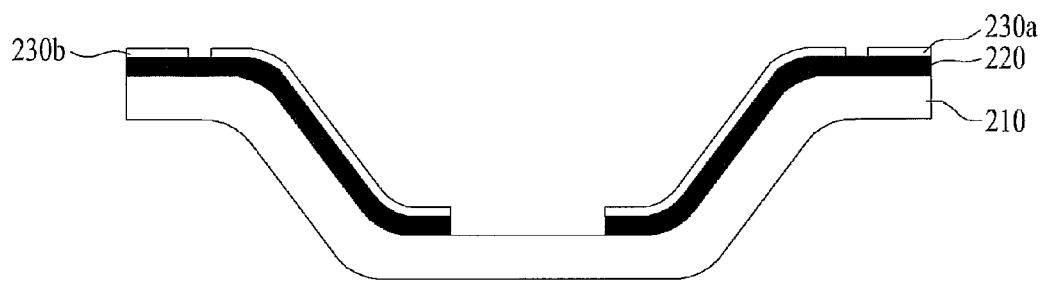
Figure 42E:
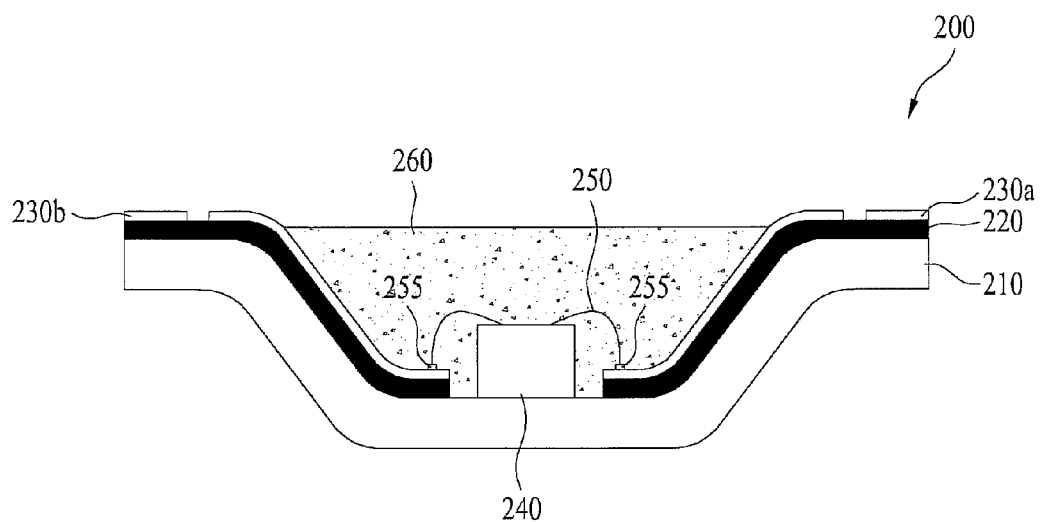

FIGS. 42A to 42E are views illustrating a method for manufacturing the light emitting device module of FIG. 39 in accordance with another exemplary embodiment. In this embodiment, the adhesive 250 may dispensed with when polyimide is used for the insulating layer 220, and the polyimide functions as an adhesive. Referring to FIG. 42E, a resin layer 260 fills the cavity.

Figure 43:
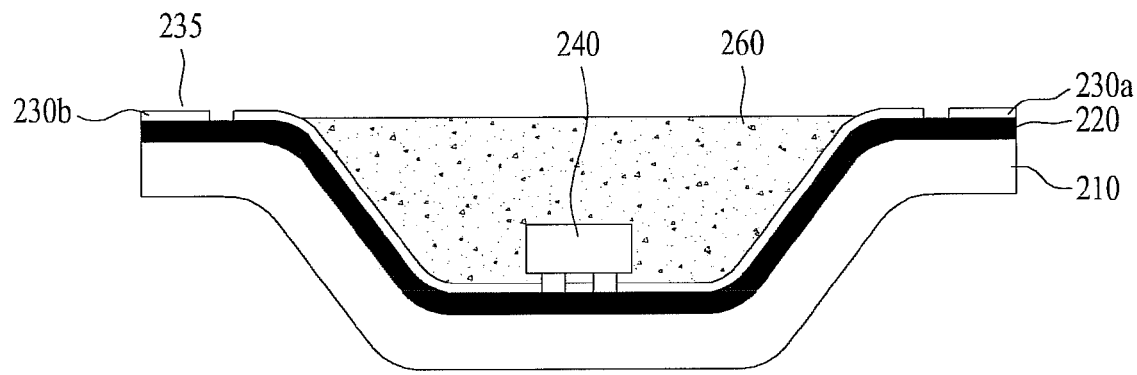
FIG. 43 is a view illustrating a light emitting device module according to a twenty-second embodiment.

FIG. 43 is a view illustrating a light emitting device module according to a twenty-second embodiment.

In this embodiment, the light emitting device 240 is electrically connected to the first conductive layer 230a and the second conductive layer 230b without using wire bonding. That is, in this embodiment, the light emitting device 240 is of a flip-chip type so that it is directly bonded to the first conductive layer 230a and the second conductive layer 230b.

Hereinafter, a lighting apparatus and a backlight unit will be described as an embodiment of a lighting system in which one of the above-described light emitting device module is arranged. FIG. 44 is an exploded perspective view illustrating a lighting apparatus including the light emitting device module according to one of the above-described embodiments.

The lighting apparatus includes a light source 600 for projecting light, a housing 400 in which the light source 600 is mounted, a heat dissipation unit 500 to dissipate heat generated from the light source 600, and a holder 700 for coupling the light source 600 and heat dissipation unit to the housing 400.

The housing 400 includes a socket connection part 410 connected to an electric socket (not shown), and a body part 420 connected to the socket connection part 410. The light source 600 is received in the body part 420. A plurality of air holes 430 may be formed through the body part 420.

Although a plurality of air holes 430 are formed through the body part 420 of the housing 400 in the illustrated case, a single air hole 430 may be formed through the body part 420. Although the plural air holes 430 are circumferentially arranged, various arrangements thereof may be possible.

The light source 600 includes a circuit board 610 and a plurality of light emitting device modules 650 mounted on the circuit board 610. Here, the circuit board 610 may be shaped to be fitted in an opening formed at the housing 400. Also, the circuit board 610 may be made of a material having high thermal conductivity so as to transfer heat to the heat dissipation unit 500, as will be described later.

The holder 700 is disposed under the light source 600. The holder 700 includes a frame and air holes. Although not shown, an optical member may be disposed under the light source 600 so as to diffuse, scatter or converge light projected from the light emitting device modules 650 of the light source 600.

The above-described lighting apparatus, which employs the above-described light emitting device modules according to one of the above-described embodiments, exhibits an improvement in brightness because it is possible to reduce the amount of light absorbed into the insulating layer of each light emitting device module after being emitted from the corresponding light emitting device. Also, since the distance between each of the first conductive layer (lead frame) and the light emitting device in each light emitting device module is appropriate, it may be possible to reduce the cost of materials used in wire boding and to secure convenience in the manufacturing process.

Figure 45:
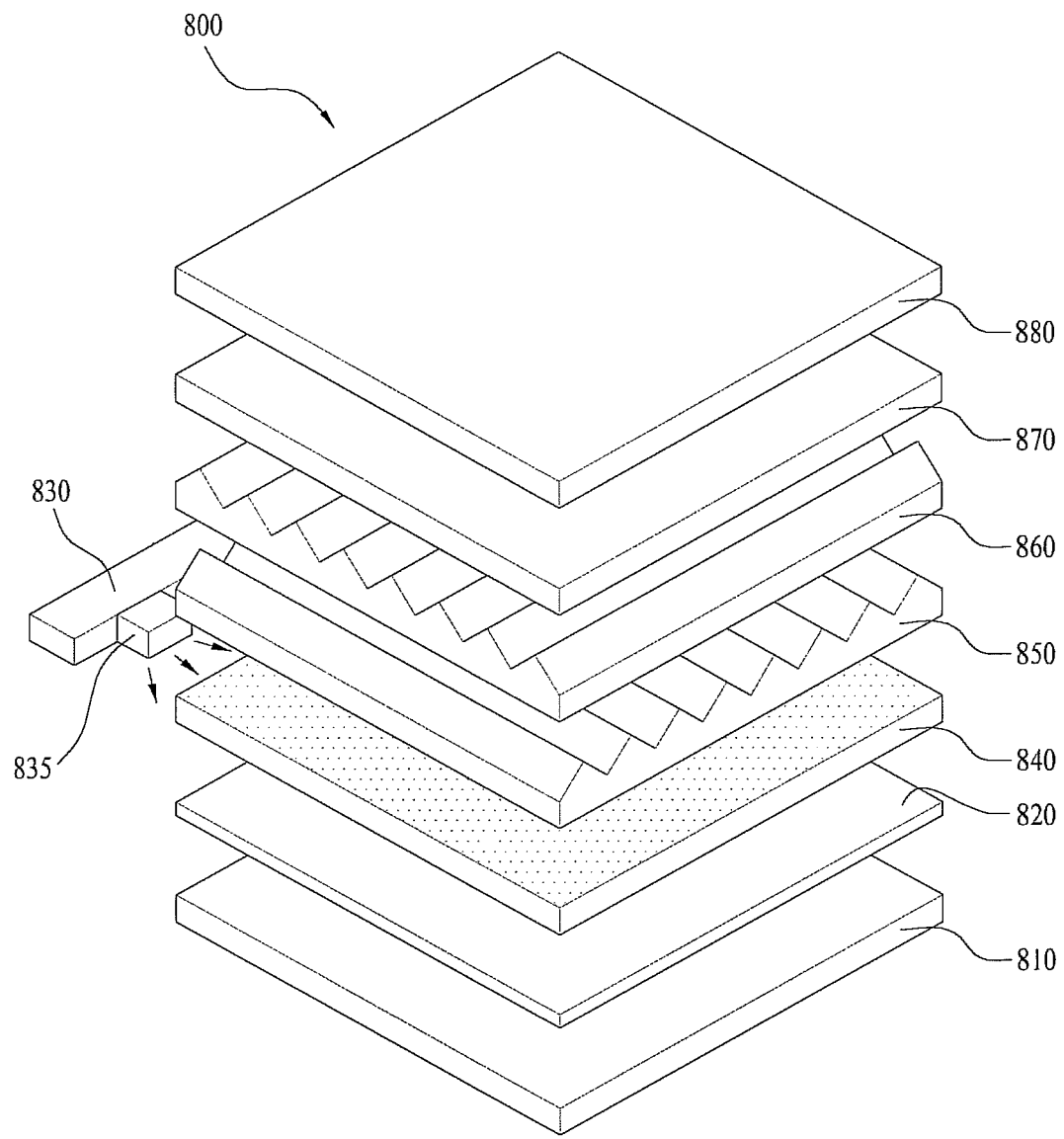
FIG. 45 is a view illustrating a display apparatus including the light emitting device module according to one of the above-described embodiments.

FIG. 45 is a view illustrating a display apparatus including the light emitting device module according to one of the above-described embodiments.

As shown in FIG. 45, the display apparatus according to the illustrated embodiment, which is designated by reference numeral 800, includes a light source module, a reflective plate 820 provided on a bottom cover 810, a light guide plate 840 disposed in front of the reflective plate 820 to guide light emitted from the light source module 830 to a front side of the display apparatus 800, first and second prism sheets 850 and 860 disposed in front of the light guide plate 840, a panel 870 disposed in front of the second prism sheet 860, and a color filter 880 disposed in front of the panel 870.

The light source module includes a circuit board 830 and light emitting device modules 835 mounted on the circuit board 830. Here, a printed circuit board (PCB) may be used as the circuit board 830. The light emitting device module 835 may have the above-described configuration.

The bottom cover 810 serves to receive the constituent elements of the display apparatus 800. The reflective plate 820 may be provided as a separate element, as shown in FIG. 45, or may be provided as a material having high reflectivity is coated over a rear surface of the light guide plate 840 or a front surface of the bottom cover 810.

Here, the reflective plate 820 may be made of material having high reflectivity and capable of being formed into an ultra thin structure. Polyethylene terephthalate (PET) may be used for the reflective plate 820.

The light guide plate 840 serves to scatter light emitted from the light source module so as to uniformly distribute the light throughout all regions of a liquid crystal display apparatus. Therefore, the light guide plate 840 may be made of a material having high refractivity and transmissivity. The material of the light guide plate 840 may include polymethylmethacrylate (PMMA), polycarbonate (PC) or polyethylene (PE).

The first prism sheet 850 may be formed by coating with a polymer exhibiting light transmittance and elasticity over one surface of a base film. The first prism sheet 850 may have a prism layer having a plurality of three-dimensional structures in the form of a repeated pattern. Here, the pattern may be a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light module and the reflective sheet 820 toward the entire surface of the panel 870.

Although not shown, a protective sheet may be provided on each of the prism sheets 850 and 860. The provision of the protective sheet may be achieved by forming a protective layer including light-diffusing particles and a binder at each surface of the base film in each of the prism sheets 850 and 860.

The prism layer may be made of a polymer selected from the group consisting of polyurethane, styrene-butadiene copolymer, polyacrylate, polymethacrylate, polymethyl methacrylate, polyethyleneterephthalate elastomer, polyisoprene and polysilicon.

Although not shown, a diffusion sheet may be disposed between the light guide plate 840 and the first prism sheet 850. The diffusion sheet is made of a polyester or polycarbonate-based material. The diffusion sheet may maximally increase a light projection angle through refraction and scattering of light incident from the display apparatus.

The diffusion sheet may include a support layer including a light diffusing agent, and first and second layers formed on a light emitting surface (in the direction of the first prism sheet) and a light incident surface (in the direction of the reflective sheet) The first and second layers do not include a light diffusing agent.

The support layer may include 0.1 to 10 parts by weight of a siloxane-based light diffusing agent having an average particle size of 1 to 10 μm and 1 to 10 parts by weight of an acryl-based light diffusing agent having an average particle size of 1 to 10 μm, based on 100 parts by weight of a resin including a mixture of a methacrylate-styrene copolymer and methacrylate methyl-styrene copolymer.

The first and second layers may include 0.01 to 1 part by weight of an ultraviolet absorbing agent and 0.001 to 10 parts by weight of an antistatic agent, based on 100 parts by weight of a methacrylate methyl-styrene copolymer resin.

The support layer of the diffusion sheet has a thickness of 100 to 10,000 μm. Each layer may have a thickness of 10 to 1,000 μm.

In the illustrated embodiment, the optical sheet may include a combination of the diffusion sheet, the first prism sheet 850 and the second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The display panel 870 is configured such that a liquid crystal layer is located between glass substrates, and polarizing plates are mounted on both glass substrates so as to utilize polarizing properties of light. Here, the liquid crystal layer has properties between a liquid and a solid. That is, in the liquid crystal layer, liquid crystals which are organic molecules having fluidity like the liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel.

The color filter 880 is provided on the front surface of the panel 870, and transmits only an R, G or B light component of light projected from the panel 870 per pixel, thereby displaying an image.

The above-described lighting apparatus, which employs the above-described light emitting device modules according to one of the above-described embodiments, exhibits an improvement in brightness because it is possible to reduce the amount of light absorbed into the insulating layer of each light emitting device module after being emitted from the corresponding light emitting device. Also, since the distance between each of the first conductive layer (lead frame) and the light emitting device in each light emitting device module is appropriate, it may be possible to reduce the cost of materials used in wire boding and to secure convenience in the manufacturing process.

In the light emitting device module according to one of the embodiments of the present invention and the lighting system using the light emitting device, the insulating layer, which includes a polyimide film, is opened at the top of the cavity. Accordingly, the amount of light absorbed into the insulating layer after being emitted from the light emitting device is reduced, so that an enhancement in optical efficiency is achieved.

It will be apparent to those skilled in the art that various modifications and variations can be made in the embodiment without departing from the spirit or scope of the embodiment. Thus, it is intended that the embodiment covers the modifications and variations of this embodiment provided they come within the scope of the appended claims and their equivalents.

What is claimed is:

1. A light emitting device module, comprising:
    a heat transfer member that defines a cavity having a bottom and a side wall;
    a first conductive layer and a second conductive layer each contacting the heat transfer member via an insulating layer, the first conductive layer and the second conductive layer being electrically isolated from each other in accordance with exposure of the insulating layer or exposure of the heat transfer member, wherein at least one of the first conductive layer and the second conductive layer includes at least one cut-out portion, an entire circumference of the at least one cut-out portion being surrounded by the first conductive layer or the second conductive layer; and
    at least one light emitting diode electrically connected to the first conductive layer and second conductive layer, wherein the at least one light emitting diode thermally contacts an exposed portion of the heat transfer member,
    wherein the exposed portion of the heat transfer member is disposed within the cavity between the first conductive layer and the second conductive layer, and wherein a thickness of the heat transfer member at the bottom of the cavity is the same as a thickness of the heat transfer member at an outside of the cavity, and
    wherein at least one of the first conductive layer or the second conductive layer extends from an edge of the cavity to the side wall of the cavity and then to a portion of the bottom of the cavity, wherein the at least one light emitting diode is disposed on the bottom of the cavity.

2. The light emitting device module according to claim 1, wherein at least one of the first conductive layer or the second conductive layer extends from a longer-axis edge of the cavity to a longer-axis side wall of the cavity and then to a portion of the bottom of the cavity that is adjacent to the longer-axis side wall.

3. The light emitting device module according to claim 2, wherein a first exposed portion of the insulating layer is disposed between the exposed portion of the heat transfer member and a portion of each of the first conductive layer and the second conductive layer disposed on the bottom of the cavity.

4. The light emitting device module according to claim 3, wherein a second exposed portion of the insulating layer is disposed between the heat transfer member and a portion of each of the first conductive layer and the second conductive layer disposed outside the cavity and the light emitting diode is spaced apart from the second exposed portion of the insulating layer by a distance of 150 to 250 μm.

5. The light emitting device module according to claim 1, wherein at least one of the first conductive layer or the second conductive layer extends from a shorter-axis edge of the cavity to a shorter-axis side wall of the cavity and then to a portion of the bottom of the cavity that is adjacent to the shorter-axis side wall.

6. The light emitting device module according to claim 5, wherein the insulating layer is exposed between a portion of the first conductive layer disposed on the bottom of the cavity and a portion of the second conductive layer disposed on the bottom of the cavity to electrically isolate the first conductive layer and the second conductive layer.

7. The light emitting device module according to claim 5, wherein portions of the first conductive layer disposed on the bottom of the cavity and the second conductive layer disposed on the bottom of the cavity are arranged in parallel.

8. The light emitting device module according to claim 7, wherein the insulating layer is exposed between the portions of the first conductive layer and the second conductive layer disposed on the bottom of the cavity to electrically isolate the first conductive layer and the second conductive layer.

9. The light emitting device module according to claim 1, wherein the light emitting diode is electrically connected to a portion of the first conductive layer and a portion of the second conductive layer disposed on the bottom of the cavity.

10. The light emitting device module according to claim 1, wherein the exposed portion of the heat transfer member includes an outer exposed portion exposed at an outside the cavity that is 10% or less of the entirety of the exposed portion of the heat transfer member.

11. A light emitting device module, comprising:
a heat transfer member that defines a cavity having a bottom and a side wall;
an insulating layer formed on a portion of the heat transfer member;
a first conductive layer and a second conductive layer respectively formed on portions of the insulating layer while being electrically isolated from each other, wherein at least one of the first conductive layer and the second conductive layer includes at least one cut-out portion, an entire circumference of the at least one cut-out portion being surrounded by the first conductive layer or the second conductive layer; and
a light emitting diode thermally contacting the heat transfer member and electrically connected to the first conductive layer and the second conductive layer,
wherein the heat transfer member is exposed at a portion of the cavity, and
wherein at least one of a first connection area of the heat transfer member at which the bottom joins the side wall of the cavity, or a second connection area of the heat transfer member at which the side wall of the cavity joins a portion of the heat transfer member outside the cavity, is rounded, and
wherein at least one of the first conductive layer or the second conductive layer extends from an edge of the cavity to the side wall of the cavity and then to a portion of the bottom of the cavity, wherein the light emitting diode is disposed on the bottom of the cavity.

12. The light emitting device module according to claim 11, wherein at least one of the first conductive layer or the second conductive layer extends from a longer-axis edge of the cavity to a longer-axis side wall of the cavity and then to a portion of the bottom of the cavity that is adjacent to the longer-axis side wall.

13. The light emitting device module according to claim 12, wherein an exposed portion of the insulating layer is disposed between the heat transfer member and a portion of each of the first conductive layer and the second conductive layer disposed on the bottom of the cavity.

14. The light emitting device module according to claim 11, wherein at least one of the first conductive layer or the second conductive layer extends from a shorter-axis edge of the cavity to a shorter-axis side wall of the cavity and then to a portion of the bottom of the cavity that is adjacent to the shorter-axis side wall, and portions of the first conductive layer disposed on the bottom of the cavity and the second conductive layer disposed on the bottom of the cavity are arranged in parallel.

15. A lighting system, comprising:
a light emitting device module including a heat transfer member that defines a cavity having a bottom and a side wall, a first conductive layer and a second conductive layer contacting the heat transfer member via an insulating layer, wherein at least one of the first conductive layer and the second conductive layer includes at least one cut-out portion, an entire circumference of the at least one cut-out portion being surrounded by the first conductive layer or the second conductive layer, the first conductive layer and the second conductive layer being electrically isolated from each other in accordance with exposure of the insulating layer or exposure of the heat transfer member, and at least one light emitting diode electrically connected to the first conductive layer and the second conductive layer, the least one light emitting diode thermally contacting an exposed portion of the heat transfer member, the insulating layer having an exposed portion disposed within the cavity between the first conductive layer and the second conductive layer, wherein a thickness of the heat transfer member at the bottom of the cavity is the same as a thickness of the heat transfer member at an outside of the cavity;
at least one circuit board for supplying current to the light emitting device module; and
an optical member for transmitting light emitted from the light emitting device module, wherein at least one of the first conductive layer or the second conductive layer extends from an edge of the cavity to the side wall of the cavity and then to a portion of the bottom of the cavity, wherein the at least one light emitting diode is disposed on the bottom of the cavity.

16. The light emitting device module according to claim 1, wherein the at least one cut-out portion is provided at a boundary region of the side wall of the cavity.

17. The light emitting device module according to claim 1, wherein the at least one cut-out portion is provided at a boundary region between the side wall of the cavity and a region outside the cavity.

18. The light emitting device module according to claim 1, wherein the heat transfer member is exposed via the cut-out portion.

19. The light emitting device module according to claim 11, wherein the heat transfer member is exposed via the cut-out portion.

20. The lighting system according to claim 15, wherein the heat transfer member is exposed via the cut-out portion.

* * * * *